United States Patent
Sakai et al.

(10) Patent No.: US 9,024,272 B2
(45) Date of Patent: May 5, 2015

(54) PATTERN MEASURING APPARATUS

(75) Inventors: Kei Sakai, Hitachinaka (JP); Yafeng Zhang, Hitachinaka (JP); Norio Hasegawa, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 179 days.

(21) Appl. No.: 13/518,706

(22) PCT Filed: Dec. 1, 2010

(86) PCT No.: PCT/JP2010/006997
§ 371 (c)(1),
(2), (4) Date: Jun. 22, 2012

(87) PCT Pub. No.: WO2011/077644
PCT Pub. Date: Jun. 30, 2011

(65) Prior Publication Data
US 2012/0267528 A1    Oct. 25, 2012

(30) Foreign Application Priority Data
Dec. 25, 2009 (JP) ................................ 2009-293711

(51) Int. Cl.
*G21K 1/08* (2006.01)
*H01J 3/14* (2006.01)
(Continued)

(52) U.S. Cl.
CPC ........ *G03F 7/70466* (2013.01); *G01B 2210/56* (2013.01); *H01J 2237/2817* (2013.01); *G06T 7/001* (2013.01); *G06T 2207/10061* (2013.01); *G06T 2207/30148* (2013.01)

(58) Field of Classification Search
USPC ............. 250/306, 307, 310, 311, 396 R, 397, 250/398, 399, 492.1, 492.2, 492.21, 492.3
See application file for complete search history.

(56) References Cited

U.S. PATENT DOCUMENTS 6,872,943 B2    3/2005   Takane et al.
7,038,767 B2 *  5/2006   Toyoshima et al. ............. 356/72
(Continued)

FOREIGN PATENT DOCUMENTS

JP    5-41195 A     2/1993
JP    5-175496 A    7/1993
(Continued)

OTHER PUBLICATIONS

International Search Report with English translation dated Jan. 25, 2011 (four (4) pages).
(Continued)

*Primary Examiner* — Bernard E Souw
(74) *Attorney, Agent, or Firm* — Crowell & Moring LLP

(57) ABSTRACT

A pattern measuring apparatus which can identify a kind of gaps formed by a manufacturing process having a plurality of exposing steps such as SADP, particularly, which can suitably access a gap even if a sample has the gap that is not easily accessed is disclosed. A feature amount regarding one end side of a pattern having a plurality of patterns arranged therein and a plurality of kinds of feature amounts regarding the other end side of the pattern are extracted from a signal detected on the basis of scanning of a charged particle beam. With respect to proper kinds of feature amounts among the plurality of kinds of feature amounts, the feature amount on one side of the pattern and that on the other end side of the pattern are compared. On the basis of the comparison, the kinds of spaces among the patterns are determined.

4 Claims, 38 Drawing Sheets

(51) Int. Cl.
  *H01J 3/26*  (2006.01)
  *H01J 49/42* (2006.01)
  *G03F 7/20*  (2006.01)
  *G06T 7/00*  (2006.01)

(56) References Cited

U.S. PATENT DOCUMENTS

| | | | |
|---|---|---|---|
| 8,538,130 B2 | 9/2013 | Ivanchenko et al. | |
| 2002/0093350 A1* | 7/2002 | Yamada | 324/751 |
| 2004/0222375 A1 | 11/2004 | Kimura et al. | |
| 2009/0146057 A1 | 6/2009 | Sohda et al. | |
| 2009/0242760 A1* | 10/2009 | Miyamoto et al. | 250/307 |
| 2012/0037801 A1* | 2/2012 | Mochizuki et al. | 250/306 |
| 2012/0126116 A1* | 5/2012 | Tanaka et al. | 250/307 |
| 2012/0138796 A1* | 6/2012 | Sasajima et al. | 250/311 |

FOREIGN PATENT DOCUMENTS

| | | |
|---|---|---|
| JP | 2001-147113 A | 5/2001 |
| JP | 2003-90719 A | 3/2003 |
| JP | 2004-251674 A | 9/2004 |
| JP | 2008-118033 A | 5/2008 |
| JP | 2009-141124 A | 6/2009 |
| JP | 2012-519391 A | 8/2012 |
| WO | WO 2010/103506 A1 | 9/2010 |
| WO | WO 2010/119641 A1 | 10/2010 |

OTHER PUBLICATIONS

Finders et al., "Double Patterning for 32nm and Below: An Update", Proc. of SPIE vol. 6924 692408-1-12, (2008) (twelve (12) pages).

Miller et al., "Comparison of LFLE and LELE Manufacturability", 5$^{th}$ International Symposium on Immersion Lithography Extensions, Sep. 2008 (twenty-four (24) pages).

Lucas et al., "Interactions of Double Patterning Technology with Wafer Processing, OPC and Design Flows", Proc. of SPIE vol. 6924 692403-1-12, (2008) (twelve (12) pages).

Japanese Office Action dated May 7, 2013 with partial English translation (four pages).

* cited by examiner

CROSS SECTIONAL VIEW OF PATTERN

ELECTRON MICROSCOPE IMAGE OF PATTERN

SECONDARY ELECTRON PROFILE OF PATTERN

IN DIFFERENTIATION PROFILE
OF SPACER PROFILE,
PROFILE SHOWING ABSOLUTE VALUE
OF THE DIFFERENTIATION PROFILE

SECONDARY ELECTRON PROFILE OF PATTERN

SECONDARY ELECTRON PROFILE IN ARBITRARY SPACER

DIFFERENTIATION PROFILE OF SPACER PROFILE

SECONDARY ELECTRON PROFILE
OF ANOTHER SPACER PATTERN (a)

(b)

(a)

(b)

(a)

(b)

(c)

(a)

(b)

(c)

(a)

(b)

(c)

(a)

(b)

(c)

(a)

(b)

(c)

PATTERN MEASURING APPARATUS

TECHNICAL FIELD

The invention relates to a pattern measuring apparatus for measuring pattern dimensions on the basis of a signal which is acquired by irradiating a charged particle beam to a sample and, more particularly, to a pattern measuring apparatus suitable for measurement of a pattern which is formed by double exposure (double patterning).

BACKGROUND ART

A stepper (reduction projection exposing apparatus) as one of manufacturing apparatus of semiconductor devices is such an apparatus that a pattern formed on a photomask, a reticle, or the like is reduced and projected by a projecting lens onto a semiconductor wafer coated with a resist.

In recent years, in association with microminiaturization of a pattern formed, a method whereby the formed pattern is measured or inspected by a scanning electron microscope or the like and its appearance state is evaluated is becoming a main stream of the measurement and inspection of a semiconductor. The scanning electron microscope is such an apparatus that by scanning an electron beam onto a sample, electrons which are emitted from the sample are detected, thereby forming an image. That is, since two regions in which emission amounts of secondary electrons are almost equal are represented at an almost same luminance, there is a possibility that it is difficult to identify those regions. There is a case where when noises are mixed into the electron microscope image, it is also difficult to identify them. Particularly, in association with the recent realization of a high integration degree of pattern, the number of patterns which are difficult to be identified is increasing. Methods of identifying a line pattern and a space of a line-and-space pattern have been disclosed in Patent Literatures 1 and 2. Specifically speaking, Patent Literature 1 discloses the method of discriminating a convexity and a concavity in a line pattern constructed by the convexities formed by two vertical slopes and one kind of concavity. Patent Literature 2 discloses the method whereby on the basis of a comparison between peak widths of two adjacent profiles acquired by obliquely irradiating a beam to an ideal optical axis, whether a portion sandwiched by the two peaks is a line pattern or a space is discriminated.

Even if it is difficult to discriminate in the case of using only a two-dimensional image of a pattern, a kind of pattern can be specified by monitoring a three-dimensional structure including a depth direction of a sample. As a method of observing a three-dimensional structure of a pattern, Patent Literature 3 discloses the method whereby images acquired by observing a sample from two different directions are synthesized and the three-dimensional structure of the pattern is estimated. Patent Literature 4 discloses the method whereby a beam is irradiated to a pattern on a sample from an oblique direction and dimensions of an upper surface and a bottom surface of the pattern are individually measured.

In Non Patent Literatures 1, 2, and 3, in semiconductor processes, methods of forming a fine pattern by repeating an exposure and an etching two times have been described.

CITATION LIST

Patent Literatures

Patent Literature 1: JP-A-2004-251674
Patent Literature 2: JP-A-2003-90719
Patent Literature 3: JP-A-5-41195
Patent Literature 4: JP-A-5-175496

Non Patent Literatures

Non Patent Literature 1: J. Finders, M. Dusa et al., "Double patterning for 32 nm and below: an update," Proc. of SPIE Vol. 6924 692408-1-12
Non Patent Literature 2: A Miller, M. Maenhoudt et al. "Comparison of LFLE and LELE Manufacturability," 5th International Symposium on Immersion Lithography Extensions, September 2008
Non Patent Literature 3: K Lucas, C. Corkl et al., "Interactions of double patterning technology with water processing, OPC and design flows," Proc. of SPIE Vol. 6924 692403-1-12

SUMMARY OF INVENTION

Technical Problem

In recent years, in association with a request for fining a pattern which is formed on a semiconductor sample, as a method of satisfying this request, a pattern forming method called Self Aligned Double Patterning (hereinbelow, called SADP) has been developed and it is predicted in future that a measurement of pattern dimensions between processes for the purpose of improvement of a yield is necessary.

Gaps formed by different steps are alternately formed among a plurality of patterns which are formed by the SADP. In order to properly make a process management or the like in each step, it is necessary to perform a measurement after kinds of those gaps were specified. In Patent Literatures 1 and 2, although there is a description about the method of identifying the line pattern (convexity) and the space (concavity), a point that different kinds exist in the same concavity and a method of identifying them are not described at all. Although the method whereby the gaps are identified by monitoring a sample cross section is also considered as disclosed in Patent Literatures 3 and 4, it is troublesome to obtain an inclination of a beam and a plurality of images and it causes an increase in inspecting and measuring time, so that the number of samples which can be inspected and measured per unit time decreases.

A pattern measuring apparatus having an object that a decision of the kinds of gaps formed by a manufacturing process having a plurality of exposing steps like SADP is realized at a high precision and a high throughput will be described hereinbelow. Particularly, a pattern measuring apparatus which can properly discriminate even a sample whose gap discrimination is difficult will be described.

Solution to Problem

As one aspect for accomplishing the above object, there is provided a pattern measuring apparatus in which a feature amount regarding one end side of a pattern in which a plurality of patterns are arranged and a plurality of kinds of feature amounts regarding the other end side of the pattern are extracted from a signal which is detected on the basis of a scanning of a charged particle beam, the feature amounts of one end side and the other end side of the pattern are compared with respect to proper kinds of feature amounts among the plurality of kinds of feature amounts, and kinds of spaces among the plurality of patterns are discriminated on the basis of the comparison.

Advantageous Effects of Invention

By performing the gap discrimination by using the proper kinds of feature amounts among the plurality of kinds of feature amounts, even in the case of such a sample that it is difficult to find out a difference between the gaps, an accurate discrimination can be performed.

DESCRIPTION OF EMBODIMENTS

Figure 1:
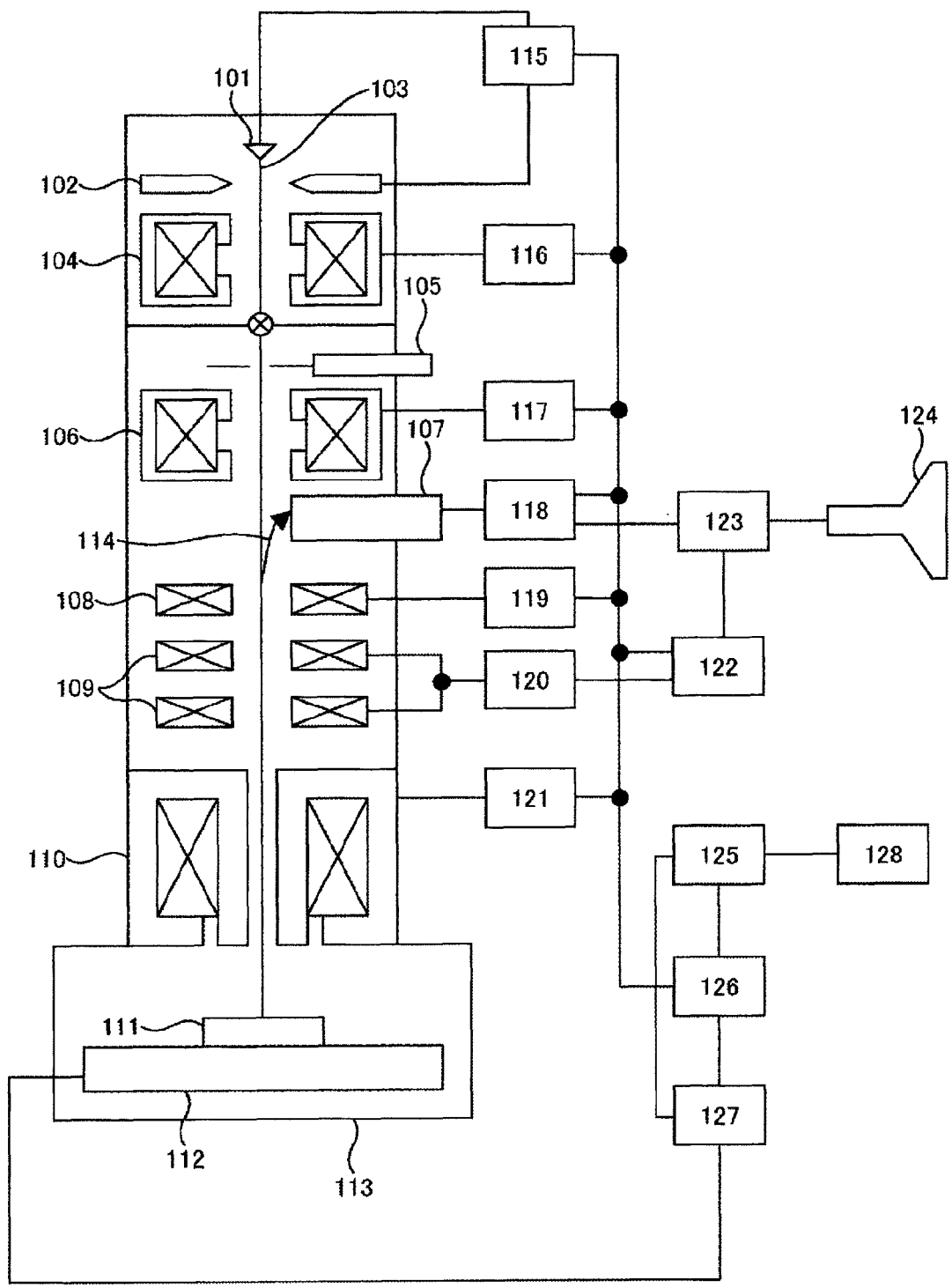
FIG. 1 is a schematic constructional diagram of a scanning electron microscope.

The SADP is a technique for forming a pattern in which a line and a space are repeated at a very narrow pitch that is equal to or less than an exposure limit that an exposing apparatus in the related art can attain.

Actually, for a first mask pattern which is formed by forming a first mask layer onto a sample and etching the mask layer and a second mask pattern (hereinbelow, called a spacer) which is formed only on a side wall of the first mask pattern by forming a second mask layer onto the first mask pattern and etching the mask layer, the first mask pattern is eliminated by etching, the sample is etched by using the spacer remaining on the sample as a mask, and a line pattern is formed onto the sample. Therefore, dimensions of the line pattern which is formed onto the sample are determined by dimensions of the spacer. Therefore, in the case of forming the pattern by using the SADP, it is very important that the dimensions of the spacer are measured, a measurement result is fed back to a process for deciding the dimensions of the spacer, and the dimensions of the spacer are accurately controlled on the basis of the measurement result.

The spacer is constructed by two side surfaces (first side surface and second side surface) having different inclinations and an upper surface connecting those side surfaces. On the side surfaces of the spacer, there are: a first concavity (hereinbelow, referred to as a core gap) which is adjacent to the first side surface of the spacer and is formed by eliminating the first mask pattern by etching; and a second concavity (hereinbelow, referred to as a spacer gap) which is adjacent to the second side surface of the spacer and is formed by working the second mask pattern by etching. The core gap and the spacer gap are formed by different processes. Dimensions of the core gap and dimensions of the spacer gap are controlled by different processes. Since dimensions between line patterns are determined by the dimensions of the gaps when the line patterns are formed, in order to control the dimensions of the pattern, it is necessary that the spacer, the core gap, and the spacer gap are respectively measured, values of the dimensions are fed back to the process for controlling the respective dimensions, and executing conditions of the process are changed on the basis of the dimension values.

Therefore, in order to individually measure the spacer, the core gap, and the spacer gap, a function for discriminating them is needed.

Generally, since the line pattern which is formed onto the sample has a structure in which lines are arranged at regular intervals, the dimensions of the core gap and the spacer gap which are formed by the SADP are controlled so as to become identical. Therefore, according to an observing method whereby the charged particle beam is allowed to vertically enter the sample, it is difficult to discriminate the gaps from the taken image. Since the dimensions of the pattern which is formed by the SADP are so fine to be equal to about 30 to 20 nm, in the case where a stop position precision of a two-dimensional movable stage for moving a wafer to a position where the user wants to measure the wafer is larger than the pattern dimensions, there is a possibility that a measuring range is deviated. Each time an image at a measuring point is taken, it is necessary to individually recognize the spacer, the core gap, and the spacer gap.

As will be described hereinafter, since cross sectional shapes of the core gap and the spacer gap of a mask pattern differ in the SADP process, if a difference of those shapes can be detected, two kinds of gaps can be discriminated.

In an apparatus for measuring and inspecting a semiconductor device, it is demanded that a number of patterns or the like formed on the sample are measured and inspected at high speed. Therefore, it is also demanded to perform the gap discrimination at high speed.

In an embodiment, which will be described hereinbelow, there will be described a method whereby a charged particle beam is scanned from a vertical direction to a pattern including spacers formed on a sample and two kinds of gaps and a charged particle which is emitted from the scanned portion is detected, thereby deriving a profile of an intensity of the charged particle, two kinds of adjacent gaps having different cross sectional shapes are discriminated on the basis of feature values which are calculated from the profile, and dimensions are measured.

In order to discriminate the two kinds of gaps, a point at which shapes of the first and second side surfaces forming the spacer differ is used. This shape difference depends on the processes for forming the gaps. By comparing the shapes, the process by which the gaps were formed, that is, the kinds of gaps adjacent to the spacer can be discriminated. In the profile of the intensity of the charged particle beam, the shapes of the side surfaces of the spacer appear as a different point in a height of a signal, or an inclination of a foot portion of the profile, and a length of the foot portion.

Specifically speaking, when the slope is steep, a peak height of the profile is high, the inclination of the foot portion is steep, and the length of the foot portion is short. On the contrary, when the slope is gentle, the peak height of the profile is low, the inclination of the foot portion is gentle, and the length of the foot portion is long. On the basis of these information, it is determined that the gap adjacent to the side surface whose slope is steep is the core gap and the gap adjacent to the side surface whose slope is gentle is the spacer gap. By executing the above processes to all spacers, the gaps in the measuring range are discriminated, thereby enabling the dimensions of the necessary pattern to be measured. Also with respect to double patterning systems other than the SADP, if cross sectional shapes between two sets of patterns which are adjacently formed by the different processing steps differ, such a difference of the cross sectional shapes appears as a difference of the profile of the intensity of the charged particle beam. Therefore, similarly, the two sets of patterns are discriminated, thereby enabling the dimensions of each pattern to be measured.

By the method as mentioned above, to the pattern including the spacers and two kinds of gaps and formed by the SADP, the two kinds of gaps having different cross sectional shapes are discriminated without deteriorating throughput and the dimensions can be continuously and automatically measured.

A pattern measuring apparatus in which kinds of space portions (gaps) which are formed among a plurality of patterns can be discriminated on the basis of a signal which is acquired by scanning the charged particle beam will be described hereinbelow by using the drawings. Although the apparatus for measuring a pattern on the basis of a signal which is acquired by a Scanning Electron Microscope (SEM) will be described in the following embodiments, a Focused Ion Beam apparatus can be also applied in place of the SEM. However, since an extremely high magnification is required in order to measure a fine pattern at a high precision, it is generally desirable to use the SEM which is superior to the FIB apparatus in terms of a resolution.

FIG. 1 is a schematic constructional diagram of a scanning electron microscope. A whole control unit 125 controls the whole apparatus through an electron optical system control apparatus 126 and a stage control apparatus 127 on the basis of an accelerating voltage of an electron, information of a sample 111, observing position information, and the like which were input from a user interface 128 by the operator.

The sample 111 is conveyed by a sample conveying apparatus (not shown) through a sample exchanging chamber and, thereafter, is fixed onto a stage 112 disposed in a sample chamber 113.

The electron optical system control apparatus 126 controls a high voltage control apparatus 115, a first condenser lens control unit 116, a second condenser lens control unit 117, a secondary electron signal amplifier 118, an alignment control unit 119, a deflection signal control unit 122, and an objective lens control unit 121 in accordance with commands from the whole control unit 125.

A primary electron beam 103 which was led out from an electron source 101 by a lead-out electrode 102 is focused by a first condenser lens 104, a second condenser lens 106, and an objective lens 110 and is irradiated onto the sample 111. On the way, the electron beam passes through a diaphragm 105, its orbit is adjusted by an alignment coil 108, and the electron beam is two-dimensionally scanned on the sample by a deflecting coil 109 which received a signal from the deflection signal control unit 122 through a deflection signal control unit 120. Due to the irradiation of the primary electron beam 103 to the sample 111, a secondary electron 114 which is emitted from the sample 111 is captured by a secondary electron detector 107 and is used as a luminance signal of a secondary electron image display apparatus 124 through the secondary electron signal amplifier 118.

Since a deflection signal of the secondary electron image display apparatus 124 and a deflection signal of the deflecting coil are synchronized, a pattern shape on the sample 111 is reproduced onto the secondary electron image display apparatus 124 with high fidelity.

Since an image which is used for measurement of the dimensions of the pattern is formed, a signal which is outputted from the secondary electron signal amplifier 118 is A/D converted in an image processor 123, thereby forming digital image data. Further, a secondary electron profile is formed from the digital image data.

A measuring range is manually selected from the formed secondary electron profile or is automatically selected therefrom on the basis of a predetermined algorithm, and the number of pixels in a selecting range is calculated. Actual dimensions on the sample are measured from actual dimensions of an observing region scanned by the primary electron beam 103 and the number of pixels corresponding to the observing region.

In the embodiment, as an example of the pattern measuring apparatus, an apparatus in which a computer including the image processor (discriminating unit) for performing the gap discrimination as will be described hereinafter on the basis of the signal such as a secondary electron or the like is constructed as a part of the scanning electron microscope apparatus is shown. However, the invention is not limited to it. For example, gap discrimination as will be described hereinafter may be performed by an external measuring apparatus having: an interface for obtaining information (secondary electron signal, signal waveform information based on the detection of the secondary electron, two-dimensional image signal, outline information of a pattern edge extracted from an image, or the like) based on a signal acquired by the scanning electron microscope; and an arithmetic operating apparatus corresponding to the image processor. It is also possible to construct in such a manner that a program for executing processes, which will be described hereinafter, is registered into a storing medium and the program is executed by a processor for supplying necessary signals to the scanning electron microscope and the like. That is, the following description is also a description as a program which can be executed by the pattern measuring apparatus such as a scanning electron microscope or the like or as a program product.

An outline of the SADP as the measurement target of the scanning electron microscope is shown below.

Figure 2:
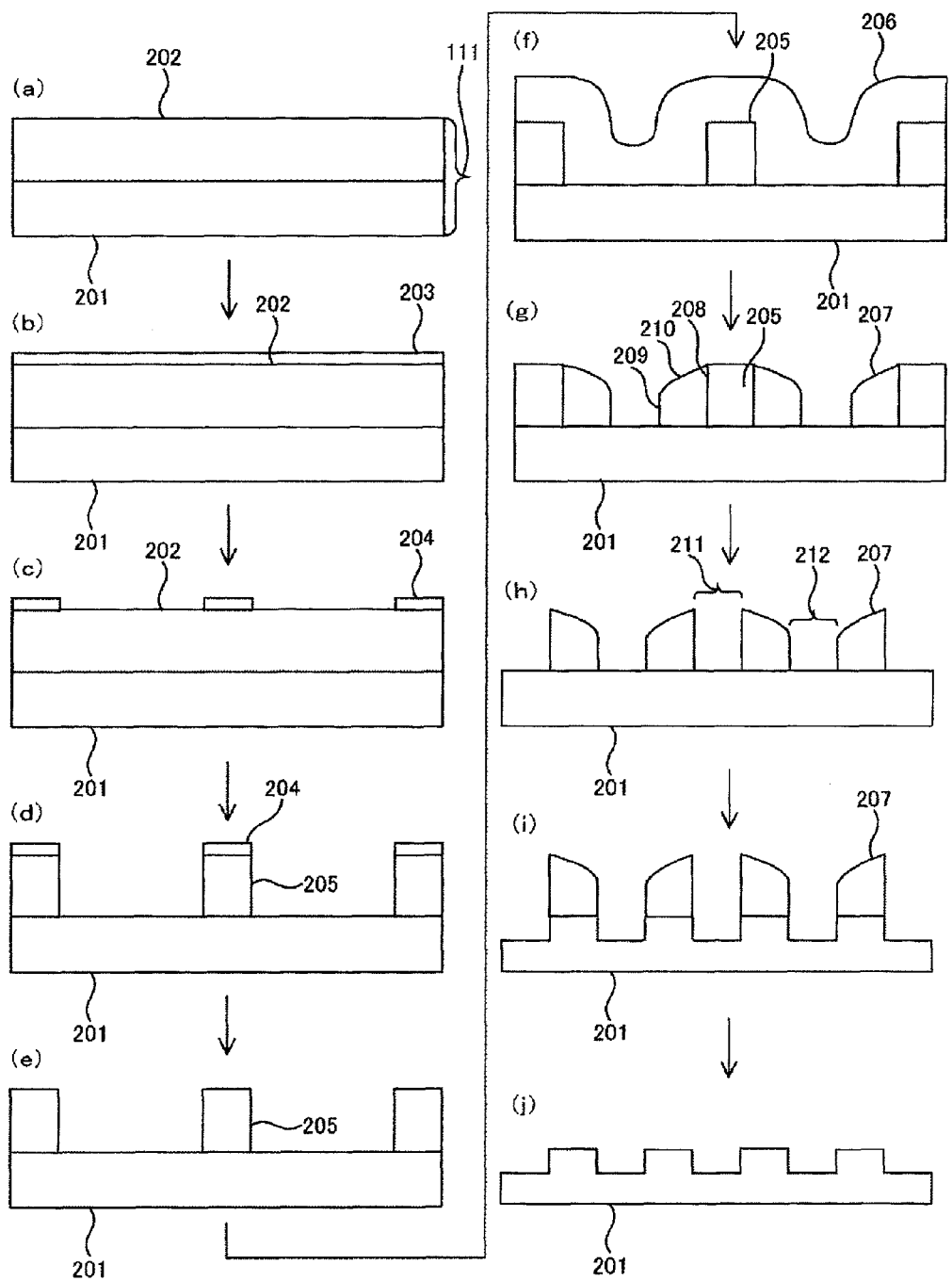
FIG. 2 is a diagram for describing processing steps of the SADP.

A fundamental process of the SADP is shown in FIG. 2. In the SADP, in the sample 111, a first mask layer 202 is formed on a sample 201 on which a pattern is formed (FIG. 2(a)). A photoresist film 203 is formed onto the mask layer (FIG. 2(b)). A pattern is exposed onto the photoresist film 203 and a developing process is executed, thereby forming a photoresist pattern 204 onto the photoresist film 203 (FIG. 2(c)). The photoresist pattern 204 is used as a mask and the first mask layer 202 is etched, thereby forming a first mask pattern 205 (FIG. 2(d)).

Subsequently, the photoresist pattern 204 on the first mask pattern 205 is removed (FIG. 2(e)) and a second mask layer 206 is formed on the whole surface of the first mask pattern 205 (FIG. 2(f)). After that, an etching condition is controlled so that a part of the second mask layer 206 remains only on side walls of the first mask pattern 205 and the second mask layer 206 is etched (FIG. 2(g)). A residual structure of the second mask layer formed in this manner is a spacer 207.

The spacer 207 has a shape surrounded by: a side surface 208 which is vertical to the surface of the sample formed in a contact portion with the first mask pattern 205; a side surface 209 which is located on the opposite side and is slightly inclined as compared with the side surface 208; and an upper surface 210 which is slightly inclined from the side surface 208 to the side surface 209. Since the side surface 209 and the upper surface 210 are formed by etching the second mask layer 206 formed along the shape of the first mask pattern 205, they are slopes which are gently inclined around the first mask pattern as a center.

Subsequently, by removing the first mask pattern 205 by etching, a state where only the spacer 207 remains on the sample is obtained (FIG. 2(h)). Finally, the sample is etched by using the spacer as a mask (FIG. 2(i)), thereby forming a line pattern (FIG. 2(j)).

By the foregoing processes, the dimensions of the pattern which is formed on the sample 201 are finally determined by the dimensions of the spacer. A pitch dimension of the pattern is determined by the sum of the dimensions of the concavity between the spacers and the dimensions of the spacer. However, since the concavity between the spacers is constructed by two kinds of gaps of a core gap 211 which is formed by removing the first mask pattern 205 by etching and a spacer gap 212 which is formed by etching the second mask layer 206 after it was formed, if a difference occurs between the dimensions of the core gap and the dimensions of the spacer gap, the pitch dimension of the line pattern which is formed on the sample does not become constant. Therefore, it is necessary that dimension values of the core gap and dimension values of the spacer gap are individually measured, in order to control the dimensions of the core gap, the measured dimension values are fed back to the process (FIG. 2(c)) for exposing the photoresist to form the first mask pattern 205, and in order to control the dimensions of the spacer gap, the measured dimension values are fed back to the film forming process (FIG. 2(f)) for forming the second mask layer 206 or to the process (FIG. 2(g)) for etching the second mask layer 206, and an executing condition of the process is changed on the basis of the dimension values.

A method of discriminating the core gap and the spacer gap formed on the sample by the SADP and measuring the dimensions of the gaps will be described hereinbelow by using the scanning electron microscope.

Figure 3:
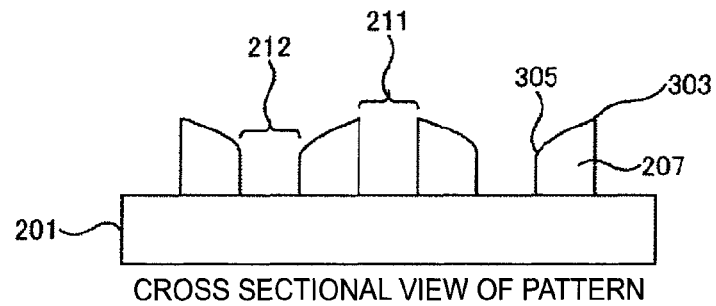
FIG. 3 is a diagram for describing an example of a cross sectional view of a pattern formed by the SADP, an electron microscope image, and a secondary electron profile.
Figure 3:
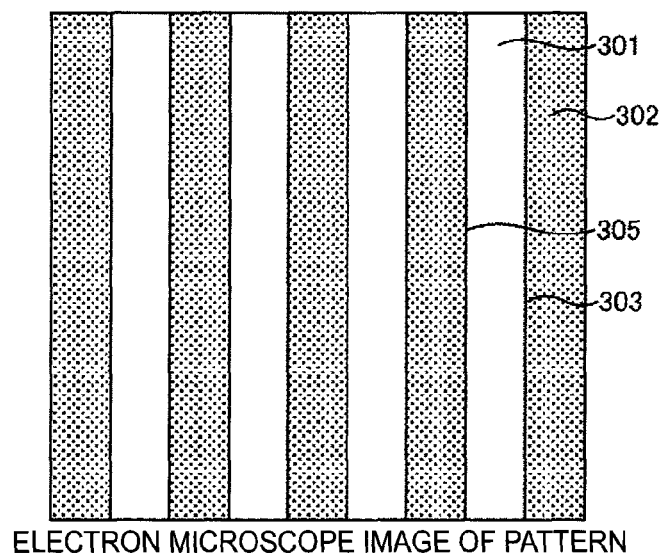
Figure 3:
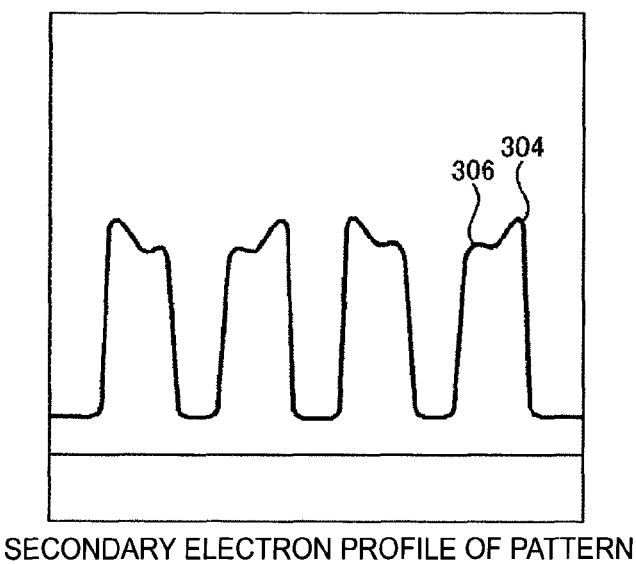

FIG. 3 shows an electron microscope image of a pattern including spacers formed on a sample and two kinds of gaps, a cross sectional view of the pattern corresponding to the electron microscope image, and a secondary electron profile formed from the electron microscope image.

In the electron microscope image, there are a portion 301 in which luminance is high and seen in white and a portion 302 in which luminance is low and seen in black. The luminance of the electron microscope image depends on an amount of secondary electrons emitted from the sample and there is a feature that the larger the secondary electron amount is, the higher the luminance is. By using such feature, in the electron microscope image, a difference of the cross sectional shape of the pattern appears as a difference of the luminance of the image. In the embodiment, such feature of the electron microscope image is used and the core gap and the spacer gap of the pattern are discriminated by using the difference between the shapes of them.

The secondary electron profile formed from the electron microscope image becomes high in the portion corresponding to the spacer and becomes low in the portion corresponding to the gap. In addition, a peak of the secondary electron profile appears in a boundary portion between the spacer and the core gap and in a boundary portion between the spacer and the spacer gap. This is because, if edge portions with different angles are scanned by the electron beam to the sample surface, an emission amount of the secondary electrons increases larger than that of a plane due to an edge effect. The steeper the inclination of the edge is, the larger the amount of secondary electrons which are emitted is.

Between the two edges which the spacer 207 has, an edge 303 adjacent to the core gap 211 is formed more sharply than an edge 305 adjacent to the spacer gap 212. Therefore, when a core peak 304 which is formed on the basis of the detection of the electron emitted from the edge 303 and a spacer peak 306 which is formed on the basis of the detection of the electron emitted from the edge 305 are compared, the core peak 304 is relatively high.

That is, in a boundary portion between the core gap 211 and the spacer 207, the core peak 304 which is relatively high appears. In a boundary portion between the spacer gap 212 and the spacer 207, the spacer peak 306 which is relatively low appears.

Prior to specifically explaining a gap discriminating method, another double patterning process will be described.

Although the SADP process as one of the double patterning process has been described as an example in FIG. 2, as other methods, as disclosed in Non Patent Literatures 1 and 2, the following various kinds of methods have been proposed: a method (Litho-Etch-Litho-Etch: hereinbelow, called LELE) of forming a fine pattern by repeating an exposure and an etching twice; a method (Litho-Freeze-Litho-Etch: hereinbelow, called LFLE) whereby after one set of patterns were exposed, while the first set of resist patterns are held by a process called freeze, the second set is exposed; and the like. As a common point of the double patterning process other than the SADP, there is a feature that the adjacent pattern of a high density portion is divided into two masks and they are individually exposed twice.

Since the adjacent patterns are formed by different exposing processes, in order to perform a pattern dimension management and its control, it is necessary to discriminate by which exposing process the adjacent pattern was formed. That is, in place of the core gap and the spacer gap in the SADP, it is necessary to discriminate the adjacent line pattern. In other words, with respect to a pattern edge adjacent to the core gap and a pattern edge adjacent to the spacer gap, since manufacturing processes by which those edges were formed differ, if features which are derived by those manufacturing processes are captured, both of them can be identified.

The method of discriminating the difference of the cross sectional shape of the pattern on the basis of the difference in the signal waveform of the electron microscope image in the embodiment can be also applied to such a general double patterning process. For example, as disclosed in Non Patent Literature 3, in the LELE process, first, an example is shown in which background flatness at the time of exposure of the second set deteriorates due to an influence of the first set of patterns formed by the exposure and etching, and the exposure becomes difficult. As mentioned above, in the LELE process, in the exposure of the first set and the exposure of the second set, their degrees of difficulty differ and the shape of the pattern which is formed as a result of the exposure changes depending on the forming process. Also in the LFLE process, since such different processes that a freezing process is executed to the first set of exposure patterns, further, light is again irradiated even by the exposing process of the second time, and the like are executed, a possibility that the first exposure pattern has a shape different from that of the exposure pattern of the second time is high. In any of those processes, in the exposure of the second time, since the background is influenced by the exposure of the first time, reflection prevention becomes insufficient. Therefore, not only the cross sectional shape changes but also variations of the pattern shape and dimensions become relatively large. That is, a magnitude of Line Edge Roughness (hereinbelow, called LER) of the exposure pattern of the first time and that of the exposure pattern of the second time differ. Not only the image luminance changes depending on the pattern shape as mentioned above but also a brightness of the electron microscope image changes depending on a difference of material. In the LELE process, the material of the mask to form the final pattern differs between the two sets of patterns. Also in the LFLE process, characteristics of the material change between the two sets of patterns by the freezing process.

Also with respect to the gaps of the SADP, since the etching step to form the gap differs between the core gap and the spacer gap, a possibility that the damage state or the like of the surface changes is high. In such case, the luminance of the electron microscope image changes depending on the difference of the characteristics of the material. In any of the double patterning processes, the difference of the shapes between the two sets of patterns which are formed adjacently by the different processing steps, their variations, the difference of the material, and the like occur as mentioned above. Therefore, if they can be discriminated by the electron microscope image, the pattern dimensions can be evaluated in every forming process and the manufacturing process can be properly managed and controlled. Although a discriminating method of the patterns formed by the SADP process will be described in detail in the following embodiments, by applying this method, the invention can be also applied to another double patterning process.

Embodiment 1

A specific gap discriminating method will be described hereinbelow. There are mainly two kinds of gap discriminating methods. As a first method, a method whereby an attention is paid to the difference in the shape of the secondary electron profile which occurs due to the difference between the two gap shapes and the discrimination is performed on the basis of feature values calculated from the profile is shown.

Figure 4:
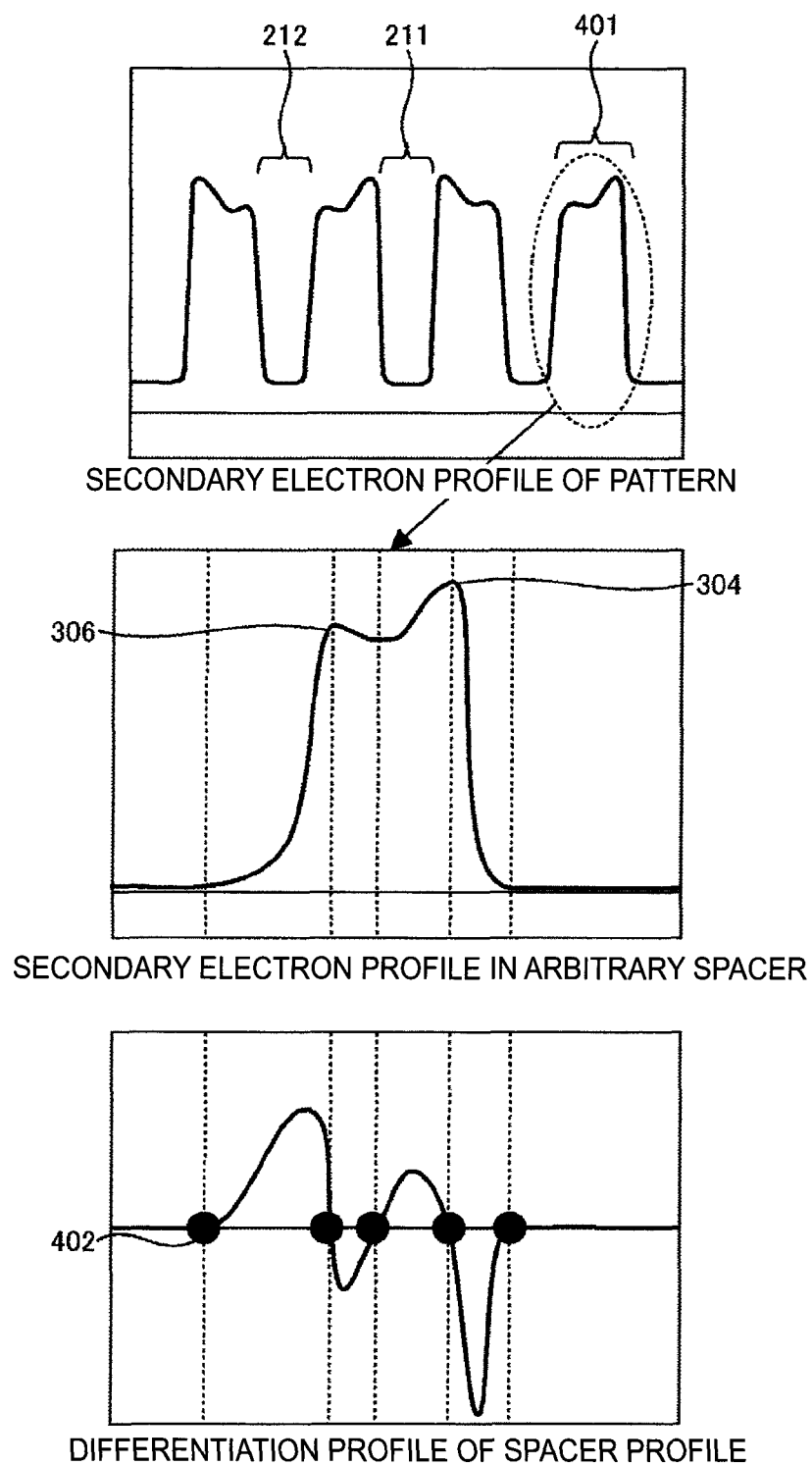
FIG. 4 is a diagram for illustrating an example of a method of discriminating a kind of gap on the basis of the secondary electron profile.

FIG. 4 illustrates a secondary electron profile of a pattern including spacers and the two kinds of gaps, a secondary electron profile for an arbitrary spacer extracted from this profile, and a differentiation profile acquired by executing a differentiating process to the profile.

First, a portion (hereinbelow, called a spacer profile 401) corresponding to the spacer is extracted from the secondary electron profile of the pattern. To detect the spacer profile 401, a process for extracting a region having a secondary electron amount which is equal to or larger than a preset threshold value is executed. Since a plurality of spacers are included in a measuring range, a plurality of regions extracted by the process are individually recognized as different spacers. Although this threshold value can be arbitrarily set since a process is executed in order to separate the spacer and the gap portion from the secondary electron profile, generally, it may be set to about an intermediate value between the maximum value and the minimum value in the secondary electron profile of the pattern.

Subsequently, a peak corresponding to the edge of the spacer is extracted for one extracted spacer profile 401. A method of using a differentiation profile of the spacer profile 401 in order to extract the peak will be described. The differentiation profile is formed for the spacer profile and a point 402 where a value of the differentiation profile is equal to 0 is extracted. It is sufficient that a point at which the value of the spacer profile is largest among the points extracted at this time is set to the core peak 304 and a point of the second largest value is set to the spacer peak 306.

After the foregoing processes were executed to all spacer profiles 401, it is determined that a region where the core peaks 304 are adjacent to each other in the adjacent spacer profiles is a core gap 211 and a region where the spacer peaks 306 are adjacent to each other is a spacer gap 212.

Figure 5:
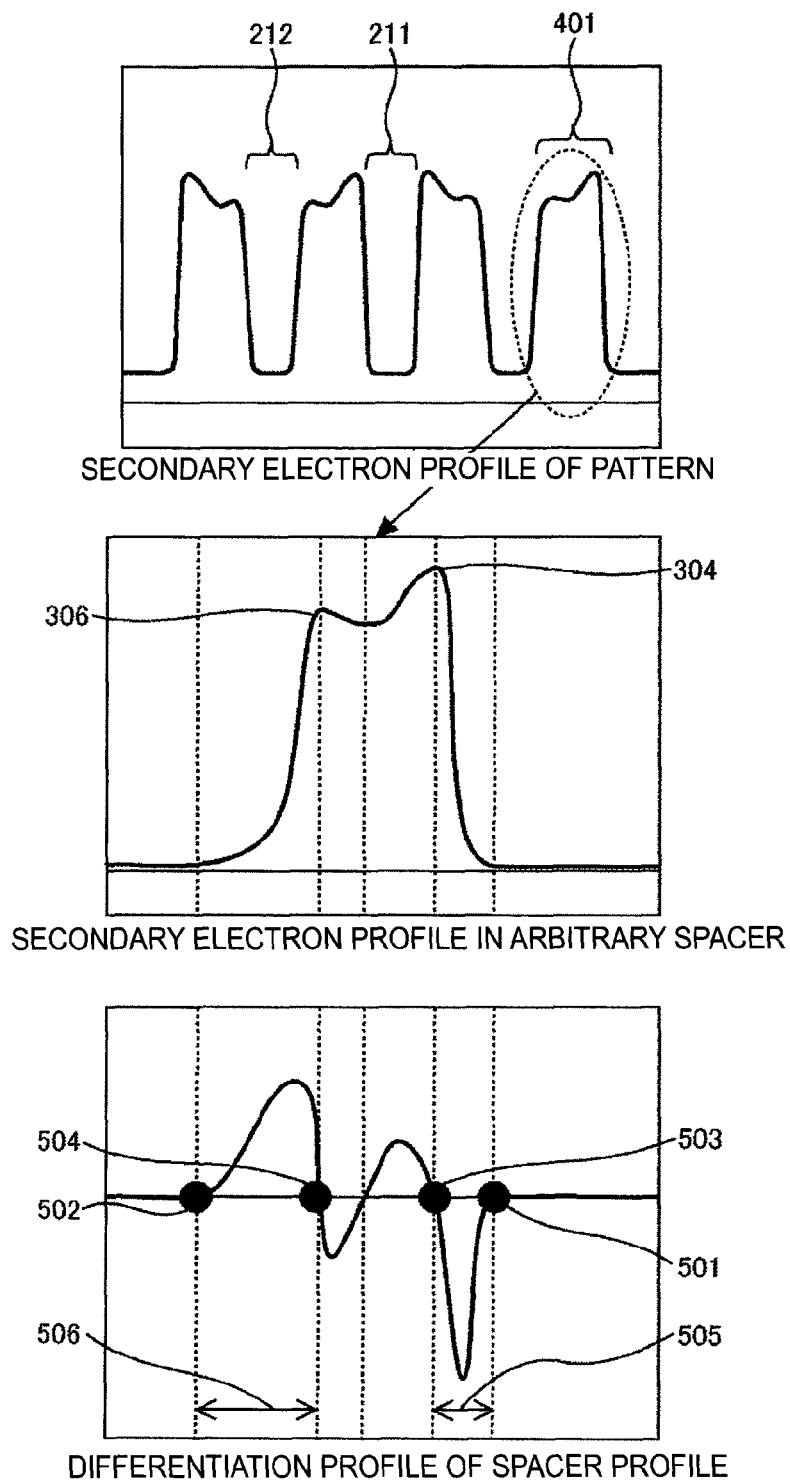
FIG. 5 is a diagram for illustrating another example of a method of discriminating a kind of gap on the basis of the secondary electron profile.

As a discriminating method other than the above method, it is also possible to discriminate by using an inclination of a foot portion of the spacer profile 401. FIG. 5 illustrates a secondary electron profile of a pattern including spacers and two kinds of gaps, an arbitrary spacer profile extracted from this profile, and a differentiation profile acquired by executing a differentiating process to this profile.

The above discriminating method uses a feature that by paying an attention to the point that inclinations of two side surfaces forming the spacer differ, at the side surface of a gentle inclination, a foot portion of the spacer profile becomes long, and at the side surface of a steep inclination, a foot portion of the spacer profile becomes short. Specifically speaking, the discrimination is performed by comparing a distance from a rising edge of the spacer profile to a point at which the profile reaches the core peak 304 with a distance from the rising edge of the spacer profile to a point at which the profile reaches the spacer peak 306.

First, in a manner similar to the foregoing method, an arbitrary spacer profile 401 is extracted from the secondary electron profile of the relevant pattern, thereafter, a differentiation profile of this profile is formed, and right and left rising edges 501 and 502 of the spacer profile 401 are extracted from the differentiation profile. When the rising edges are extracted, it is sufficient to obtain a point where the value is largely deviated from 0 when values of the differentiation profile are examined from an edge point of the differentiation profile toward a center of the profile.

Subsequently, points 503 and 504 at which the value of the differentiation profile becomes equal to 0 for the first time from the leading points 501 and 502 toward the inside of the spacer profile are extracted. Positions of the points 503 and 504 correspond to the core peak 304 and the spacer peak 306 as is obvious from FIG. 5.

A distance 505 between two points of the points 501 and 503 and a distance 506 between two points of the points 502 and 504 are obtained, respectively. By comparing the obtained distances between two points, it is possible to determine that a gap adjacent to the side surface of the distance 505 between two points of the large value is the spacer gap 212 and a gap adjacent to the side surface of the distance 506 between two points of the small value is the core gap 211.

The use of the inclinations of the foot portions of the spacer profile is also possible. In this case, there is used a point that by paying an attention to a point that the inclinations of the two side surfaces forming the spacer differ: at the side surface of the gentle inclination, the inclination of the spacer profile becomes gentle so that an absolute value of the differentiation profile is small, and on the contrary, at the side surface of the steep inclination, the inclination of the spacer profile becomes steep so that the absolute value of the differentiation profile is large.

Figure 6:
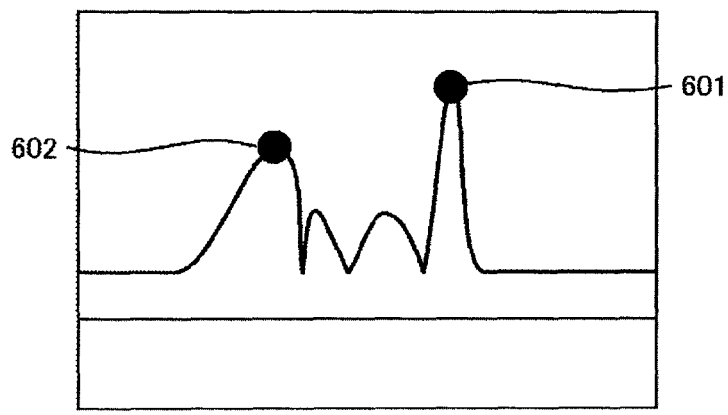
FIG. 6 is a diagram for illustrating an example of a differentiation profile of a spacer profile.

FIG. 6 illustrates a profile in which the absolute value of the differentiation profile illustrated in FIG. 5 is taken.

First, in a manner similar to the foregoing method, an arbitrary spacer profile 401 is extracted from the secondary electron profile of the pattern including the spacers and the two kinds of gaps, thereafter, a differentiation profile of the profile is formed, and a differentiation profile in which the absolute value of the differentiation profile is taken is formed. Subsequently, peak heights of first peaks 601 and 602 locating from the right and left foot portions of the profile toward the center are compared. It is determined that a gap adjacent to the higher peak 601 is the core gap 211 and a gap adjacent to the lower peak 602 is the spacer gap 212.

Although the method using the differentiation profile has been described as a method of extracting the peaks from the secondary electron profile in the present description, the invention can be also applied to another method which can extract the peaks.

For spacers with smaller dimensions, there is a case where the spacer profile as illustrated in FIG. 4 is not shown.

Figure 7:
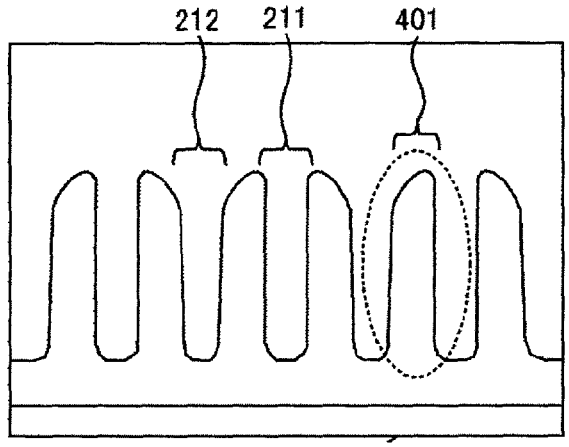
FIG. 7 is a diagram for illustrating a gap discriminating method to a pattern in which a line width of a spacer is small.
Figure 7:
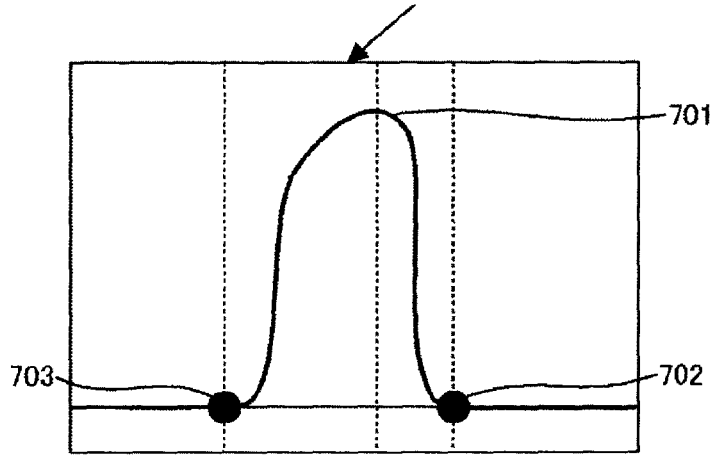
Figure 7:
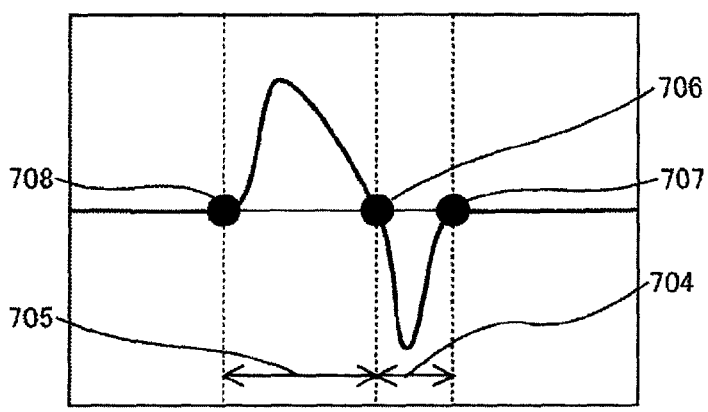

FIG. 7 illustrates a cross sectional view of the pattern and its secondary electron profile in the case where the dimensions of the spacer are smaller than those of the spacer shown in FIG. 4.

In the case where a finer pattern was formed by using the SADP, the dimensions of the spacer also become small in proportion. When the dimensions of the spacer become small, the core peak and the spacer peak approach. Therefore, it is predicted that the spacer peak is hidden behind the foot portion of the core peak and the spacer peak cannot be detected as a peak. Alternatively, since the dimensions of the spacer which is formed decrease, a difference between the side surface shape of the spacer on the core gap side and that on the spacer gap side decreases and it is also predicted that a clear difference between the core peak and the spacer peak cannot be detected.

In this case, if the gap discrimination is performed by the foregoing method, the core gap and the spacer gap cannot be detected. Therefore, it is necessary to add a process for avoiding the error to the discriminating sequence of the gaps.

Figure 8:
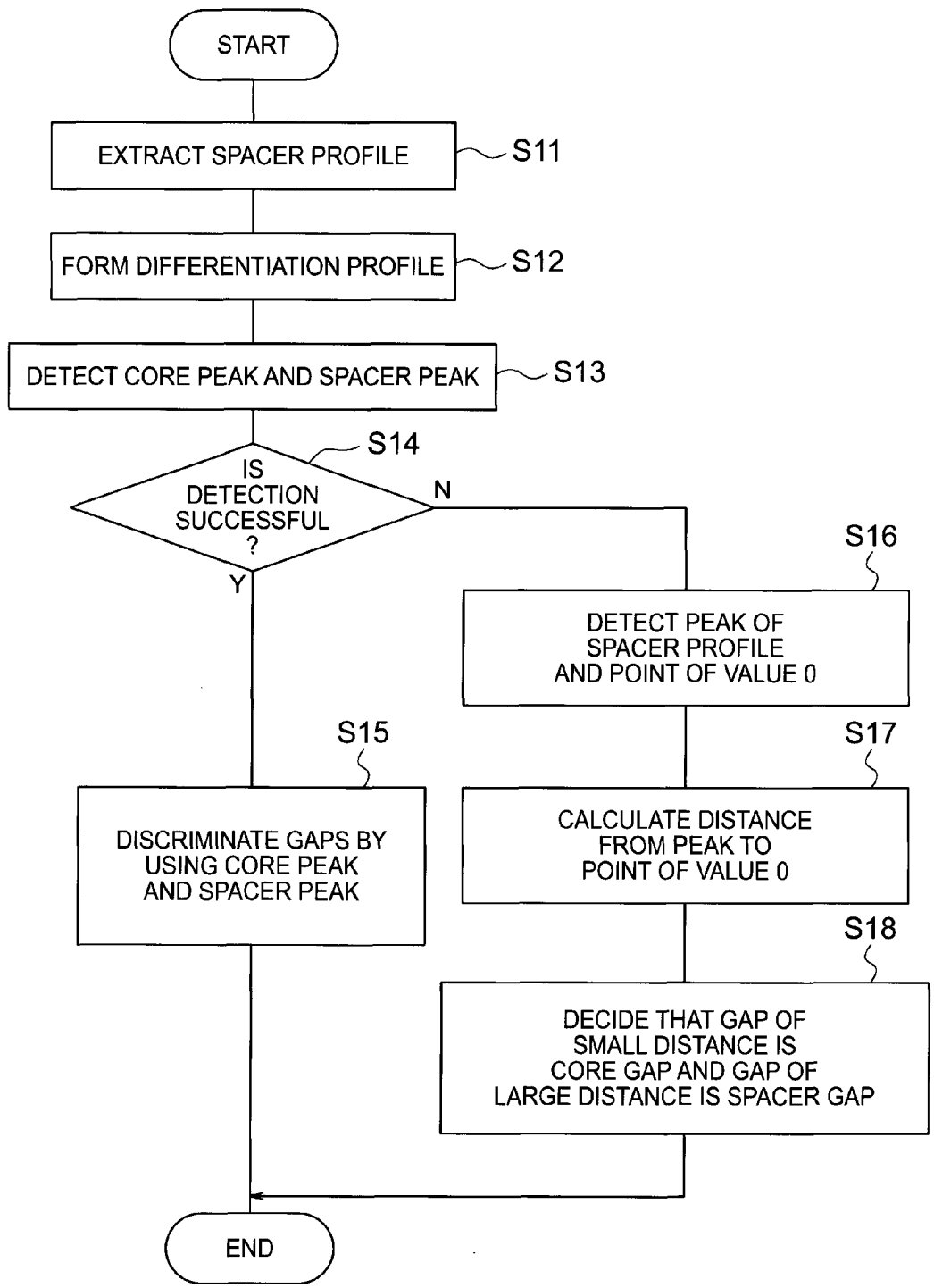
FIG. 8 is a flowchart for representing gap discriminating steps to the pattern in which the line width of the spacer is small.

FIG. 8 shows a flowchart in which the avoiding process of the error is added.

The detecting process of the core peak and the spacer peak mentioned in the foregoing gap discriminating method is executed to the secondary electron profile acquired from the measuring point (S11, S12, S13). Whether or not the detection of the core peak and the spacer peak is successful is discriminated in S14. Since only one peak is detected in the secondary electron profile as illustrated in FIG. 7, in the discriminating process of S14, the processing routine advances to a process of S16 instead of the normal gap discriminating process (S15). In S16, a peak 701 is detected by assuming that the number of peaks on the spacer profile is equal to one. Since the peak 701 is the sum of the core peak and the spacer peak, the position of the peak 701 exists certainly at a position near the inherent core gap.

Therefore, distances 704 and 705 between two points from the position of the peak 701 to rising edges 702 and 703 of the spacer profile are calculated, respectively. Both of them are compared in S18 and it is determined that the shorter distance between two points is the core gap and the longer distance is the spacer gap. In the above method, it is also possible to construct such that a differentiation profile is formed from the secondary electron profile, points 706, 707, and 708 in which the value of the differentiation profile is equal to 0 and which correspond to the peak 701 and the points 702 and 703 are calculated, and the distance 704 between the two points between the points 706 and 707 and the distance 705 between the two points between the points 706 and 708 are compared. Alternatively, it is also possible to construct such that a distance between the peaks 701 between the adjacent spacer profiles 401 is calculated and it is determined that the gap of the shorter distance is the core gap 211 and the gap of the longer distance is the spacer gap 212.

The core gap and the spacer gap can be also discriminated by using a discriminating method using the fact that the foregoing LERs differ at the right and left edges of the spacer or a discriminating method using the fact that depths of the bottom portions of the core gap and the spacer gap differ. Those methods will be described in detail in Embodiment 2, which will be described hereinafter.

By applying such an algorithm that if it is determined that one gap discriminating method is improper, the method is switched to another gap discriminating method as mentioned above, the following effects can be also expected.

For example, it is also possible to cope with an unexpected fluctuation of the manufacturing process. As a further effect, stability and reproducibility of the manufacturing process are important in order to assure a yield in the manufacturing step of the semiconductor device, and the fact itself that it is necessary to switch the discriminating method results in that the fluctuation of the process has been detected. A flag of the switching is used for a process QC (Quality Check), a check of the step is performed, and dispersion of the abnormal manufacturing step can be prevented.

As a discriminating method of the gaps which are formed between the spacer as mentioned above, the gap kinds can be discriminated at high precision by using the profile which is formed on the basis of the electron which is emitted from the spacer portion and by comparing feature amounts (information regarding the peak height, the distance between the peak and the bottom (leading points of the peak), the peak height of the differentiation profile, the distance between the peak and the bottom of the differentiation profile, and the like) on one end (one edge) side of the profile and a feature amount on the other end (other edge) side. The two feature amounts are not limited only to the relative distances between the two points but can be also replaced by, for example, the number of pixels between two points on the image or some value showing a degree of distance, or the like. Instead of directly comparing the two feature amounts, it is also possible to construct such that a predetermined reference value is provided and by discriminating a degree of approximation or separation to/from the reference value, two feature amounts are compared.

Figure 9:
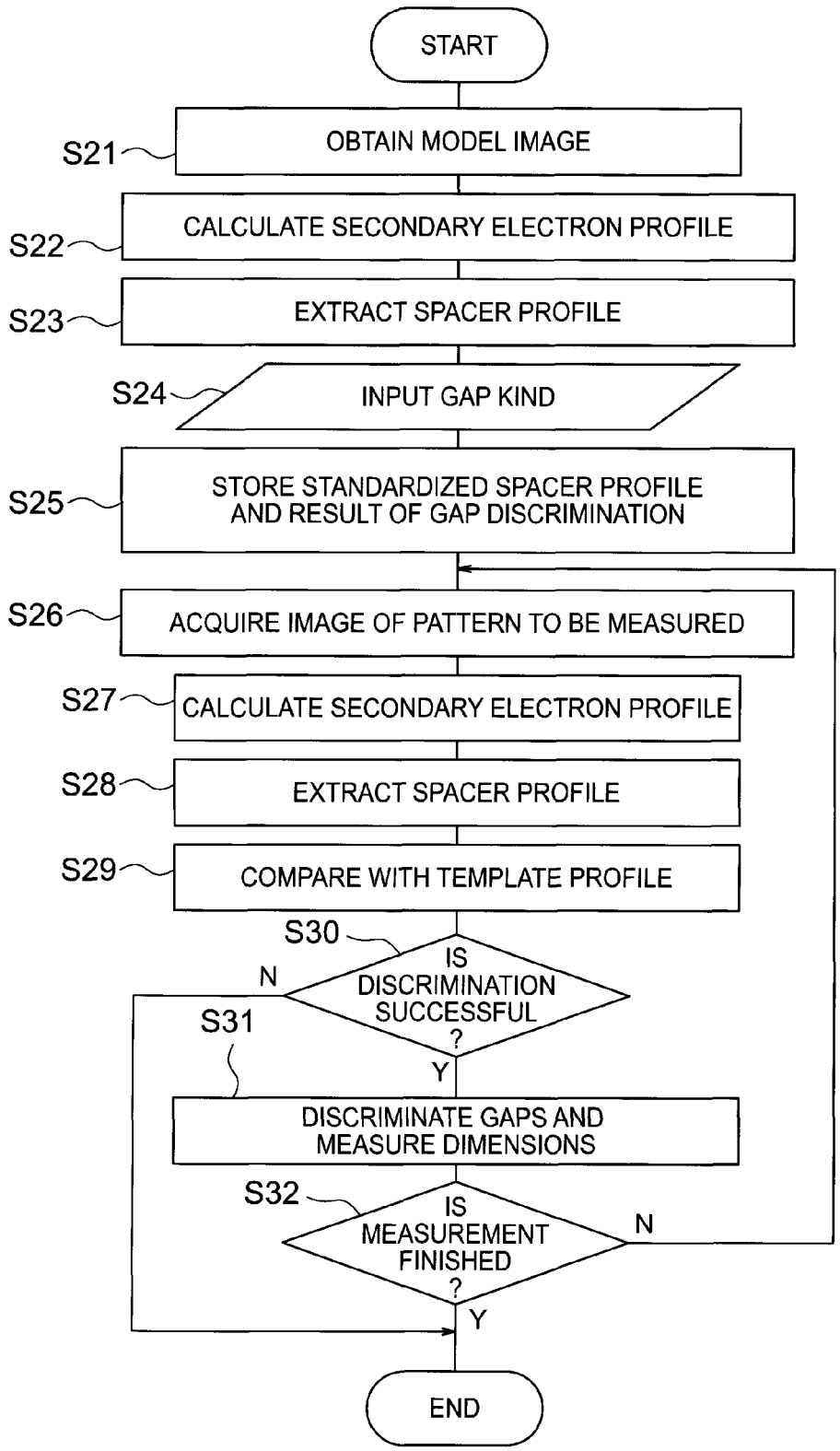
FIG. 9 is a flowchart for representing the gap discriminating steps using a waveform matching.

Subsequently, as a second gap discriminating method, a method of discriminating by using profile matching will be described. The discriminating method by the profile matching is a method whereby a secondary electron profile of a pattern serving as a reference of the discrimination is preliminarily registered and a degree of similarity with the secondary electron profile acquired from the pattern at the measuring point is calculated, thereby performing the gap discrimination. FIG. 9 represents a flowchart for the discriminating method.

First, the positions of the core gap and the spacer gap have already been known by the operation of the operator and an electron microscope image of a pattern having the same structure as that of a pattern which the operator wants to perform the discrimination is picked up (S21). A secondary electron profile is calculated from the image (S22). A region where a value of the profile is equal to or larger than a predetermined threshold value is automatically recognized as a spacer and other portions are automatically recognized as gaps, and a spacer profile is extracted (S23).

A region of the extracted spacer profile is divided into two gap portions and one spacer portion and displayed onto the secondary electron image display apparatus 124 in FIG. 1.

After that, in S24, the operator is required to input which gap corresponds to the core gap and the spacer gap, and the kinds of gaps are determined. In S25, the spacer profile is standardized by using the maximum value and the minimum value and registered as model information together with the kinds of gaps adjacent to the profile. This model registration may be performed by using a pattern on the same wafer as that of the measurement target pattern to which the gap discriminating process is executed in S26 and subsequent steps or by using the representative wafer repetitively for all measurement target wafers. In the case of registering every target wafer, since an appearance state of the pattern of the model is similar to that of the measurement target, there is an advantage that the discrimination can be more accurately performed. However, an initial input by the operator will be necessary. A higher efficiency method in which such input is unnecessary will be described in the embodiment 3. A measurement is performed on the basis of the above registered model information.

In S26, an image of the pattern at the measuring point is taken and a secondary electron profile is calculated (S27). A region where a value is equal to or larger than a predetermined threshold value is automatically recognized as a spacer and other portions are automatically recognized as gaps, and a spacer profile is extracted (S28). In S29, the calculated spacer profile is standardized and compared with the spacer profile of the registered model, thereby executing the gap discrimination.

Figure 10:
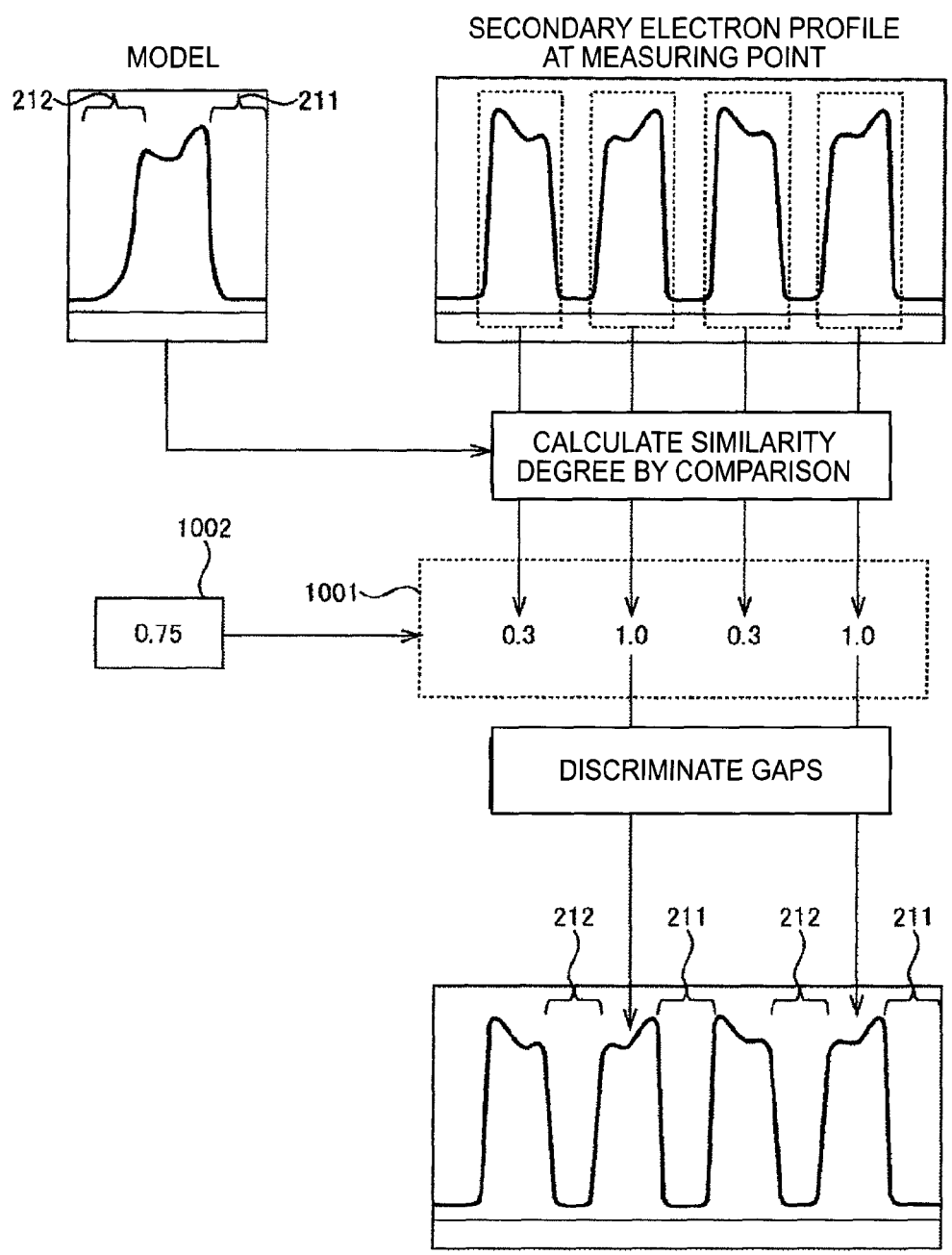
FIG. 10 is a diagram for illustrating a gap discriminating method by waveform matching.

FIG. 10 represents details of the gap discriminating method. First, a similarity degree 1001 indicating a degree of coincidence between each spacer profile acquired at the measuring point and the spacer profile of the model is calculated. As for the spacer in this case, since the spacers whose right and left directions differ are alternately arranged for convenience of the process, the similarity degree of the spacer whose direction coincides with that of the spacer profile of the model is high and, on the contrary, the similarity degree of the spacer whose direction is opposite to that of the spacer profile of the model is low. Therefore, a threshold value 1002 of the similarity degree is set at which only the spacers whose directions coincide with that of the spacer profile of the model can be extracted. The gap discrimination based on the model information is executed only to the spacers having the similarity degrees which are equal to or larger than the threshold value. As mentioned above, since the core gap and the spacer gap are alternately arranged, the kinds of gaps can be determined to all gaps by the above processes.

According to this discriminating method using the model information, the discrimination can be also performed by using the feature values used in the first gap discriminating method as model information.

According to the gap discriminating method mentioned above, the method whereby the discrimination is performed to all of the spacer profiles existing in the measuring region scanned by the primary electron beam and the gap kinds are determined has been described. However, the number of the spacer profiles to which the discrimination is performed can be also reduced by using regularity regarding the arrangement of the spacer, core gap, and spacer gap which are peculiar to the SADP.

This is because an attention is paid to a point that the core gap and the spacer gap are certainly alternately arranged in the pattern including the spacers and the two kinds of gaps, and by performing the discrimination with respect to at least two adjacent spacer profiles, the kinds of gaps locating between the two spacers can be determined, and the kinds of all other gaps can be also determined by using the gaps as references. By the present method, the number of times of the discriminating process can be reduced, so that improvement of the throughput can be expected. However, when the number of spacers to which the discrimination is performed is decreased, if the shapes of the spacers are broken, a possibility that the discrimination fails or an erroneous discrimination is performed increases. Therefore, it is desirable that the operator can arbitrarily set the number of spacers to which the discrimination is performed.

When the discrimination is performed for a plurality of spacer profiles, such a case where the discrimination of several spacer profiles fails or an erroneous discrimination result is output is considered. In this case, obtained individual discrimination results are collected and the discrimination result in the erroneous gap can be corrected from the regularity.

Figure 11:
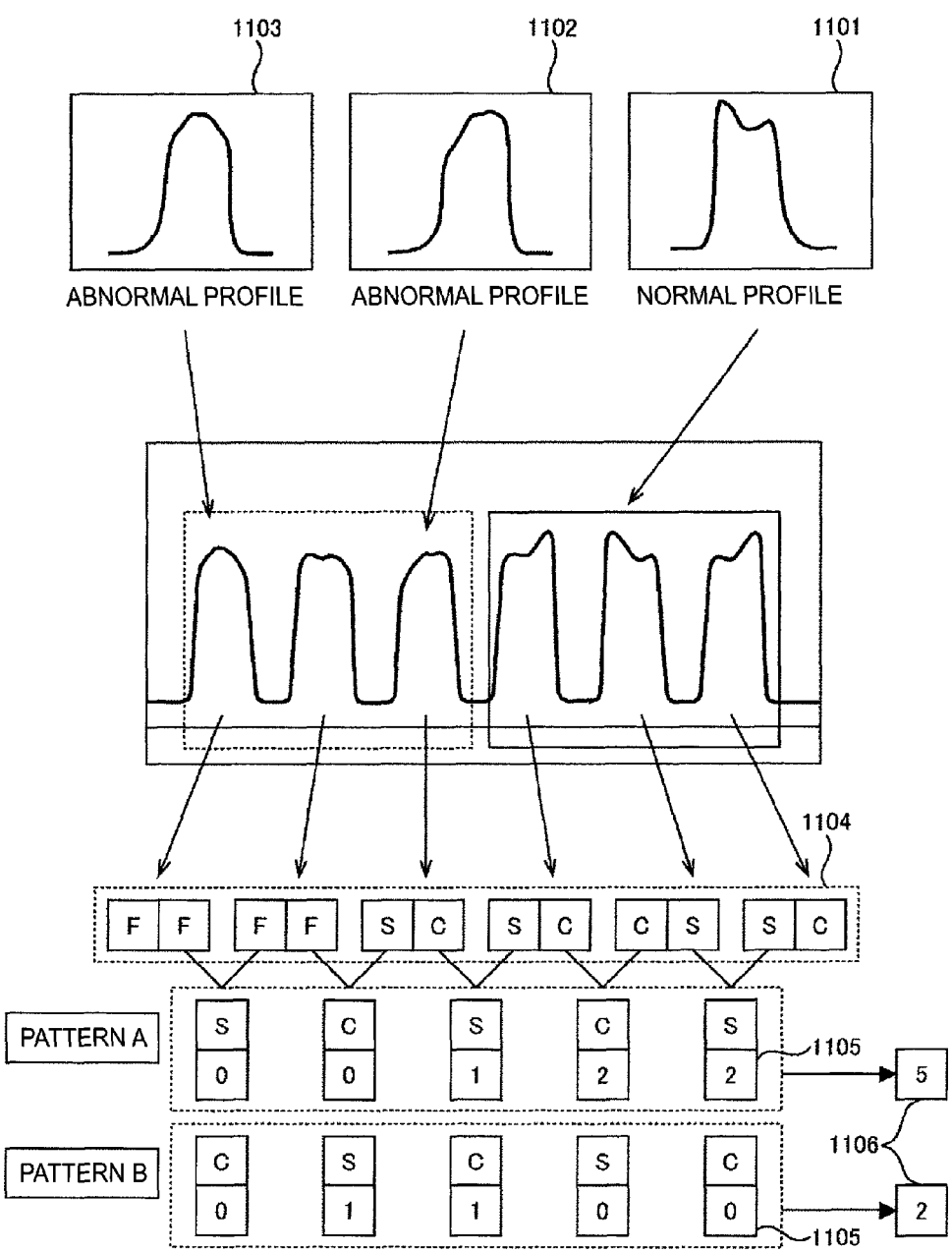
FIG. 11 is a diagram for illustrating a method of correcting an erroneous discrimination at the time of the gap discrimination.

FIG. 11 illustrates an error correcting method at the time of the gap discrimination. A profile 1101 in which a normal discrimination can be performed, a profile 1102 in which an erroneous discrimination is liable to be performed, and a profile 1103 in which the discrimination is liable to fail are included in a secondary electron profile at a measuring point illustrated in FIG. 11.

First, for the secondary electron profile, spacer profiles are extracted by the foregoing method and the discrimination is performed every spacer profile with respect to right and left gaps of the spacer profile. In a discrimination result 1104, S denotes a spacer gap, C indicates a core gap, and F denotes that it is determined that the discrimination is impossible. Since the core gap and the spacer gap formed by the SADP are always alternately arranged, an arrangement of the gaps is either a pattern A or a pattern B. In the pattern A, the leftmost gap is the spacer gap and, in the pattern B, the leftmost gap is the core gap.

Subsequently, an evaluation value 1105 in each gap at the time when those two kinds of patterns are compared with the discrimination result of each spacer profile is calculated. As a calculating method of the evaluation value, for one gap, on the basis of the discrimination results obtained from the spacers on both sides of this gap, if the discrimination results coincide, the evaluation value is calculated as +1, and if the discrimination results are opposite or there are no results due to a failure of the discrimination, the evaluation value is calculated as 0. For example, if the results obtained from the spacers on both sides coincide with the selected pattern, the evaluation value is set to +2. If only one of the results coincides with the selected pattern, the evaluation value is set to +1. After the evaluation values were calculated to all of the spacer profiles, an integrated evaluation value 1106 obtained by summing the evaluation values of all of the spacer profiles is calculated. The pattern in which the integrated evaluation value is high is set to a discrimination result of the gap.

In the case of FIG. 11, the pattern A becomes the discrimination result of the gap. On the basis of this discrimination result, the discrimination result of the gap in which the discrimination has failed or the gap in which the erroneous discrimination has been made is corrected.

At a stage when the integrated evaluation value was calculated, if a difference between the pattern A and the pattern B of the integrated evaluation values is equal to or less than a predetermined value, that is, if a rate of the spacers in which the erroneous discrimination has been made or the discrimination has failed is equal to or larger than a predetermined value, it is proper that the discrimination result at the measuring point is outputted as an error, the measurement of the pattern dimensions at the measuring point is not executed, and the processing routine advances to the next process. This is because when the number of spacers in which the erroneous discrimination has been made or the discrimination has failed increases, certainty of the outputted discrimination result itself decreases.

When the gap discrimination and the measurement are finished, the taken electron microscope image, the gap discrimination results, and the length measurement length values of every gap are displayed onto the secondary electron image display apparatus 124 in FIG. 1.

Figure 12:
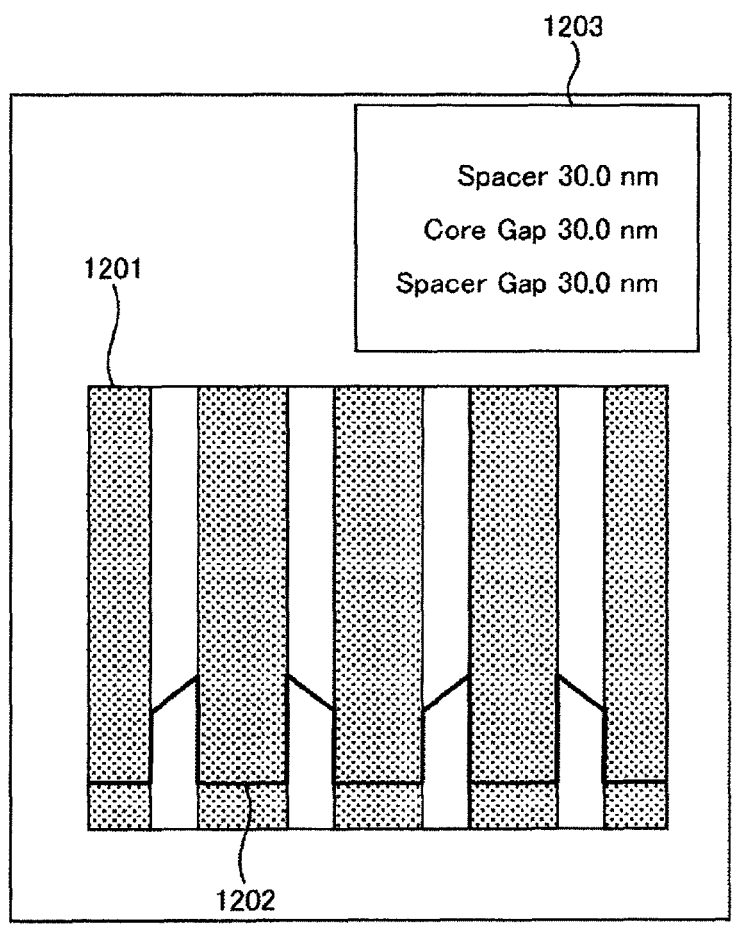
FIG. 12 is a diagram for illustrating an example of a display in which measurement results of a core gap and a spacer gap have been displayed on the electron microscope image.

A display example is shown in FIG. 12. A line 1202 in a lower portion of an electron microscope image 1201 indicates a cross sectional schematic diagram of the pattern which was determined by the gap discrimination. A right upper numeral 1203 of the electron microscope image 1201 indicates each average value of a plurality of spacers, core gaps, and spacer gaps which were measured.

By the above construction, for the pattern including the spacer in the range scanned by the charged particle beam and the two kinds of gaps, the gap discrimination can be easily performed only from the image from the vertical direction. Even in the case of assembling into the automatic measurement of the semiconductor inspecting apparatus, the inspection and the measurement can be executed by the gap discriminating process without deteriorating the throughput.

Embodiment 2

Figure 13:
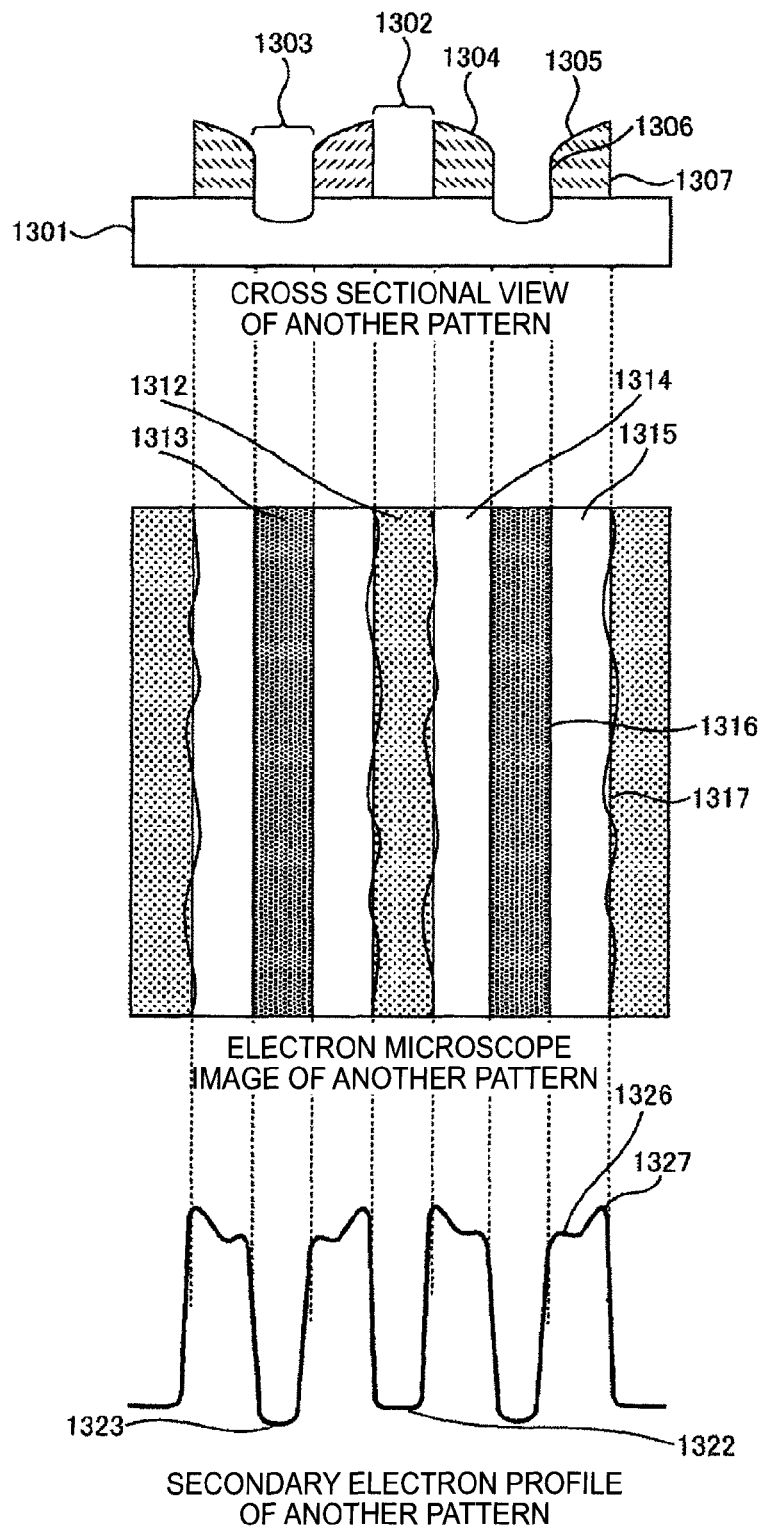
FIG. 13 is a diagram for illustrating another example of a cross sectional view of a pattern formed by the SADP, an electron microscope image, and a secondary electron profile.

FIG. 13 illustrates another pattern example different from the pattern described in FIG. 3. An electron cross sectional view of a pattern formed on a sample, a cross sectional view of a pattern corresponding to the electron microscope image, and a secondary electron profile formed from the electron microscope image are illustrated. FIG. 13 differs from FIG. 3 with respect to a point that there is a difference between depths of a spacer gap 1303 and a core gap 1302. In this example, the spacer gap 1303 has been etched deeper than the core gap 1302. It is considered that since the spacer gap 1303 and the core gap 1302 are formed by etching of the different processes as shown in FIG. 2, such a difference is liable to appear. This difference is observed as a difference of luminance in the electron microscope image. For example, a spacer gap portion 1313 is dark and a core gap portion 1312 is bright. In the secondary electron profile, a difference of depth of a bottom portion of a waveform appears. A profile 1323 of the spacer gap portion is deeper than a profile 1322 of the core gap portion. By detecting those differences, a spacer gap side 1326 and a core gap side 1327 can be determined and left and right portions (1304, 1305) of the target pattern can be discriminated.

There is a difference in line edge roughness as another difference that is caused since the spacer gap 1303 and the core gap 1302 are formed by etching of the different processes. It is considered that on the core gap side, although the line edge roughness at the time of forming the core gap remains as it is, since the spacer gap side is formed by the etching, the line edge roughness is small. A method of discriminating the right and left patterns by using this difference will be described by referring to FIG. 14. In this case, a line edge roughness 1316 on the spacer gap side is called as left line edge roughness and a line edge roughness 1317 on the core gap side is called as right line edge roughness.

A plurality of secondary electron profiles 1402 are formed every arbitrary region 1401 which is projected when a secondary electron profile is formed from an electron microscope image of a pattern. Line edges of all of a plurality of secondary electron profiles 1403 are detected. The detection of the line edges can be determined, for example, as a position showing an intermediate value of the maximum value and the minimum value of the secondary electron profile of each pattern. In an edge image 1411 in which the edges detected in all regions have been plotted, a line edge 1412 on the core gap side and a line edge 1413 on the spacer side are alternately arranged on every third edge. Subsequently, distribution of the line edge position at each edge is obtained. A difference of the line edge roughness on the core gap side and the spacer gap side can be discriminated by a difference between distribution 1422 of the line edge positions on the core gap side and distribution 1423 of the line edge positions on the spacer side.

Figure 14:
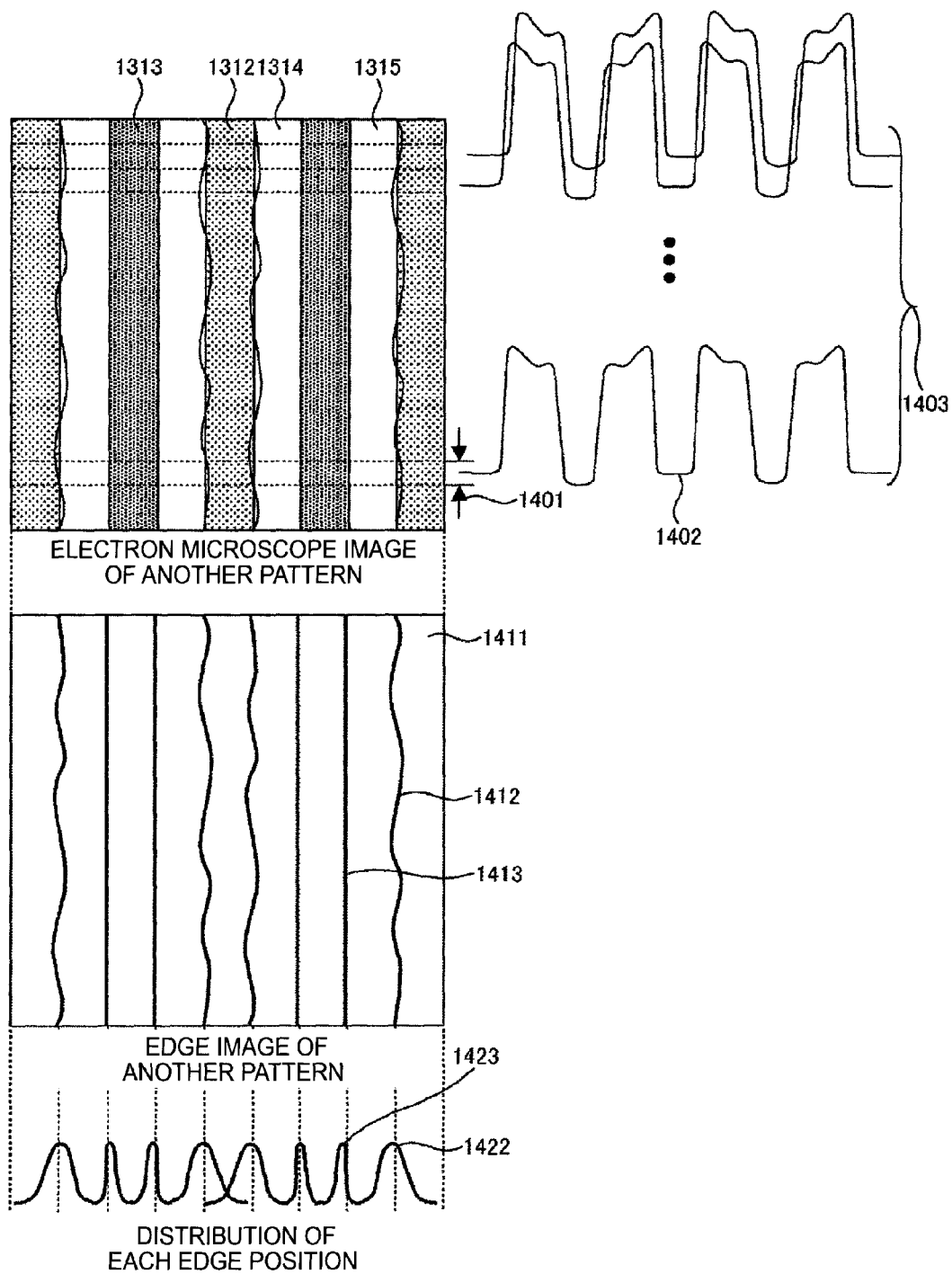
FIG. 14 is a diagram for illustrating a method of obtaining a fluctuation of an edge from the secondary electron profiles acquired in a plurality of regions in a beam scanning region (Field Of View).

Distribution information of the edge positions can be obtained on the basis of acquisition of edge position information in a lateral direction (X direction) which is acquired at the plurality of different edge positions in a direction (Y direction) perpendicular to a paper surface of FIG. 14. For example, it is considered that a graph in which an axis of abscissa indicates the edge position information (X direction) and an axis of ordinate indicates an appearance frequency of a signal is created and, on the basis of edge position distribution information which is expressed on the graph, the gap discrimination is performed. In this case, a half-width value of a distribution curve in the first gap portion and that in the second gap portion are compared and it is determined that the gap portion of the larger half-width value is the edge on the core gap side (the gap portion of the smaller half-width value is the edge on the space gap side).

As another method, it is also possible to construct such that the roughness is evaluated on the basis of a general method of evaluating the fluctuation of a line segment, a gap locating on a line segment side in which the fluctuation is relatively large is determined as a core gap (a gap locating on the line segment side in which the fluctuation is relatively small is determined as a spacer gap).

It is also possible to construct such that a luminance profile is created at a different Y direction position, a contour line is created so as to connect portions having a predetermined brightness, and fluctuation of the contour line is evaluated. Further, vector data of the contour line can be also stored in the same format as that of design data of a semiconductor device such as GDS or OASIS format.

Figure 15:
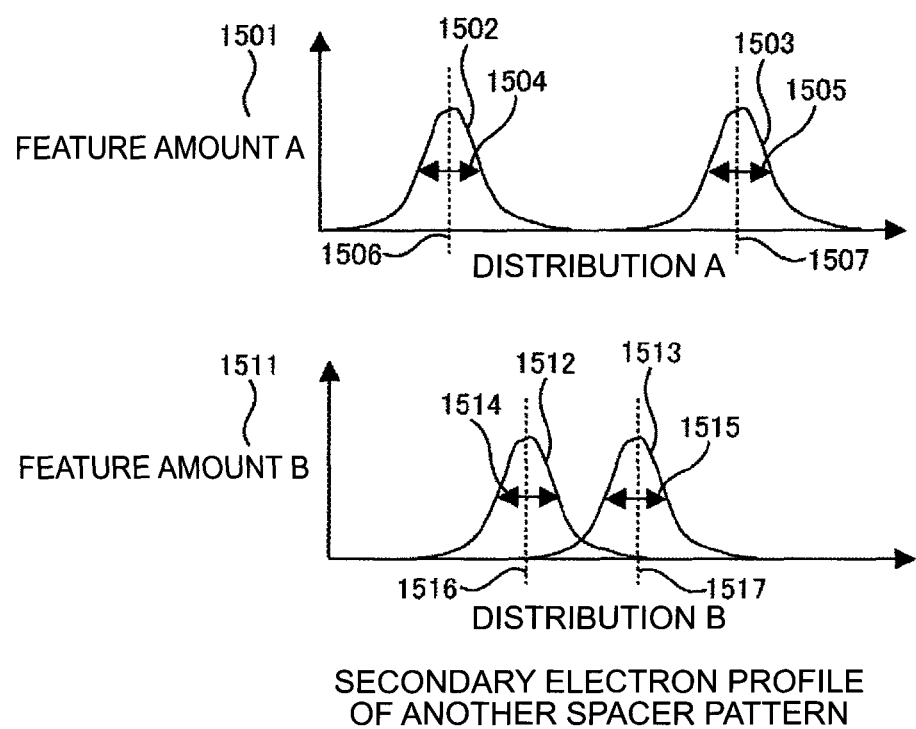
FIG. 15 is a diagram for illustrating a method of discriminating a kind of gap by using a plurality of feature amounts.

A plurality of features to distinguish the right and left patterns have been proposed above. The plurality of features can be solely used for discrimination or can be also used in combination. This is because if they are combined and used, there is an advantage that since a pattern forming process differs every customer, it is impossible to discriminate which feature amount is advantageous in order to recognize the right and left spacers. In FIG. 15, in order to describe a method at the time when a plurality of feature amounts are used for discrimination, first, two feature amounts A (1501) and B (1511) are considered. For example, as two feature amounts, there are a difference in the heights of the right and left edges in the secondary electron profile and a difference in the depths of the core gap and the spacer gap.

For explanation, it is now assumed that the feature amount A (1501) is the difference of the heights in the right and left edges and the feature amount B (1511) is the difference in the depths of the core gap and the spacer gap. In the feature amount A, distribution 1502 indicates distribution (average value 1506, dispersion 1504) of the edge height on the spacer gap side and distribution 1503 indicates distribution (average value 1507, dispersion 1505) of the edge height on the core gap side. Similarly, in the feature amount B, distribution 1513 indicates distribution (average value 1517, dispersion 1515) of the depth of the spacer gap and distribution 1512 indicates distribution (average value 1516, dispersion 1514) of the depth of the core gap. To classify by using the feature amounts, the discrimination in the case where the two distribution are away from each other is more certain and it is better that the variation is narrower. It is now assumed that the distance is equal to a value acquired by subtracting the average value 1506 from the average value 1507 of each distribution. When the feature amount A and the feature amount B are compared, it is determined that although the variations are equal, the feature amount A in which the distance is large is better.

Also in the case of using two or more feature amounts, fundamentally the same description is applied. When the pattern is registered, each feature amount is stored as numeral data and can be also used when the pattern detection is executed.

Figure 16:
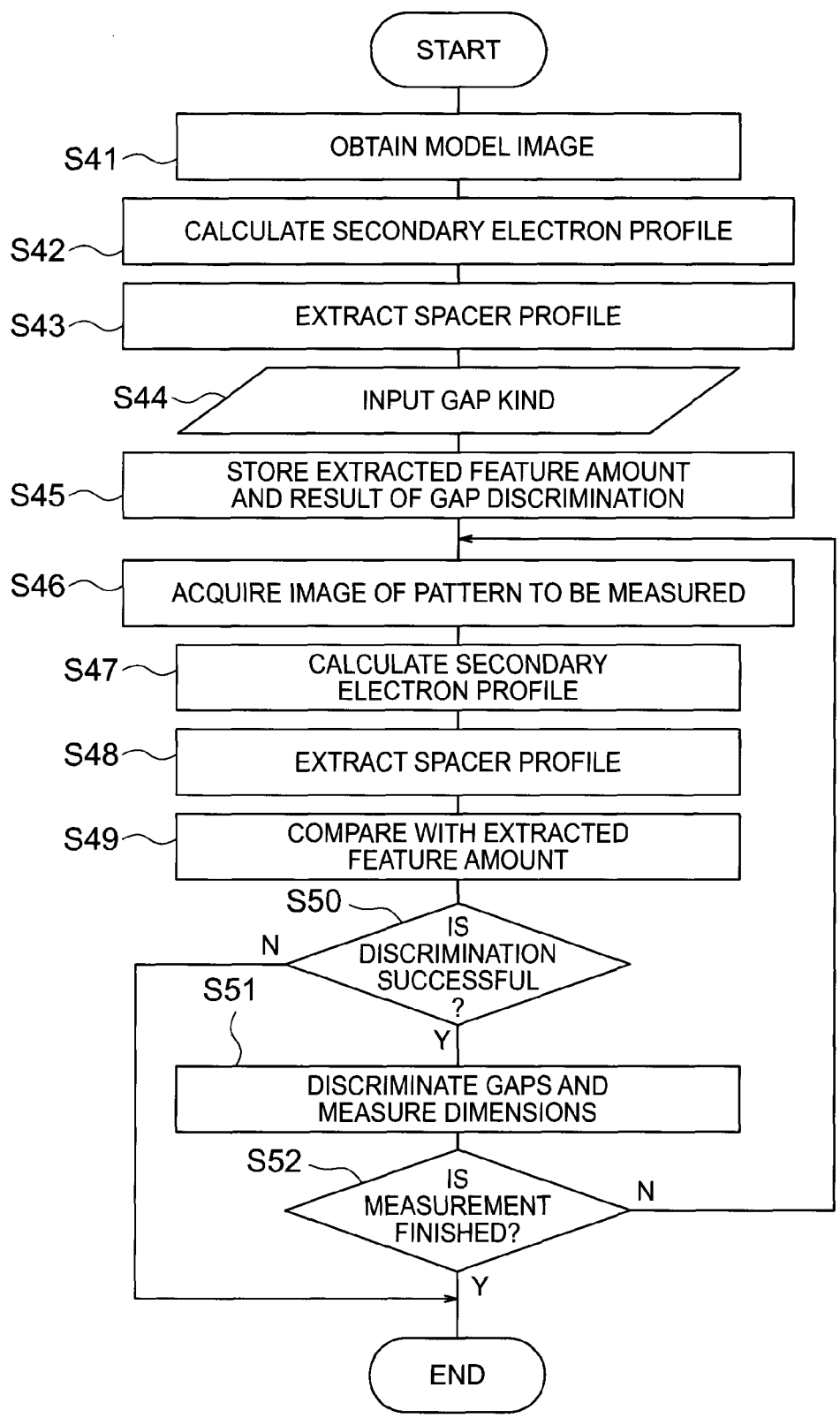
FIG. 16 is a flowchart for representing the gap discriminating steps using a model pattern.

FIG. 16 represents a flow for a sequence in which the sequence of the embodiment of FIG. 9 is replaced to the present embodiment. Although the example in which the gap discrimination is performed by the template matching has been shown in the embodiment of FIG. 9, in the present embodiment, feature amounts extracted from a model image are compared and the gap discrimination is performed (S45). In a manner similar to the sequence of FIG. 9, other processes are executed as follows. That is, the model image is acquired (S41). A secondary electron profile is calculated from the image (S42). A spacer profile is extracted (S43). A kind of gap is inputted by the operator (S44). A discrimination result by the comparison of the feature amounts is stored. After that, an image of a pattern which is actually measured is obtained (S46). A secondary electron profile is calculated (S47) in a manner similar to the model image. A spacer profile is extracted (S48) and compared with the stored feature amounts (S49). If the gap discrimination (S50) is successful, the dimension measurement is individually performed every gap kind (S51). If there are any other measuring points, an image of a pattern which is newly measured is obtained. A sequence of S46 to S51 is repeated for the number of measuring points (S52).

Embodiment 3

Figure 17:
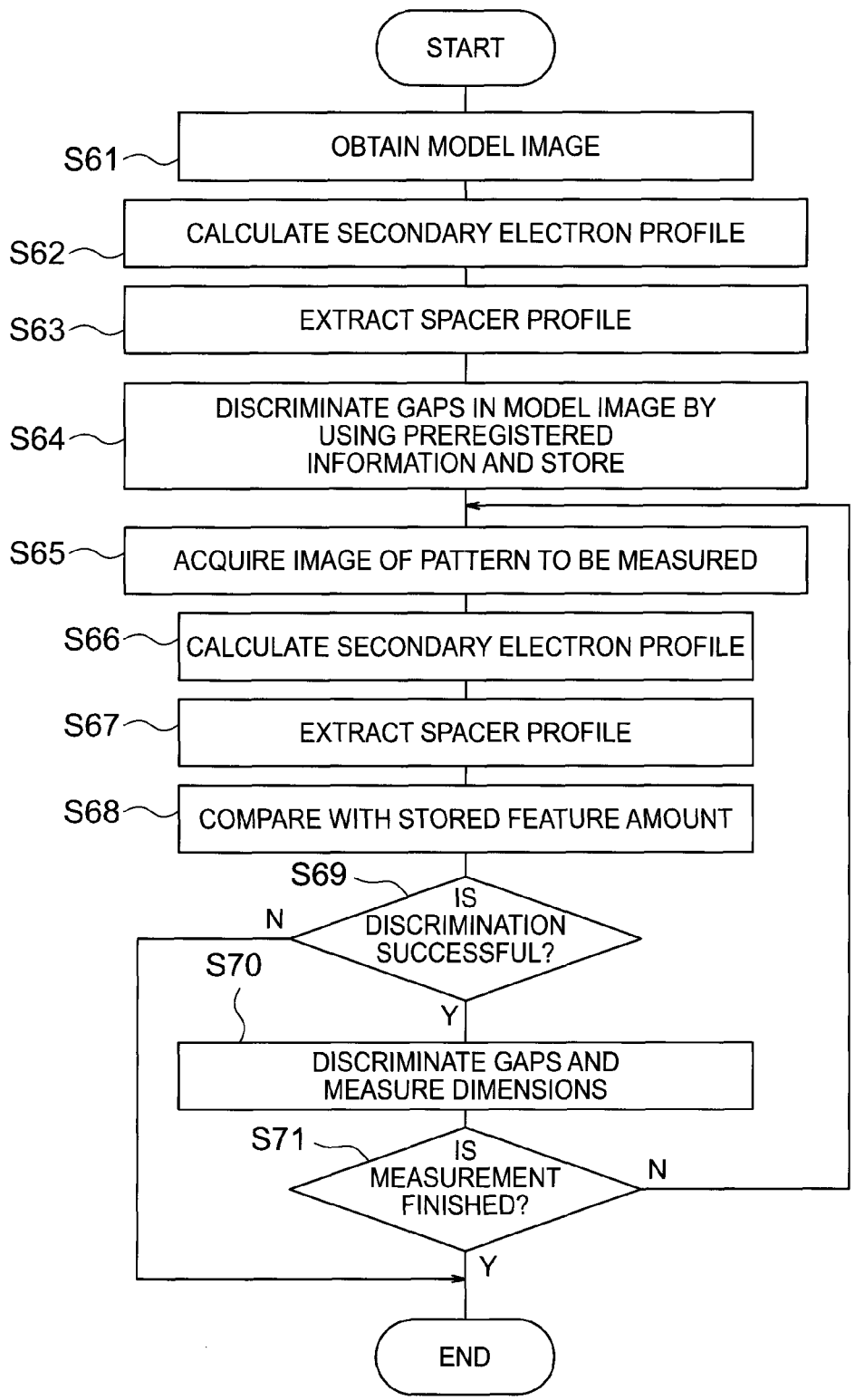
FIG. 17 is a flowchart for representing steps of forming a model pattern on the same sample as that of a pattern of discrimination target and performing gap discrimination by using feature amounts which are acquired from a profile of the model pattern.

A method of automatically obtaining the model image every measurement target wafer in FIG. 9 will be described by using FIG. 17.

In the embodiment of FIG. 9, two kinds of gaps are discriminated by the operator and the gap discrimination of the measured pattern is performed on the basis of the result of the discrimination. On the other hand, in a new embodiment, a pattern portion where the gap discrimination can be certainly performed is preliminarily registered as a model pattern, and at the time of measurement, a model image for the gap discrimination is obtained by using the registered model pattern.

Figure 18:
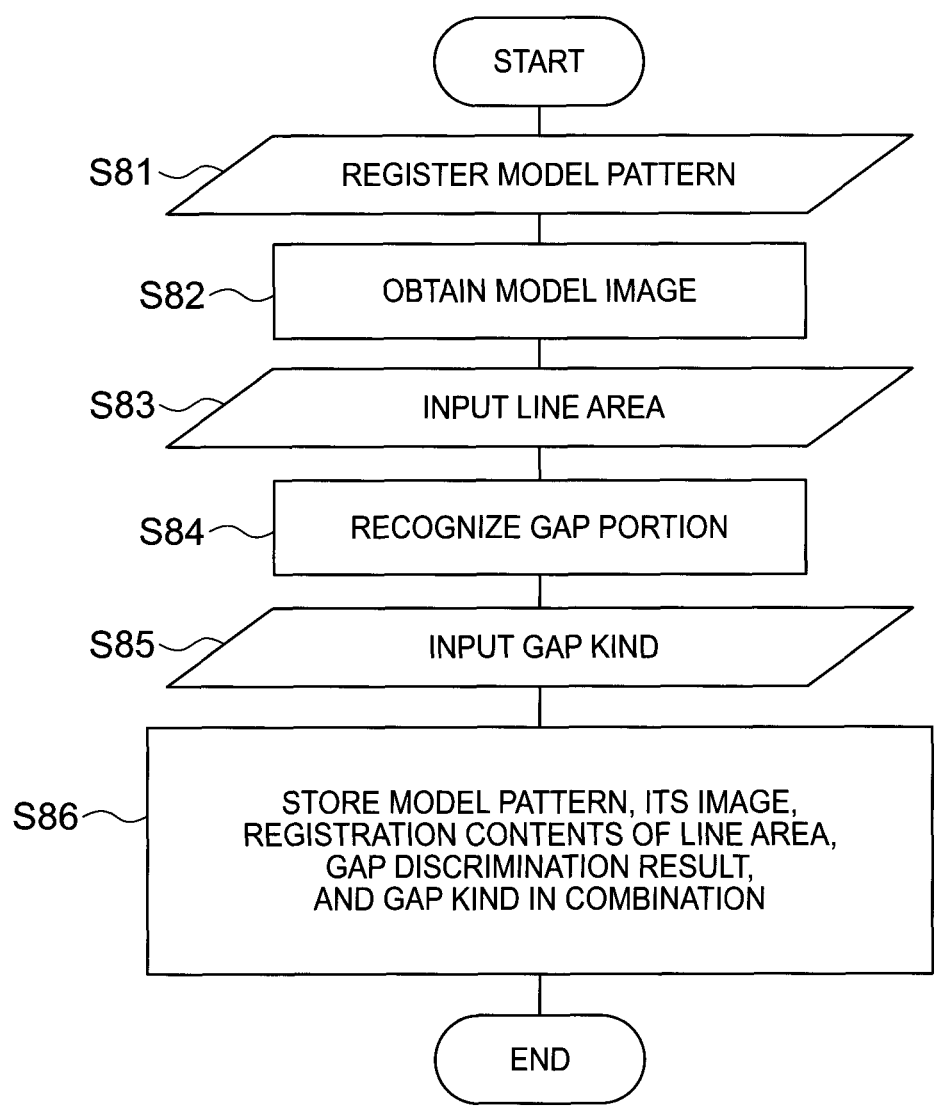
FIG. 18 is a flowchart for representing registering steps of the model pattern.
Figure 19:
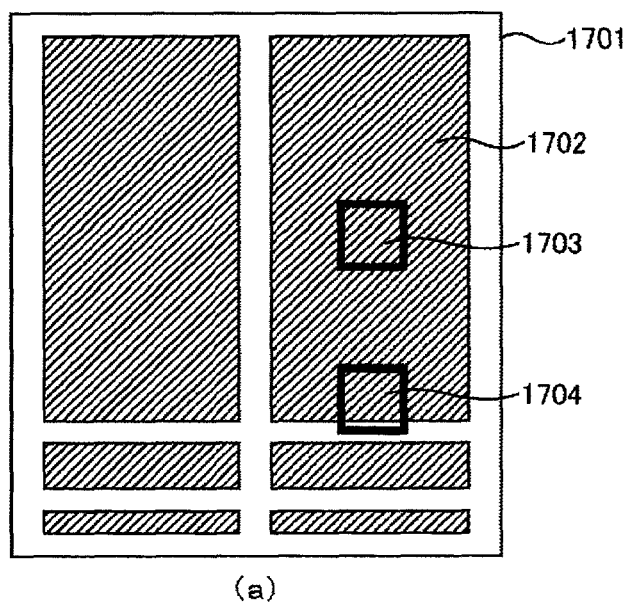
FIG. 19 is an explanatory diagram of an example of a layout of a semiconductor chip and the model pattern.
Figure 19:
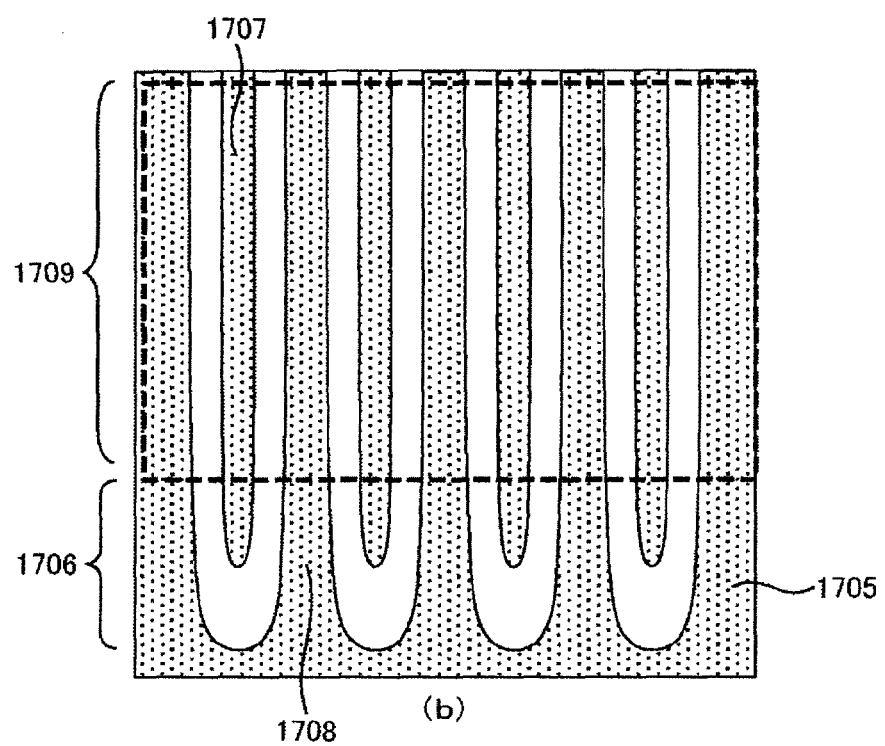

At the time of measurement, on the basis of information which has previously been registered, an image of the model pattern is obtained as a model image by the pattern on the same wafer as that of the measurement target pattern (S61). A secondary electron profile is calculated (S62) and a spacer profile is extracted (S63). A gap discrimination (S64) of the model image is automatically performed. After that, an image of a pattern which is measured is acquired (S65). In the measured pattern image, a secondary electron profile is calculated (S66) and a spacer profile is extracted (S67). After that, a pattern discrimination (S68) of the measurement target image is performed by using a feature of the profile of the model image. If the gap discrimination (S69) is successful, the dimension measurement is individually performed every gap kind (S70) on the basis of a discrimination result. If there are any other measuring points, an image of a pattern which is newly measured is acquired (S65). The sequence of S66 to S70 is repeated for the number of measuring points (S71). The flow represented in FIG. 18 is a procedure for registering the model pattern. First, when a measuring recipe (file in which a procedure for the automatic measurement has been recorded as a task list of the apparatus) is formed, a layout portion where the gap kinds can be certainly discriminated near the measurement target pattern is registered as a model pattern (S81). Subsequently, an electron microscope image of the designated model pattern is taken as a model image under the same conditions as those upon measurement (S82). An example of the model pattern is shown in FIG. 19. FIG. 19, (a) is an example of a layout of a chip 1701 which is formed on the semiconductor wafer. A hatched portion is a portion where pattern density is relatively high. Particularly, a portion where a fine repetitive pattern serving as the target of the invention is formed such as a memory portion or the like is called a cell portion 1702. A center 1703 of the cell portion is a portion where it is difficult to discriminate whether a gap portion of an adjacent mask pattern is a core gap or a spacer gap.

On the other hand, as shown in FIG. 19, (b), in the case of the SADP process, in an edge portion 1704 of the cell portion, a core gap portion 1707 is surrounded by the mask pattern and is closed and the discrimination of the core gap portion 1707 and a spacer gap portion 1708 can be easily and certainly performed.

According to the pattern discriminating method in the embodiment, a portion where the pattern discrimination can be certainly performed such as the cell edge portion 1704 is registered as the model pattern, and an image of the model pattern is registered as the model image. FIG. 19, (b) is an example of an electron microscope image 1705 of the model pattern portion.

Subsequently, to this model image, a portion having the same structure as that of the pattern which is actually measured, that is, in the case of the embodiment, a line pattern portion 1709 surrounded by a broken line in FIG. 19, (b) is registered (S83). Subsequently, in the image of the selected line pattern portion, the gap portion is recognized by using image feature amounts (S84). A recognition result of the gap portion is displayed onto the model image and the operator is allowed to register the gap kind of the displayed gap portion by using a GUI (S85).

Finally, these registered information, that is, the model pattern and its model image, the line area, the gap discrimination result, and the gap kind are stored into the measuring recipe in a lump (S86). It is sufficient that the model pattern registration is executed only once to the wafer measurement of the same kind and steps. The image obtainment in the model pattern which is used in the pattern discrimination according to the embodiment can be used for positioning of the measuring position. If it is used together with the image for positioning, it can be realized without deteriorating the throughput.

By the above processes, the line pattern portion of the model image which is stored together with the measuring recipe is equivalent to the model image in the embodiment of FIG. 9. Therefore, at the time of measurement, prior to acquiring the image of the measurement target pattern (S65), the image of the model pattern is acquired near the image (S61). The kind of spacer in the model pattern image is discriminated by using the information which has previously been recorded into the recipe (S64). In the model pattern which has previously been registered, since the kind of spacer can be certainly discriminated by its layout, the kind of pattern included in the line pattern portion 1709 in the model image can be also certainly discriminated. Particularly, since information which is useful to discriminate the spacer kind is included in a portion 1706 other than the line pattern portion in the model image, if the matching using the portion 1706 other than the line pattern which has previously been designated is performed, the discrimination of the spacer kind can be easily realized. Since the line pattern portion 1709 of the model image acquired in this manner is equivalent to the measured image in which the spacer kind has been determined, by executing steps S62 to S71 in FIG. 17 by using the image of this portion as the model image, the kind of measurement target pattern can be certainly discriminated. Although the image of the line portion which is used in the embodiment is the image of a portion different from the measurement target pattern, since it is a pattern which is formed so as to have the same design layout, that is, the same shape as that of the measurement target portion, a difference between them hardly exerts an influence on the result.

Figure 20:
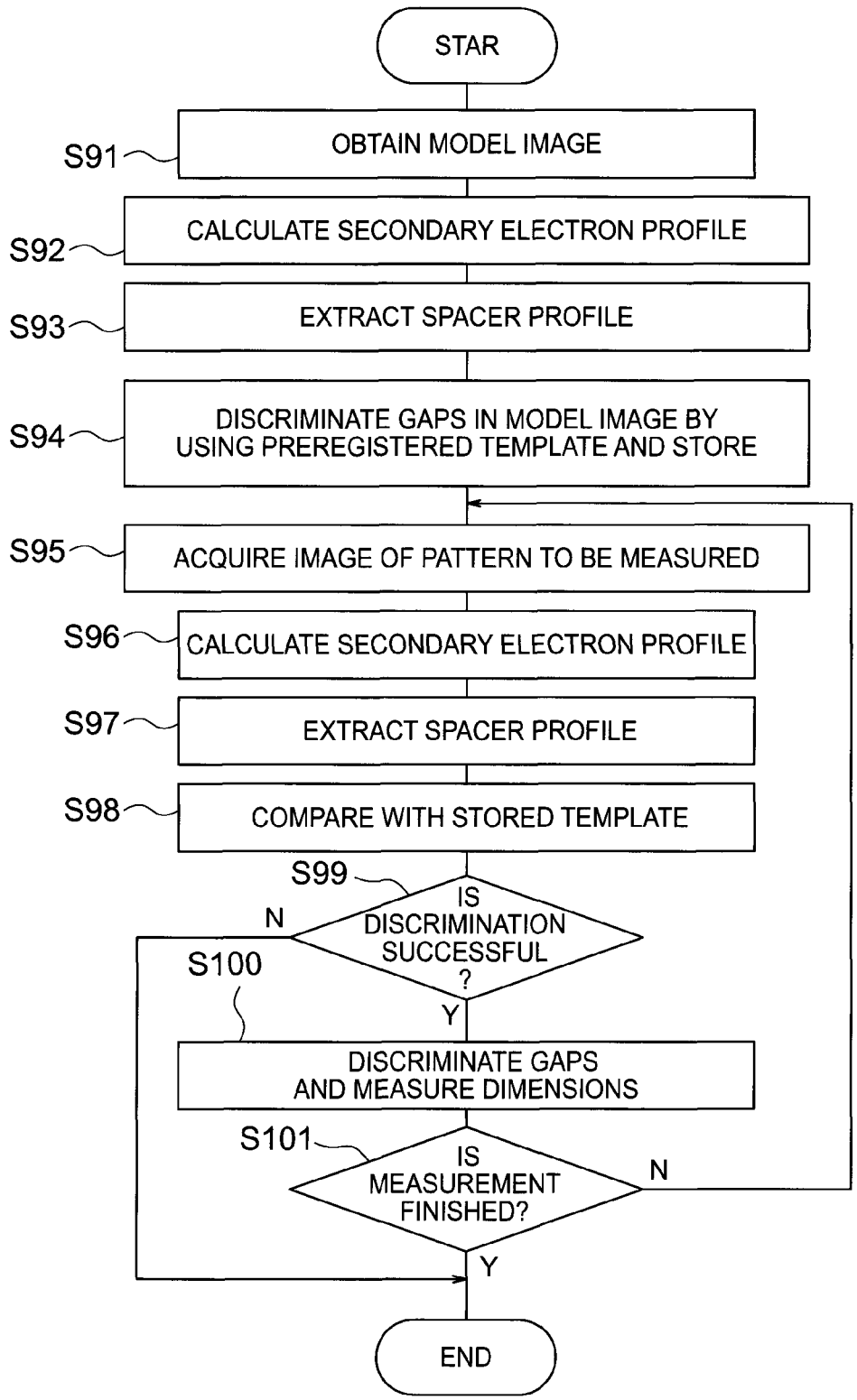
FIG. 20 is a flowchart for representing steps of forming a model pattern on the same sample as that of a pattern of discrimination target and performing gap discrimination by using a profile comparison of profiles of the model pattern and the discrimination target pattern.

According to the embodiment, in the case of performing the gap discrimination by the pattern on the same sample, since appearance states of the patterns of the model image and the measurement image are almost equal, there is an advantage that the high precision discrimination can be performed. Although the example in which the registration of the model pattern and the recognition of the gap portion are performed by the operator has been shown in the embodiment of FIG. 18, naturally, this procedure can be also performed by evaluating uniqueness or the like of the layout. For example, in the case of forming the measuring recipe using the design data, the model pattern is registered on the design data and prior to obtaining the model image, the line area 1709 in FIG. 19, (b) and the areas 1706 other than the line area are previously registered on the design data. At the time of measurement, the image is obtained in the registered model pattern, the line area 1709 and the other areas 1706 are automatically set on the basis of the registered information, and after that, the measurement is performed in accordance with FIG. 17. Thus, a time which is required to form the recipe can be shortened and the operation which is executed by the operator at the time of measurement can be reduced. Although the gap discrimination using the feature amounts has been described as an example in FIG. 17, the gaps can be also discriminated by comparing the image or profile stored in FIG. 18 with a template. A flow is represented in FIG. 20.

On the basis of the information which has previously been registered, an image of the model pattern is obtained as a model image by the pattern on the same wafer as that of the measurement target pattern (S91). A secondary electron profile is calculated (S92) and a spacer profile is extracted (S93). A gap discrimination (S94) of the model image is automatically performed. After that, an image of a pattern which is measured is acquired (S95). In the measurement pattern image, a secondary electron profile is calculated (S96) and a spacer profile is extracted (S97). After that, a pattern discrimination (S98) of the measurement target image is performed by using a feature of the profile of the model image. If the gap discrimination (S99) is successful, the dimension measurement is individually performed every gap kind (S100) on the basis of the discrimination result. If there are any other measuring points, an image of a pattern which is newly measured is acquired (S95). The sequence of S66 to S70 is repeated for the number of measuring points (S101).

Embodiment 4

In the embodiment 3, the example is shown in which the cell center portion 1703 in FIG. 19 is set to a desired measuring pattern and the core gap 1707 and the spacer gap 1708 are discriminated by using the edge portion 1704 of the same cell. However, in the actual semiconductor pattern, the appearance states (difference of the shapes such as dimensions, line edge roughness, inclination angle of the pattern side wall, and the like) of the cell center portion 1703 and the cell edge portion 1704 are not always equal. Generally, in the location such as a cell portion 1702, although the appearance state of the pattern in the cell center portion 1703 is stable, a difference of the shape is liable to occur in the cell edge portion 1704. Therefore, as for the discrimination reference of the core gap and the spacer gap which were discriminated by using the cell edge portion 1704, the discrimination precision deteriorates and there is a case where an erroneous discrimination occurs at the time of discrimination of the gap kinds in the cell center portion 1703. When the difference in the shapes in the cell center portion 1703 and the cell edge portion 1704 is large, a case where the discrimination reference formed in the cell edge portion 1704 cannot be applied in the cell center portion 1703 can occur. On the other hand, in the new embodiment, by providing two stages of the image acquiring step which is used to distinguish the gap kinds, the erroneous discrimination is prevented. A flow is shown in FIG. 21.

Figure 21:
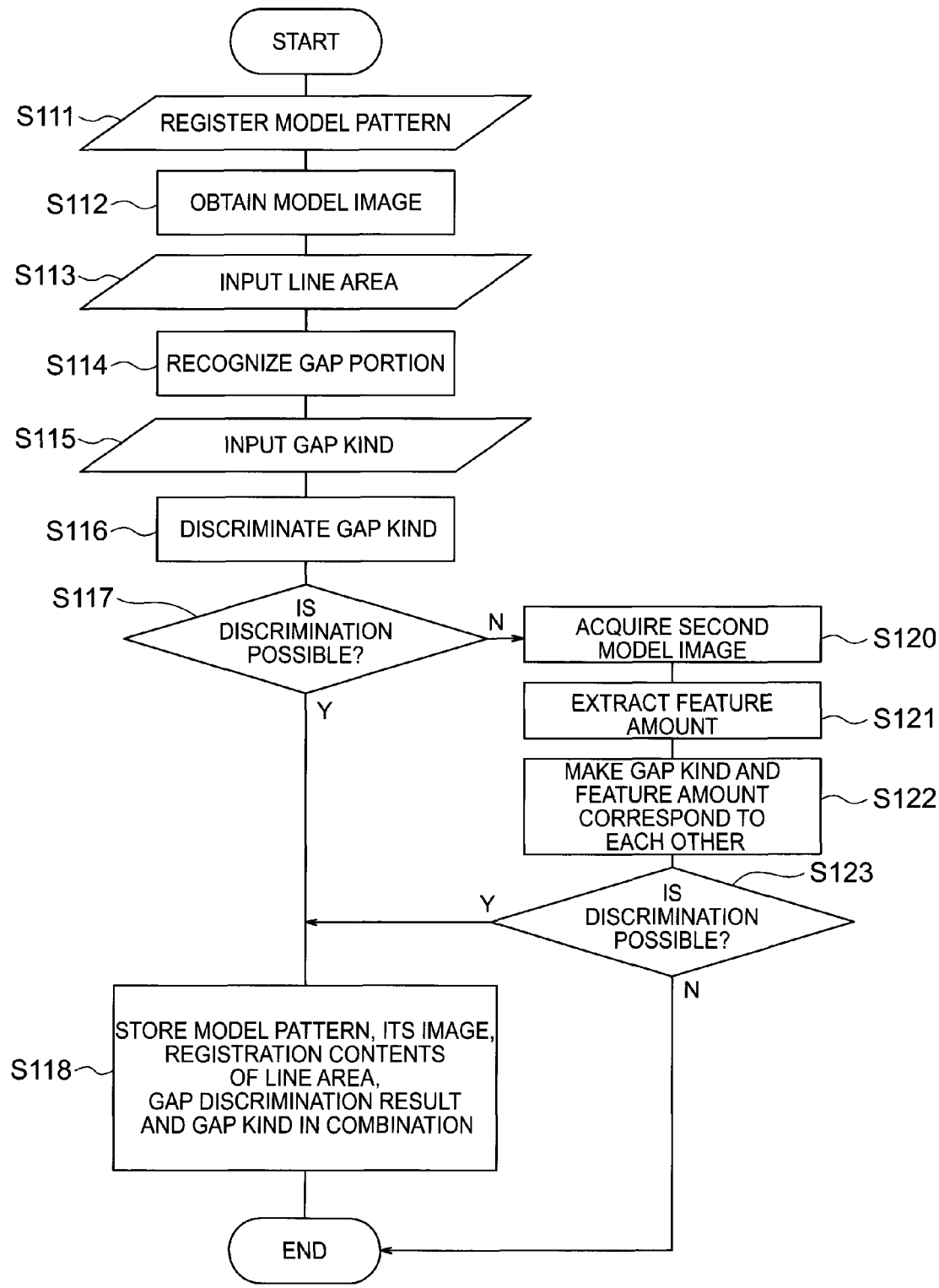
FIG. 21 is a flowchart for representing registering steps of two model patterns.

The flow represented in FIG. 21 is a flow in which an erroneous discrimination suppressing sequence (S120, S121), which will be described hereinafter, is added to the model pattern registering procedure represented in FIG. 18. First, a model pattern is registered (S111). A model image is acquired (S112). A line area is inputted (S113). A gap portion is recognized (S114). The operator inputs a gap kind (S115). A feature amount to discriminate the gap kinds is extracted and the gap kinds are discriminated (S116). However, if there is a variation in the shape of the line pattern 1709 shown in FIG. 19, (*b*) or there is hardly a difference between the shapes of the two kinds of gaps, and it is determined that the two kinds of gaps cannot be distinguished from the acquired feature amount (S117), an additional sequence (S120 to S122, which will be described hereinafter) is executed.

As an example of the recognizing method of the gap portion, if the matching using the portions 1706 other than the previously designated line pattern as illustrated in FIG. 19 is performed, the distinction of the gap kinds can be easily realized. When discriminating whether or not the gaps can be distinguished, by expressing a degree of coincidence with the template as a numerical value and providing a threshold value for the value, it is possible to determine that a case where the coincidence degree is equal to or less than the threshold value indicates that the distinction is difficult. Subsequently, an acquisition of a second model image (S120) will be described by using FIG. 22. The model image (S112) which is acquired in FIG. 21 is called a first model image hereinbelow.

Figure 22:
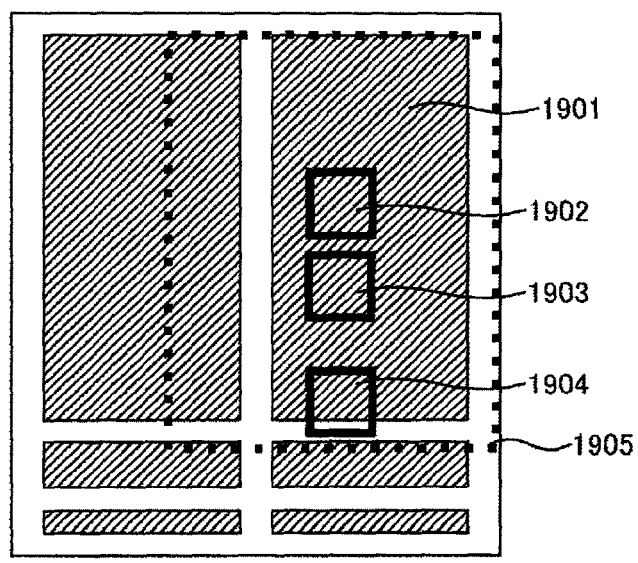
FIG. 22 is a diagram for illustrating a model pattern setting method in the case of performing the gap discrimination using two model patterns.
Figure 22:
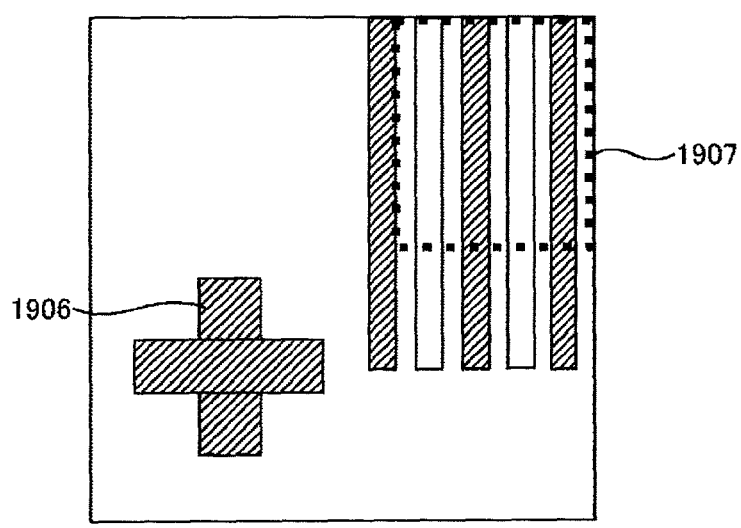

Reference numeral 1901 in FIG. 22, (*a*) denotes a cell portion in the chip formed on the semiconductor wafer. A second model image is a model image to perform the accurate discrimination of the gap kinds at the time of measurement and is an image taken under the same conditions as those at the time of measurement in the case where the operator designates a location 1903, which is closer to a measuring position 1902 than a first model image obtaining position 1904, and is moved by a deflection of an electron beam from both of those positions within a range 1905 where a distance can be accurately detected and in which the pattern of a shape which coincides with the shape of the measurement pattern. In this instance, in order to accurately detect the position, precision of the deviation of the field of view within one line is required. That is, the precision of the electron beam deflection which is required here lies within ½ pitch of the completed line pattern.

Since the first model image and the second model image have accurate position information which depends on the deflection precision of the electron beam, the core gap and the spacer gap which were discriminated in the first model image can be also distinguished in the second model image by their positions. Therefore, the gap portion is recognized by the first model image and the feature amount extraction for the discrimination of the gap kinds is performed in the second model image. In the line area in the second model image, the gap kinds are automatically discriminated from the result of the gap recognition performed in the first model image, and the feature amount to distinguish each gap is extracted (S121). The gap kinds and the feature amount are made to correspond to each other (S122). It is confirmed that the gap kinds can be discriminated by using the second model image (S123). The obtained gap recognition result and gap kind distinction result are stored into the measuring recipe (S118) and are used when executing a measuring sequence represented in FIG. 23. If it is difficult to extract the feature amount and distinguish the gaps in the second model image, the present sequence is finished.

Figure 23:
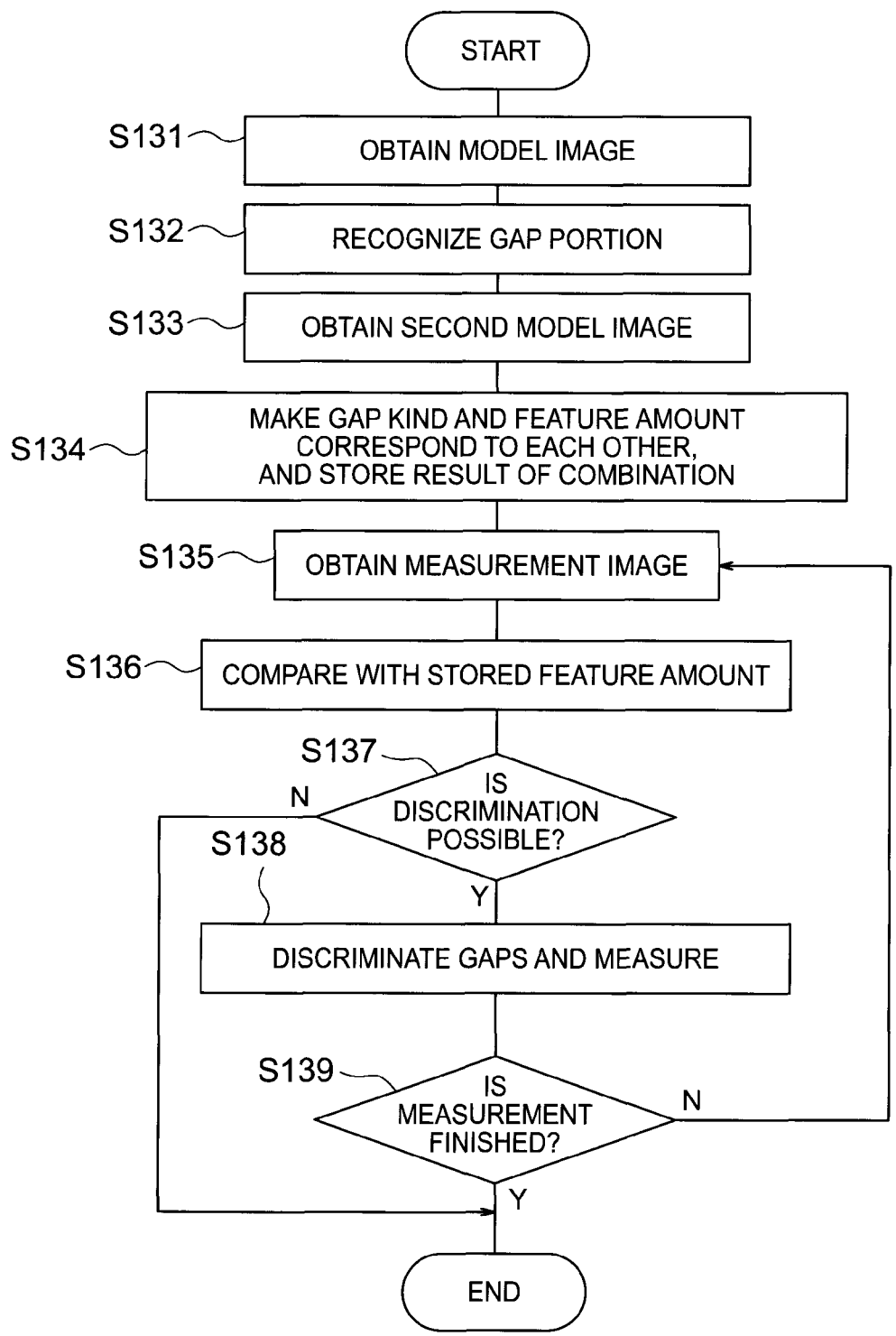
FIG. 23 is a flowchart for representing steps of performing the gap discrimination and pattern measurement by using the two model patterns which have previously been registered.

In the sequence of FIG. 23, an image is obtained by the first model which has previously been registered in FIG. 21 (S131). The gap kinds are discriminated (S132). An image of the second model is obtained (S133). A feature amount is extracted and the gap kinds and the feature amount are made to correspond to each other (S134). A measuring image is acquired (S135) and compared with the stored feature amounts (S136). The gap discrimination is performed (S137). The measurement is separately performed for every kind in accordance with a discrimination result (S138). A sequence of S135 to S138 is repeated for the number of measuring points (S139). Although the gap discrimination (S124) by the feature amount has been described as an example in FIG. 22, in a manner similar to FIG. 20, the correspondence (S134) between the gap kinds and the feature amount can be also replaced by a correspondence between the gap kinds and a result of the gap discrimination using the template matching.

In the case of a DP pattern other than the SADP, the kind of line pattern cannot be discriminated by the shape of the line edge portion. In such a case, by using a peripheral pattern, the line pattern can be discriminated in a manner similar to the third embodiment. In this case, as a condition of the first image, it is necessary that the image has certainly been taken on the outermost line in the cell or that at which position on the pattern the image was taken can be guaranteed. For example, as shown in FIG. 22, (*b*), the first model image is acquired so that a cell edge portion (1907 surrounded by a broken line) enters. A kind of line pattern of the cell edge portion 1907 can be easily confirmed from design data of this portion, and the line pattern kind can be inputted by the operator in accordance with the sequence of FIG. 21 (S95). A characteristic pattern 1906 other than the line pattern is taken in the same field of view by presuming a case where the appearance state of the line edge portion is inferior and there is a possibility that the line is extinguished or the like, so that a positional precision is further raised. The design data may be used for the gap discrimination.

As for the foregoing gap discrimination, there is such a possibility that when the manufacturing process of the semiconductor becomes matured, a difference of the cross sectional shapes of the patterns decreases and it becomes difficult to discriminate. It is possible to cope with such a case by using the acquisition of the model images of two stages shown in the fourth embodiment. It is expected that the appearance states of the patterns of the second model image obtaining portion and the measurement target portion are almost equal as mentioned above. Therefore, even if the shapes are equal, when the dimensions differ, a difference between the dimensions of the core gap and the spacer gap is also almost equal between the two patterns. Therefore, if the dimensions of the core gap and the spacer gap are used as the feature amount of the image, the discrimination by the dimension difference can be performed in a manner similar to the discrimination by the cross sectional shapes in the second embodiment. If there are no differences between the shapes of the patterns and between the dimensions, the discrimination cannot be correctly performed. However, in this case, since a good state where the patterns are uniformly formed is obtained, it is sufficient to output a result indicating the fact.

Although all of the above embodiments have been described with respect to the discrimination of the mask shape of the SADP as an example, even after the final pattern edges in FIG. 2, (*j*), since the shapes of the pattern side walls of the core gap and the spacer gap change by the differences between the mask shapes in FIG. 2, (*h*), the pattern discrimination can be performed by a similar procedure. Even if the foregoing gap discriminating method is applied to another double patterning process, two sets of patterns can be similarly discriminated. Further, the measurement of the pattern dimensions and the process management and control based on the discrimination result can be realized.

Embodiment 5

In the foregoing embodiment, the method has been described whereby the patterns are discriminated by using a principle that since one end side and the other end side of the pattern formed by the SADP are formed by the different manufacturing processes, they show different tendencies on the profile. The present embodiment will be described with respect to an example in which information suitable for discrimination is applied by comparing a plurality of kinds of information between one end side and the other end side of the pattern. More specifically speaking, a plurality of kinds of information showing the state of one end side of the pattern and a plurality of kinds of information showing the state of the other end side are compared and the pattern kinds are discriminated by using information in which a sufficient difference enough to discriminate is recognized between one end side and the other end side. The kind of information of one end side and the other end side is not limited so long as it is such information as described so far that they can be compared by numerical values and a difference which is caused by a difference of the processes can be detected. The numeral information to compare one end side and the other end side is assumed to be "feature amount" and will be described hereinbelow.

Figure 24:
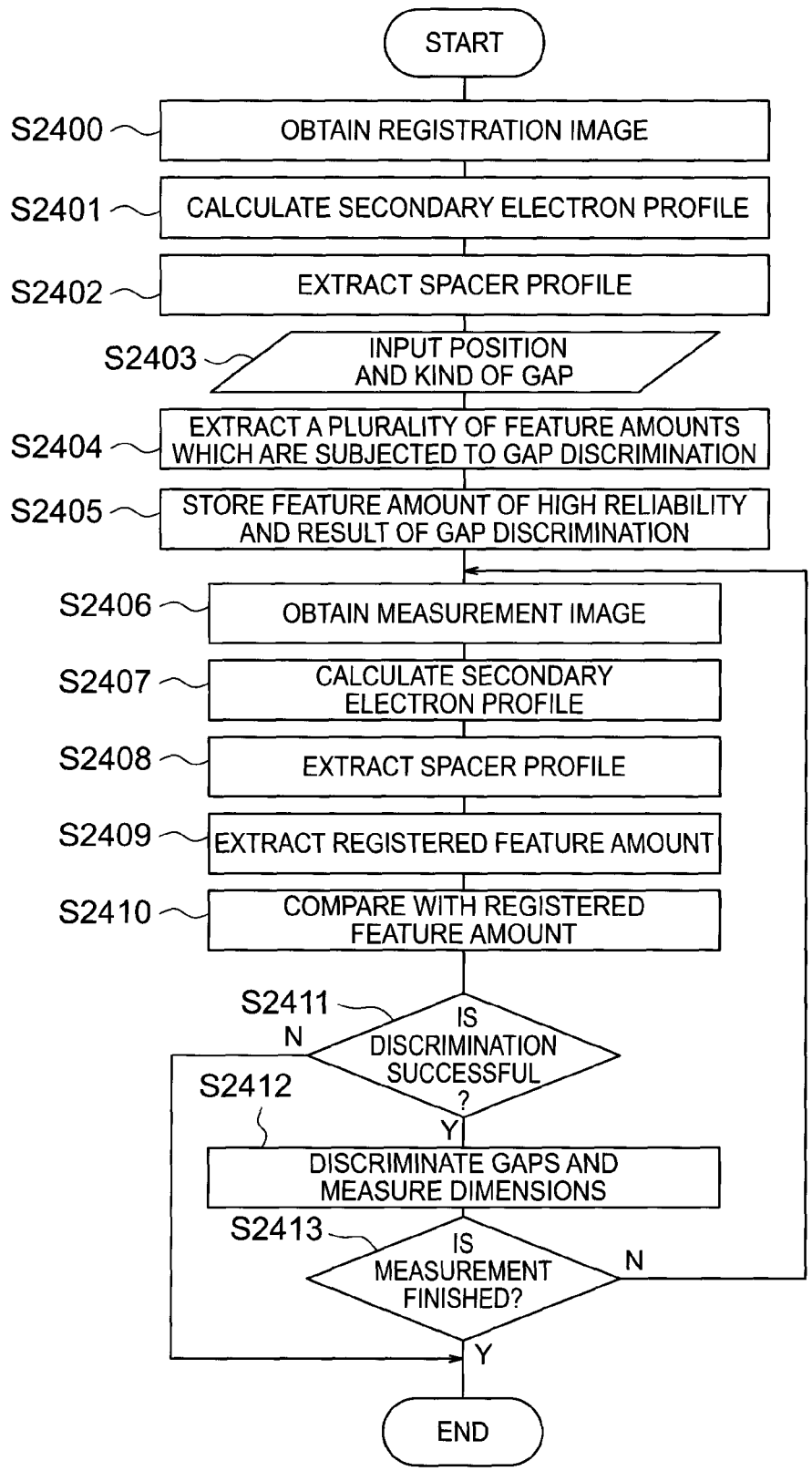
FIG. 24 is a flowchart representing a step of performing the gap discrimination by using a plurality of kinds of feature amounts.

A gap discriminating method by a combination of a plurality of feature amounts based on a signal acquired by scanning of the charged particle beam will be described hereinbelow with reference to the drawings. FIG. 24 represents a flowchart of the discriminating method.

First, the positions of the core gap and the spacer gap have already been known by the operation of the operator and an electron microscope image of a pattern having the same structure as that of the pattern which the operator wants to perform the discrimination is taken (S2400). A secondary electron profile is calculated from the image (S2401). A region where a value of the profile is equal to or larger than a predetermined threshold value is automatically recognized as a spacer and other portions are automatically recognized as gaps, and a spacer profile is extracted (S2402).

After that, in S2403, the operator is required to input which gap corresponds to the core gap or the spacer gap, and the kinds of gaps are determined. In S2404, a plurality of feature amounts by which the gaps in the spacer profile can be identified are extracted and, in each feature amount, two distributions are obtained by a difference between the core gap and the spacer gap. In S2405, the feature amount of the highest reliability is selected from the plurality of feature amounts and the kind and feature amount of the gap adjacent to the profile are registered.

A detection image is acquired in S2406. A secondary electron profile of the image is calculated (S2407). A region where a value of the profile is equal to or larger than a predetermined threshold value is automatically recognized as the spacer and other portions are automatically recognized as the gaps, and a spacer profile is extracted (S2408). In the calculated spacer profile, after the registered feature amount was extracted in S2409, the measurement target pattern is discriminated by using a feature of the registered feature amount (S2410). If the gap discrimination is successful (S2411), the dimensions are individually measured for every gap kind (S2412). If there are any other measuring points, an image at the next measuring point is acquired (S2406) and a sequence of S2407 to S2412 is repeated for the number of measuring points (S2413).

Figure 25:
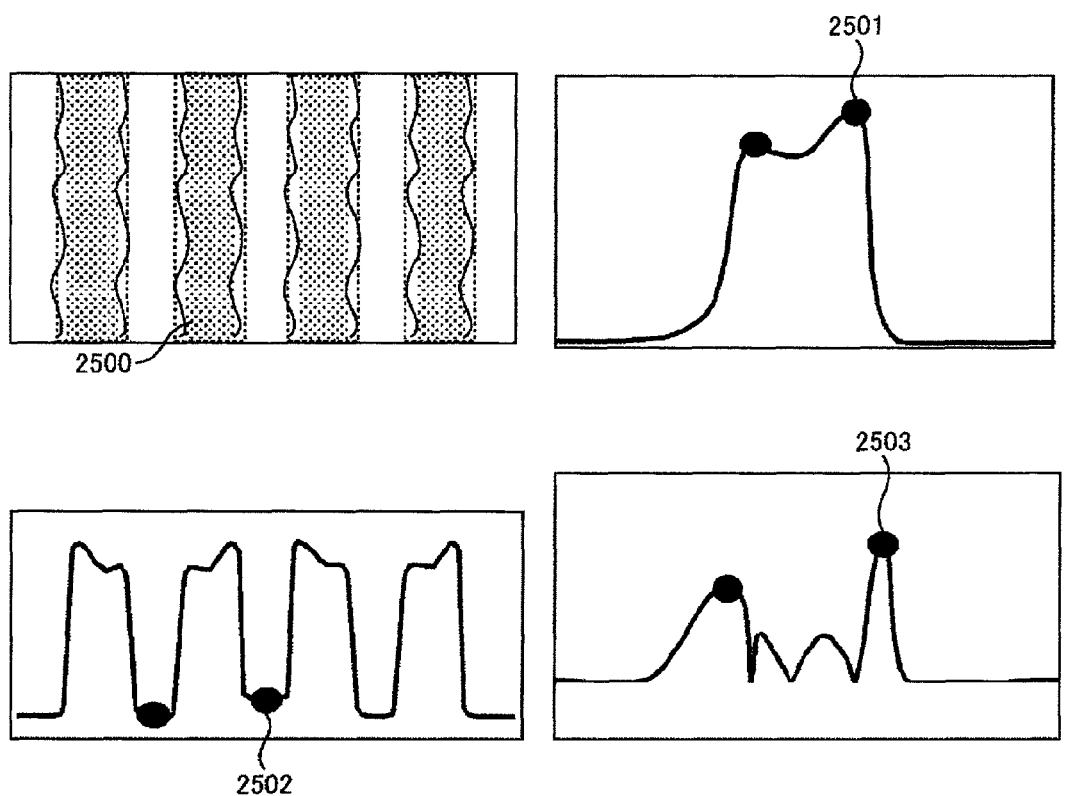
FIG. 25 is a diagram for illustrating similar forms of feature amounts on one end side and the other end side of a pattern.

FIG. 25 illustrates a method of selecting the feature amount of the highest reliability. For example, it is assumed that a feature amount A (difference between right and left edge roughnesses 2501), a feature amount B (difference between heights 2501 of the right and left edges), a feature amount C (difference between depths 2502 of the core gap and the spacer gap), and a feature amount D (difference between heights 2503 of the right and left edges of an absolute value profile of a differentiation profile of the secondary electron profile) were extracted from the secondary electron profile.

Figure 26:
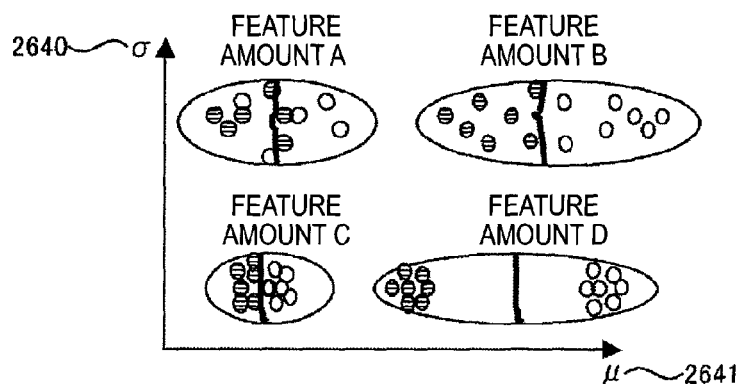
FIG. 26 is a diagram for illustrating distribution of a plurality of kinds of feature amounts.

FIG. 26 illustrates distributions of the extracted feature amount. In the feature amount A, distribution 2600 indicates the distribution (average value 2602, dispersion 2604) of the edge roughness on the spacer gap side and distribution 2601 indicates the distribution (average value 2603, dispersion 2605) of the edge roughness on the core gap side. It is assumed that a reference numeral 2606 denotes the distance between the two distributions. It is also assumed that the distance is a difference from the average value 2603 of each distribution to the average value 2602.

In the feature amount B, distribution 2610 indicates the distribution (average value 2612, dispersion 2614) of the edge height on the spacer gap side and distribution 2611 indicates the distribution (average value 2613, dispersion 2615) of the edge height on the core gap side. It is assumed that reference numeral 2616 denotes the distance between the two distributions. It is also assumed that the distance is equal to a value obtained by subtracting the average value 2612 from the average value 2613 of each distribution.

In the feature amount C, distribution 2620 indicates the distribution (average value 2622, dispersion 2624) of the depth on the spacer gap side and distribution 2621 indicates the distribution (average value 2623, dispersion 2625) of the depth of the core gap. It is assumed that a reference numeral 2626 denotes the distance between the two distributions. It is also assumed that the distance is equal to the difference from the average value 2623 of each distribution to the average value 2622.

In the feature amount C, distribution 2630 indicates the distribution (average value 2632, dispersion 2634) of the height of the edge of the differentiation profile on the spacer gap side and distribution 2631 indicates the distribution (average value 2633, dispersion 2635) of the height of the edge of the differentiation profile on the core gap side. It is assumed that a reference numeral 2636 denotes the distance between the two distributions. It is also assumed that the distance is equal to the difference from the average value 2633 of each distribution to the average value 2632.

The foregoing four feature amounts are classified as follows on the assumption that an axis of ordinate indicates a standard deviation value (2640) and an axis of abscissa denotes the distance (2641) between the two distributions. (1) In the feature amount A, in the distributions 2600 and 2601, the standard deviation value is large, the distance 2606 is small, and the region of an overlap portion 2607 of the distribution is large. However, the overlap region is a region where the gaps cannot be discriminated. (2) In the feature amount B, in the distributions 2610 and 2611, the standard deviation value is large, the distance 2616 is small, and the region of an overlap portion (2617) of the distribution is small. (3) In the feature amount C, in the distributions 2620 and 2621, the standard deviation value is small, the distance 2626 is also small, and the region of an overlap portion (2627) of the distribution is small. (4) In the feature amount D, in the distributions 2630 and 2631, the standard deviation value is small, the distance 2636 is large, and there is no overlap region of the distribution.

As mentioned above, the distance between the distribution and the standard deviation value are important conditions in the case of deciding the reliability of the feature amount. A separation degree is defined here as a scale indicating the goodness of the separation of the two distributions in the feature amount.

Separation degree=(Average_1−Average_2)/(σ1+σ2)

where,

Average_1: Average value of the feature amount on the core gap side

Average_2: Average value of the feature amount on the spacer gap side

σ1: Standard deviation value of the feature amount on the core gap side

σ2: Standard deviation value of the feature amount on the spacer gap side

Figure 27:
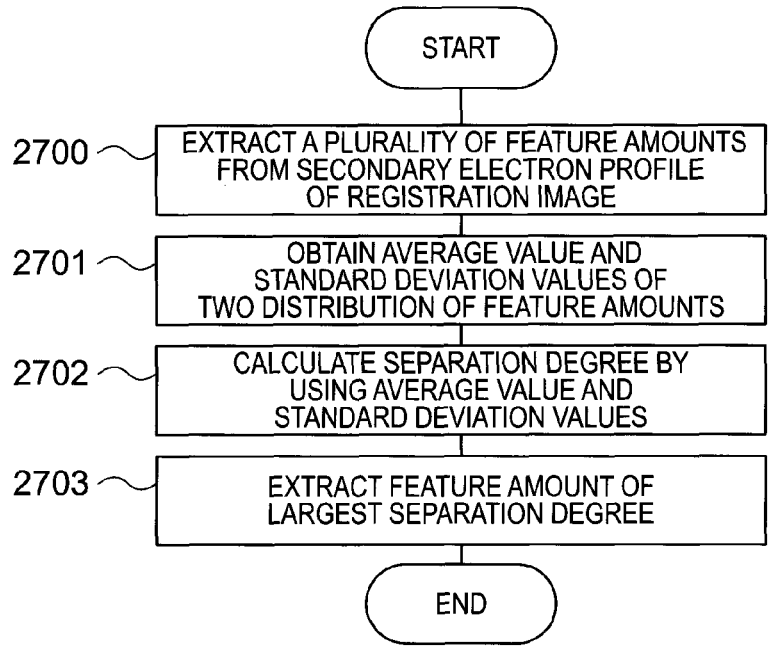
FIG. 27 is a flowchart for representing steps of selecting the feature amount in which a separation degree is largest.

A selecting procedure of the feature amount of the highest reliability is represented in FIG. 27. In 2700, the feature amount is extracted from the secondary electron profile of the image. In 2701, the average values and the standard deviation values of the two distributions of the feature amount are obtained. In 2702, a separation degree of the feature amount is obtained by using the foregoing equation to obtain the separation degree. After that, in 2703, the feature amount of the high separation degree is selected and set to the feature amount to discriminate the gaps.

As mentioned above, the pattern registration is performed by using a plurality of feature amounts and the separation degree of the feature amount is calculated by using the distance between the distribution and the standard deviation of each feature amount, so that the feature amount of the highest reliability can be defined. The defined feature amount of the highest reliability is stored as numeral data and, when the pattern is detected, by performing the pattern detection by using the registered feature amount, the processing time can be reduced without requiring all feature amounts.

Besides the method of selecting the feature amount of the largest separation degree, the selection of the feature amount of the high separation degree can be also accomplished by selecting the feature amount of a separation degree larger than a predetermined value. By providing the step of selecting the feature amount which satisfies the predetermined condition as mentioned above, even in the case of a fine pattern in which difference in the feature amount is difficult to appear, the pattern kinds can be effectively discriminated.

Although a value obtained by dividing the distance between the two distributions by the standard deviation value of the feature amount of each distribution is defined as the separation degree in the above example, the invention is not limited to it. For example, the distance can be multiplied or divided by a coefficient which is determined in accordance with the standard deviation value or the size of distribution. In the case where the feature amount is distributed in a relatively narrow range, the separation degree may be obtained only by the distance between the distribution. Further, if the standard deviation is close to zero, one distance between the feature amounts may be used as a separation degree without deriving the separation degree. If such information that a difference between one end side and the other end side of the pattern appears clearly can be obtained as mentioned above, the method thereof is not limited.

However, since there is often a variation in the feature amount which is acquired, it can be said that the method of dividing the distance between the two distributions by the standard deviation of the feature amount of each distribution is an extremely effective method. The larger the number of kinds of feature amounts which can become selection items is, the more the certainty of the discrimination of the separation degree increases. However, it is also possible to provide at least two kinds of feature amounts and separately use them in accordance with the situation.

Embodiment 6

Figure 28:
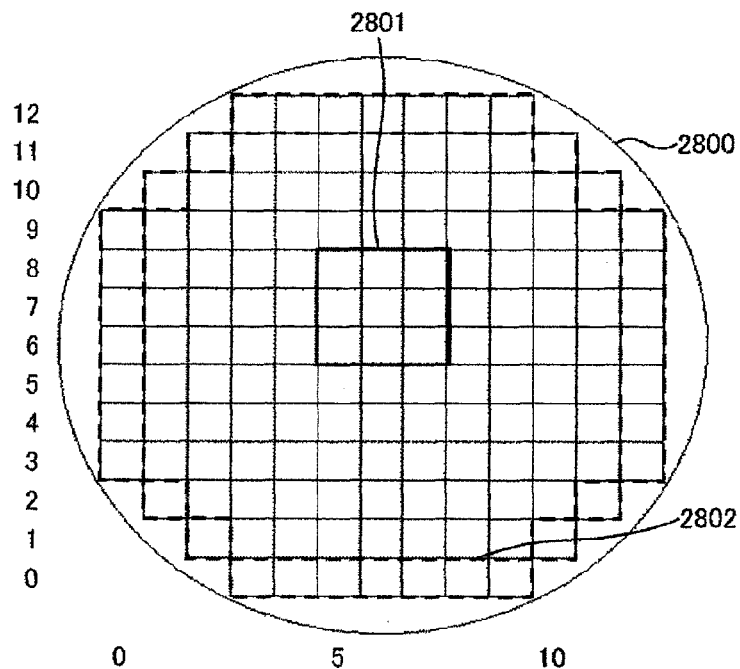
FIG. 28 is a diagram for illustrating an example in which an appearing state of the feature amount differs every different position on a wafer.
Figure 29:
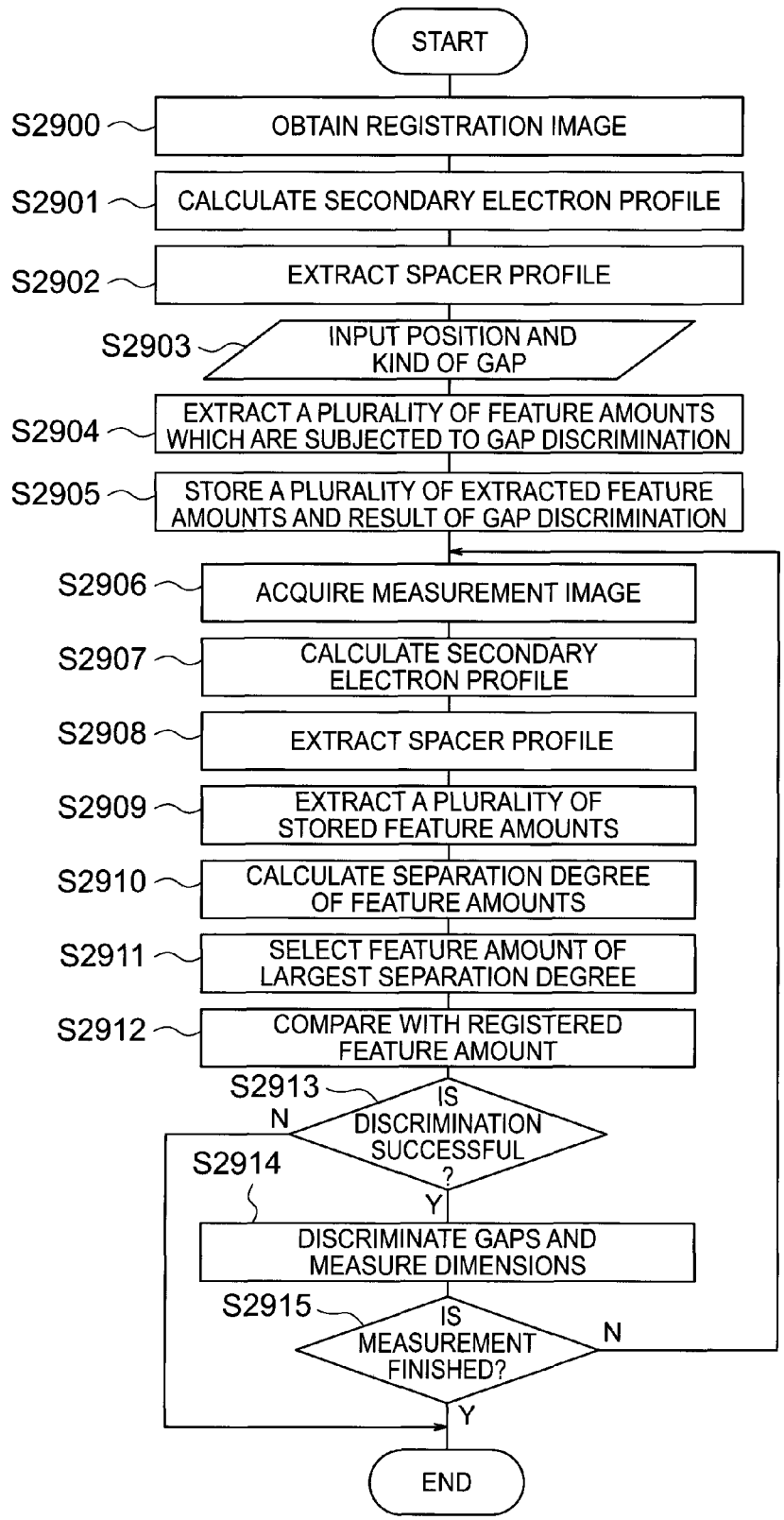
FIG. 29 is a flowchart for representing steps of selecting the proper kinds of feature amounts from a plurality of kinds of feature amounts and performing the gap discrimination.

In the foregoing embodiment, the two kinds of gaps are discriminated by the operator, on the basis of a discrimination result, the feature amount of the highest reliability is registered as a feature amount to discriminate the gaps from the plurality of feature amounts, and the gap discrimination of the measurement pattern is performed. However, in the actual semiconductor wafer, as shown in FIG. 28, in chips 2801 in the center portion of a wafer (2800) and chips 2802 in the edge portion, appearance states (difference of the shapes such as line edge roughness, inclination angle of the pattern side wall, and the like) of the semiconductor wafer are not always equal. That is, the appearance states of the feature amounts in the patterns in the center portion 2801 and the edge portion 2802 differ. Therefore, if the discrimination of the core gap and the spacer gap of the wafer edge portion 2802 is performed by using the feature amounts which are used at the time of discrimination of the core gap and the spacer gap in the wafer center portion 2801, there is a case where the discrimination precision deteriorates and the erroneous discrimination occurs at the time of the gap discrimination in the wafer edge portion 2802. On the contrary, in the new embodiment, at the time of pattern detection, a plurality of feature amounts which are used to distinguish the gap kinds are simultaneously detected and the gap discrimination is performed by using the feature amount of the highest reliability from the plurality of feature amounts, thereby eliminating the erroneous discrimination. A flow for a sequence is represented in FIG. 29.

First, a registration image is required (S2900). A secondary electron profile is calculated from the image (S2901). A spacer profile is extracted (S2902). A kind of gap is inputted by the operator (S2903). A plurality of feature amounts by which the gap can be discriminated are extracted from the profile (S2904). The plurality of feature amounts and the discrimination result of the gap are stored (S2905). After that, an image which is actually measured is acquired (S2906). In a manner similar to the measurement image, a secondary electron profile is calculated (S2907), a spacer profile is extracted (S2908), and the plurality of feature amounts stored at the time of registration are extracted (S2909). A separation degree of each feature amount is calculated (S2910). After that, the feature amount of the largest separation degree is selected (S2911) and is compared with the feature amounts stored at the time of registration (S2912). If the gap discrimination (S2913) is successful, the dimension measurement is individually performed for every gap kind on the basis of the discrimination result (S2914). If there are any other measuring points, an image of the pattern which is subsequently measured is acquired. A sequence of S2906 to S2914 is repeated for the number of measuring points (S2915).

In the chip of the registered pattern, appearance states of the feature amounts differ depending on a layout position on the wafer. At the time of the pattern detection, by automatically selecting the feature amount to identify the gap of the high reliability from the plurality of feature amounts at the different chip positions, even if the pattern detection failed in a discrimination by a certain feature amount, the pattern detection is enabled in the discrimination by another feature amount.

By performing the discrimination using the proper feature amount every sample position as mentioned above, the accurate discrimination which does not depend on the sample position can be performed.

Embodiment 7

In the discrimination of the core gap and the spacer gap in the SADP mentioned above, a plurality of feature amounts which can discriminate the gaps are extracted from the secondary electron profile of the measurement target image, the feature amount of the highest reliability is selected from the plurality of feature amounts at the time of registration or detection, and the gap discrimination is performed. In the plurality of feature amounts extracted from the profile, in order to represent the integrated shape of the measurement target pattern, a pattern detection score is calculated by using those feature amounts, and whether the registration by the score value is successful or has failed can be integratedly discriminated.

Figure 30:
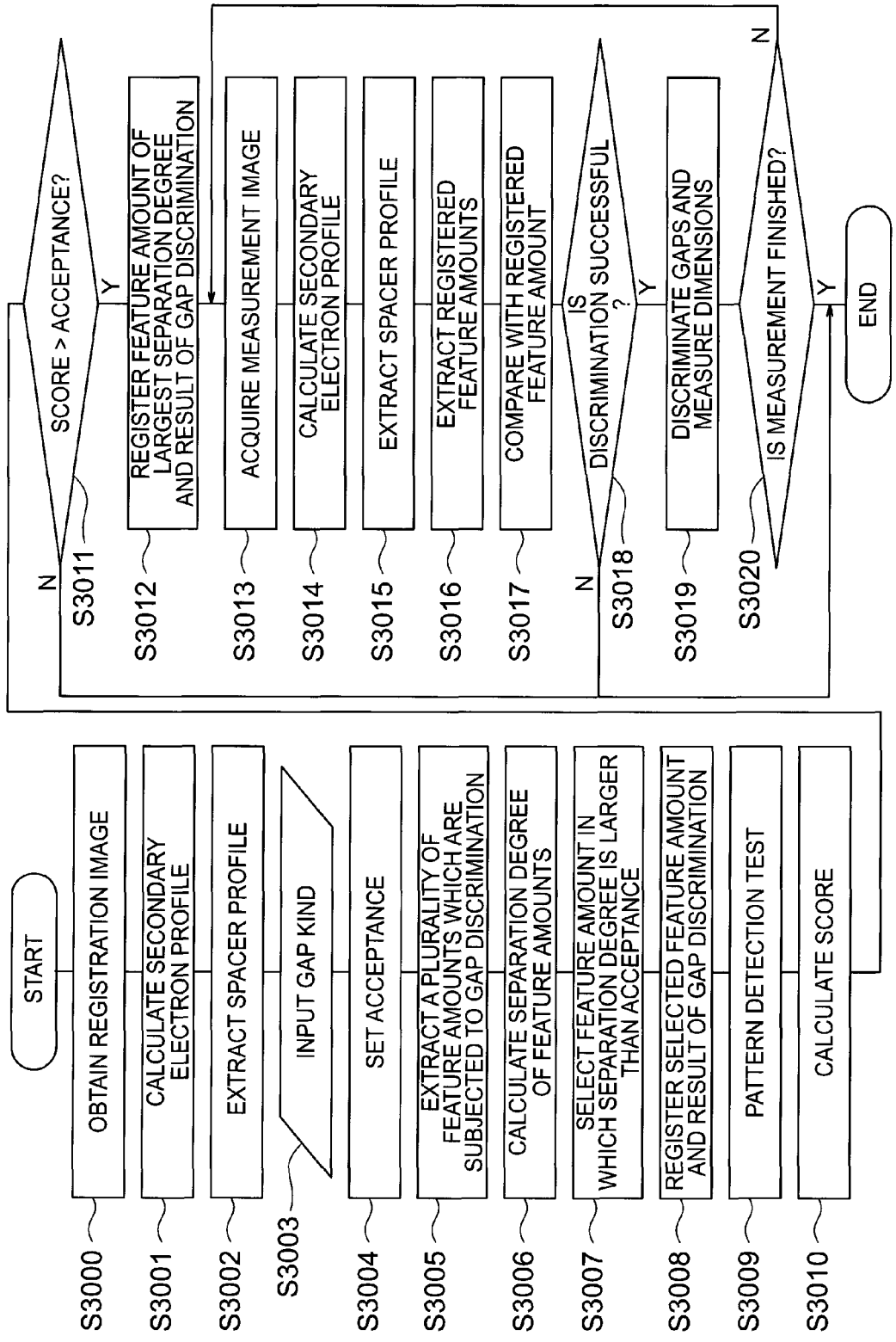
FIG. 30 is a flowchart for representing steps of calculating an integrated score by reliability of feature amounts at the time of registration and detection by using a plurality of feature amounts and performing the gap discrimination on the basis of a comparison result of registration scores and detection scores.

FIG. 30 represents a sequence for calculating the pattern detection score by using the plurality of feature amount at the time of pattern registration and discriminating about the success or failure of the registration by the score value.

First, the registration image is acquired (S3000). A secondary electron profile is calculated from the image (S3001). A spacer profile is extracted (S3002). A kind of gap is inputted by the operator (S3003). An acceptance for selecting the feature amount to discriminate the gaps is set.

Figure 31:
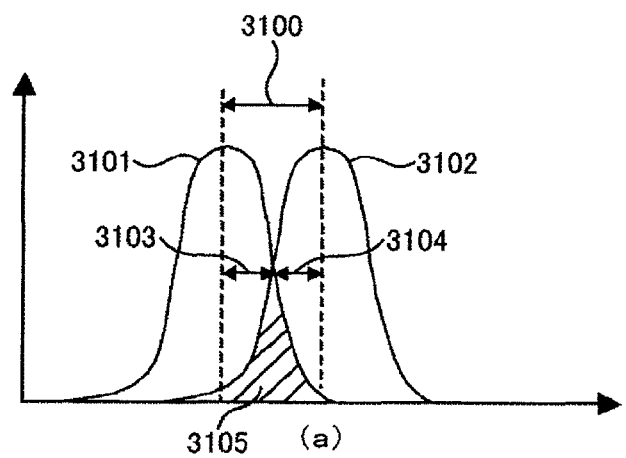
FIG. 31 is a diagram for illustrating a relation between a separation degree and a success ratio of gap recognition.
Figure 31:
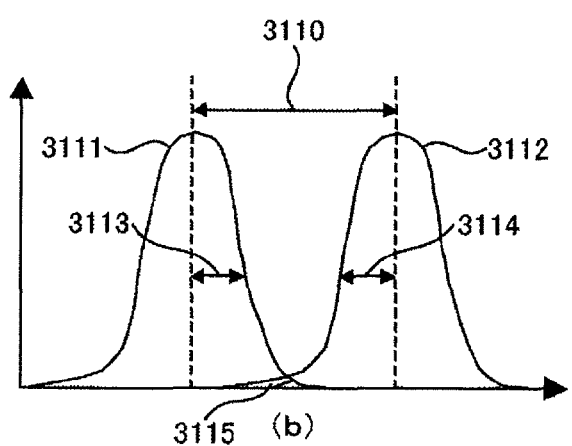
Figure 31:
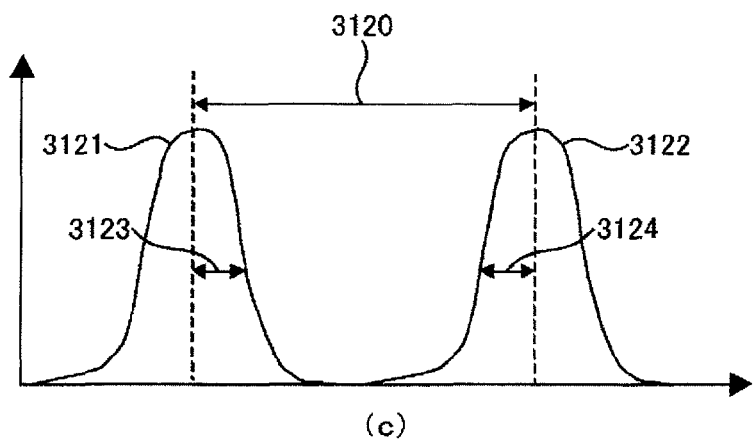

A setting method of the acceptance in FIG. 30 will be described by using FIG. 31. FIG. 31 illustrates two distributions to classify the gaps by using the feature amount.

(1) In (a) in FIG. 31, a distance (3100) between two distributions (3101, 3102) is shown. A standard deviation (3103) of the distribution (3101) and a standard deviation (3104) of the distribution (3102) are shown. When the distance (3100) between the two distribution and a sum (3103+3104) of the standard deviations of the two distribution coincide, a separation degree (separation degree=distance/sum of the standard deviations) is equal to 1 and the two distributions cross at a position of 1σ. In this case, a success ratio of the gap discrimination is equal to 0.667×0.667=0.444 by using the feature amount.

(2) In (b) in FIG. 31, a distance (3110) between two distributions (3111, 3112) is shown. A standard deviation (3113) of the distribution (3111) and a standard deviation (3114) of the distribution 3112 are shown. When the distance (3110) between the two distribution is twice as large as a sum (3113+3114) of the standard deviations of the two distribution, a separation degree (separation degree=distance/sum of the standard deviations) is equal to 2 and the two distribution cross at a position of 2σ. In this case, a success ratio of the gap discrimination is equal to 0.95×0.95=0.902 by using the feature amount.

(3) In (c) in FIG. 31, a distance (3120) between two distributions (3121, 3122) is shown. A standard deviation (3123) of the distribution (3121) and a standard deviation (3124) of the distribution 3122 are shown. When the distance (3120) between the two distribution is thrice as large as a sum (3123+3124) of the standard deviations of the two distribution, a separation degree (separation degree=distance/sum of the standard deviations) is equal to 3 and the two distributions cross at a position of 3σ. In this case, a success ratio of the gap discrimination is equal to 0.997×0.997=0.994 by using the feature amount.

As mentioned above, when the separation degree of the feature amount is equal to or larger than 3, the success ratio of the gap discrimination is equal to almost 100%. Therefore, in this example, the acceptance for selecting the feature amount is set to 3.

After the acceptance was set, a plurality of feature amounts to discriminate the gaps are extracted (S3005). A separation degree of the feature amount is calculated (S3006). The feature amounts in which the separation degrees are larger than the value of the acceptance which has previously been set are selected (S3007). The selected feature amounts and the result of the gap discrimination are registered (S3008). After that, a pattern detection test (S3009) is executed by using the selected feature amounts. A weighted sum of the separation degrees of the respective feature amounts is set to the pattern detection score (S3010). If the detection score is smaller than the acceptance which has previously been set, it is assumed that the pattern registration failed.

Assuming that the separation degrees of the selected feature amounts are equal to a1, a2, a3, and a4, and weight coefficients of the separation degrees of the feature amounts are equal to $\alpha 1$, $\alpha 2$, $\alpha 3$, and $\alpha 4$, respectively, the detection score is obtained by the following equation.

Detection score=$\alpha 1 a 1+\alpha 2 a 2+\alpha 3 a 3+\alpha 4 a 4$, where, $\alpha 1+\alpha 2+\alpha 3+\alpha 4=1$.

There are various weight coefficient deciding methods. For example, if a method of weighting each separation degree by a ratio of the sum of the separation degrees is used, the weight of the feature amount of a large separation degree is large. According to this score calculating method, the pattern detection can be evaluated from the integrated profile shape without being dominated by the feature amount of the large separation degree.

In S3011, the pattern detection score is compared with the acceptance which has previously been set. If the detection score is equal to or smaller than the acceptance, it is assumed that the detection failed. If the detection score is larger than the acceptance, the feature amount of the largest separation degree and the result of the gap discrimination are registered (S3012). After that, a measurement image is acquired (S3013). A secondary electron profile (S3014) and a spacer profile (S3015) are extracted. The feature amount stored at the time of registration is extracted (S3016) and compared with the registered feature amount (S3017). If the gap discrimination (S3018) is successful, the dimension measurement is individually performed every gap kind on the basis of the discrimination result (S3019). If there are any other measuring points, an image of a pattern which is newly measured is acquired. A sequence of S3013 to S3019 is repeated for the number of measuring points (S3020).

At the time of pattern registration by a combination of a plurality of feature amounts, by selecting the feature amount larger than the acceptance which has previously been set, a probability that the pattern recognition is successful rises. According to a pattern registering method whereby the pattern detection test is performed by using the feature amount larger than the preset acceptance and whether or not the detection score is larger than the acceptance is discriminated, whether or not the pattern detection is successful can be discriminated from the integrated profile shape without being dominated by the feature amount of the high separation degree.

Embodiment 8

An inspecting method of the SADP pattern will be described hereinbelow. In the line pattern inspection using an SEM image in the related art, a profile is extracted from the SEM image, a line edge position is detected, dimensions are measured, and the dimension sizes are inspected. If only the dimension measurement is performed, although the pattern, a width between the patterns, and the like can be inspected, a stereoscopic shape of the pattern cannot be inspected. For example, if residual material which could not be removed by etching remains on the bottom of a gap portion, the residual material cannot be inspected. If the residual material exists, a possibility that it becomes a cause of deterioration in performance of the semiconductor is high. From a viewpoint of the performance or the like of the semiconductor, it is important to inspect the stereoscopic structure of the pattern besides the dimensions. A method of inspecting a stereoscopic shape of the pattern by using a profile extracted from an image picked up by the SEM and a waveform which is obtained by differentiating the profile will be described hereinbelow. According to this method, in addition to the dimension inspection of the spacer portion and the gap portion, an inspection of the residual material on the bottom of the gap portion, an inspection of an inclination of a pattern side portion, and an inspection of the residual material in a spacer side portion can be performed. Subsequently, each inspecting method for executing the above inspection will be described.

Figure 32:
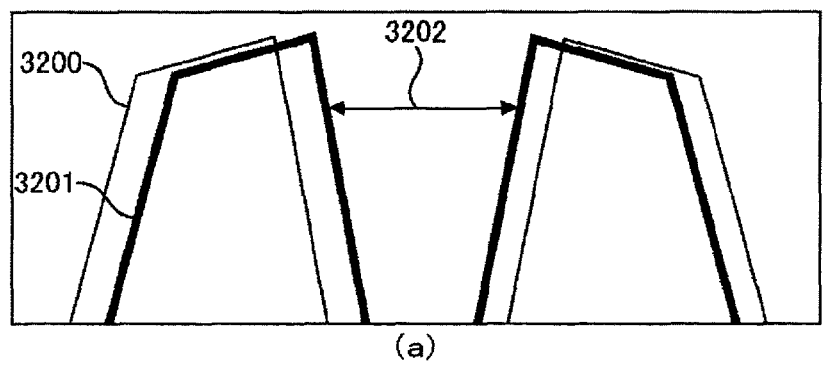
FIG. 32 is a diagram illustrating cross sections of patterns, profiles, and absolute values of differentiation waveforms in the case where there is an abnormality in dimension difference in a core gap.
Figure 32:
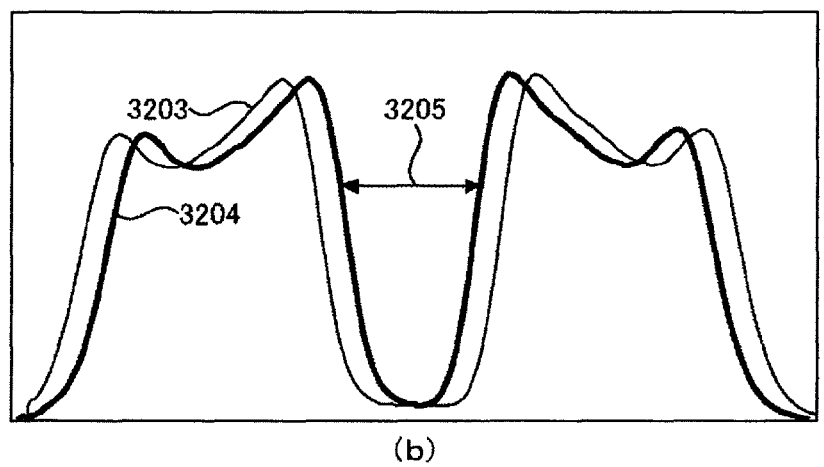
Figure 32:
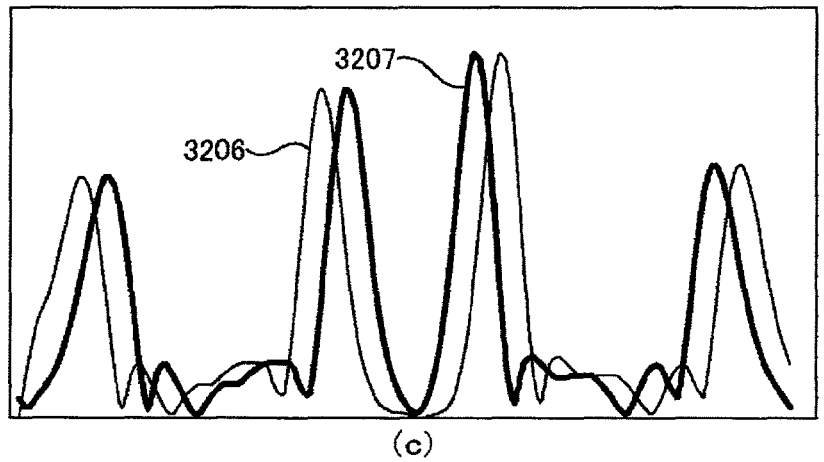

First, the dimension inspection will be described. FIG. 32 illustrates a cross sectional view of a core gap (a) in the case where the core gap becomes narrower than that in a normal case, a profile (b), and an absolute value (c) of a differentiation waveform. A cross sectional shape (3200) in the normal case is picked up by the SEM and a profile is extracted. Thus, the profile is as shown at 3203. An absolute value of a differentiation waveform of the profile is as shown at 3206. A cross sectional shape (3201) in the case where the core gap is narrow is picked up by the SEM and a profile is extracted, and the profile is as shown at 3204. An absolute value of a differentiation waveform of the profile is as shown at 3207.

When the core gap becomes narrow (3202), dimensions of the core gap can be measured from a distance (3205) between edges of the profile. If an abnormality is caused only by a dimension difference, a peak value of the differentiation waveform (absolute value) is not larger than that in the normal case. The present dimension inspection can be also similarly performed by inspecting the dimensions of the spacer gap and the spacer.

Figure 33:
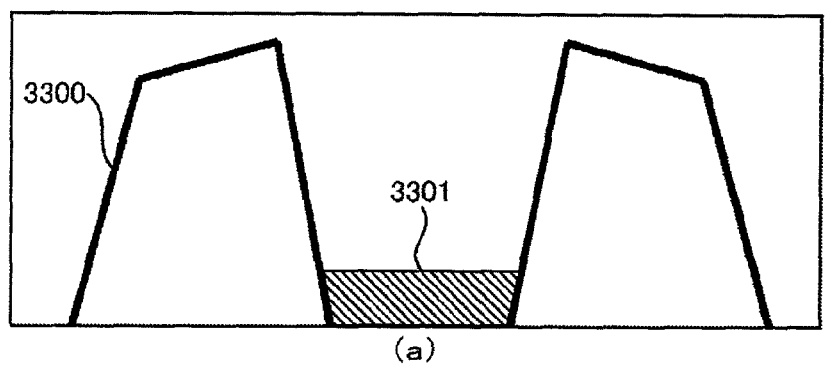
FIG. 33 is a diagram illustrating cross sections of patterns, profiles, and absolute values of differentiation waveforms in the case where there is residual material on a bottom of the core gap.
Figure 33:
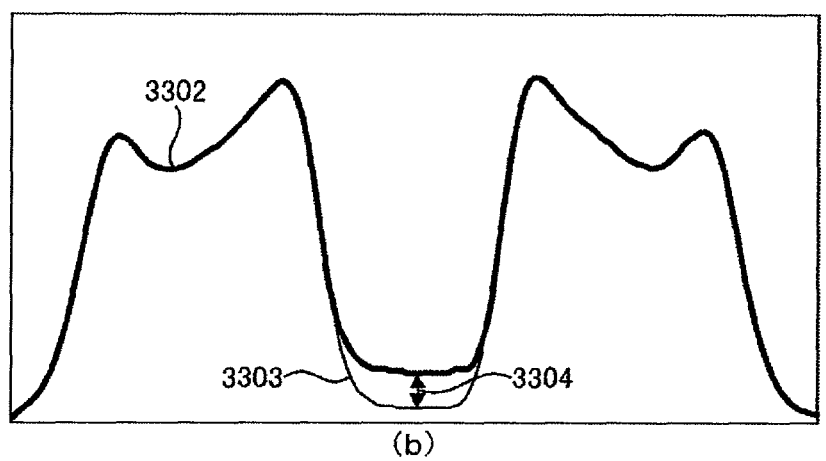
Figure 33:
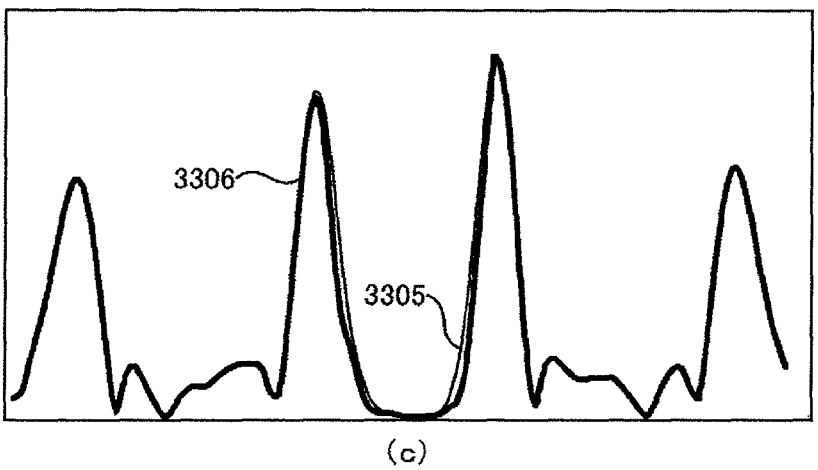

Subsequently, the inspection of the residual material on the bottom of the core gap will be described. FIG. 33 illustrates a cross sectional view of the core gap (a) in the case where a residual material exists on the bottom of the core gap, a profile (b), and an absolute value (c) of a differentiation waveform. A cross sectional shape (3300) in the normal case is taken by the SEM and a profile is extracted. Thus, the profile is as shown by 3303. An absolute value of a differentiation waveform of the profile is as shown by 3305. If a residual material (3301) exists, when a profile is extracted, the profile is as shown by 3302. An absolute value of a differentiation waveform of the profile is as shown by 3306. As shown in the cross sectional view (a), if the residual material exists, since the bottom of the core gap becomes shallow, many secondary electrons emitted from the pattern can be captured by the detector as compared with the case where there is no residual material, so that the luminance of the core gap portion increases (3304). A height of the bottom of the core gap is higher than that in the normal case, so that the existence of the residual material can be detected from the profile. If the abnormality relates only to the residual material on the bottom of the core gap portion, since a line side surface portion is not so different from that in the normal case, a peak value of the differentiation waveform is the same as that in the normal case. The inspection of the residual material can be also similarly executed in the inspection of the residual material in the spacer gap.

Figure 34:
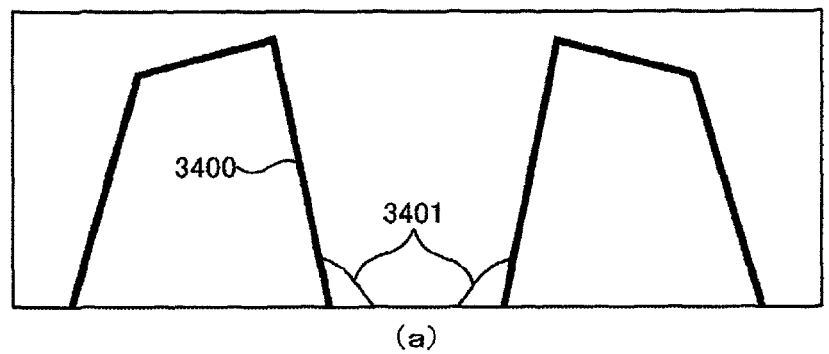
FIG. 34 is a diagram illustrating cross sectional views of patterns, profiles, and absolute values of differentiation waveforms in the case where there are residual materials on edges of the core gap.
Figure 34:
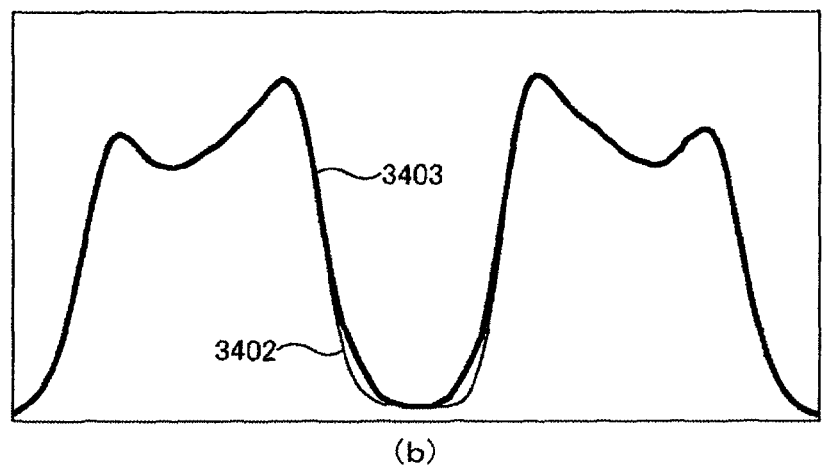
Figure 34:
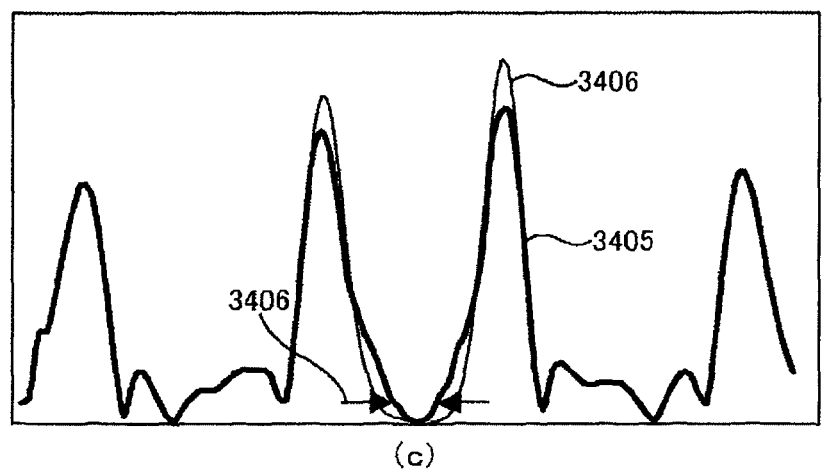

Although the case where the residual material exists on the bottom of the core gap has been described above, an inspecting method in the case where the residual material exists in an edge portion of the core gap will be subsequently described. FIG. 34 illustrates a cross sectional view of the core gap (a), a profile (b), and an absolute value (c) of a differentiation waveform. A cross sectional shape (3400) in the normal case is taken by the SEM and a profile is extracted, and the profile is as shown at 3402. An absolute value of a differentiation waveform of the profile is as shown at 3406. If residual materials (3401) exist at gap edges, when a profile is extracted, the profile is as shown by 3403. An absolute value of a differentiation waveform of the profile is as shown by 3405. If the residual materials exist at the edges of the core gap, the height of the edge portion of the core gap is higher than that in the normal case. Therefore, if the image is taken by the SEM, many secondary electrons emitted from the core gap edge portion can be captured by the detector so that a luminance of the core gap edge portion increases. When an attention is paid to a change in luminance from the center of the core gap toward the edge side, since the residual material exists in the portion which is flat in the normal case, the luminance change in this portion becomes steep. In the differentiation waveform of the profile, its feature appears remarkably and a change in a bottom peripheral portion becomes steeper than that in the normal case (3406), so that the residual material at the edge side can be detected. As a method of numerically discriminating it, there are a method of calculating a distance from a bottom position of the differentiation waveform to a peak position of the differentiation waveform and a method of calculating a value of a in the following equation obtained by approximating a gap peripheral portion by a quadratic function.

$$f(x)=ax^2+bx+c$$

f(x) is an approximation value of the differentiation waveform applied to the quadratic function at a position x, x denotes a coordinate position of the profile, and a, b, and c denote approximate coefficients of the quadratic function. If the residual materials exist in the bottom edge portions, there is not a large change in the peak value of the differentiation waveform so long as no residual materials remain in the edge portions of the whole spacer. The present inspection can be also similarly executed in the inspection of the residual material in the spacer gap.

Figure 35:
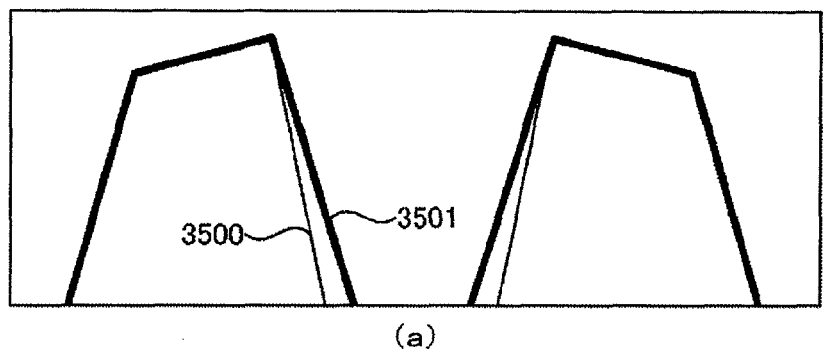
FIG. 35 is a diagram illustrating cross sectional views of patterns, profiles, and absolute values of differentiation waveforms in the case where there is an abnormality in a spacer side gradation.
Figure 35:
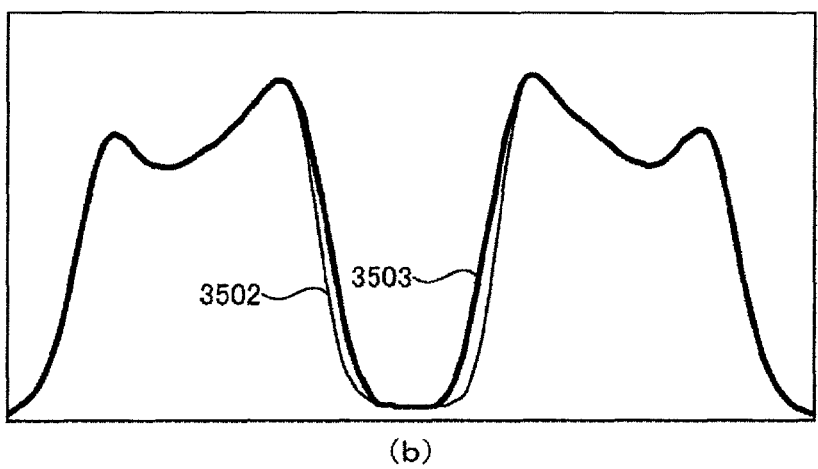
Figure 35:
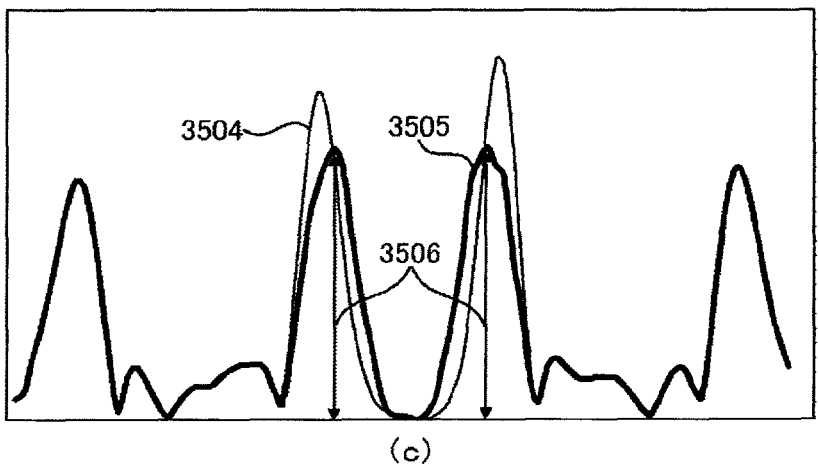

Subsequently, an inspecting method in the case where there is an abnormality in a gradient of the side portion of the spacer will be described. FIG. 35 illustrates a cross sectional view of the core gap (a), a profile (b), and an absolute value (c) of a differentiation waveform. A cross sectional shape (3500) in the normal case is taken by the SEM and a profile is extracted. Thus, the profile is as shown at 3502. An absolute value of a differentiation waveform of the profile is as shown by 3504. If there is an abnormality in the gradient, a cross sectional view is as shown by 3501. When a profile is extracted, the profile is as shown by 3503. An absolute value of a differentiation waveform of the profile is as shown by 3505. When the gradient of the side portion of the line is more gentle as compared with that in the normal case, a luminance change of the SEM image is also gentle and a peak value (3506) of the differentiation waveform of the profile decreases as compared with that in the normal case. Therefore, it is possible to discriminate by a magnitude of the differentiation peak value. The present inspection can be also similarly executed in the inspection of the residual material in the spacer gap.

As mentioned above, the abnormality of the dimensions, the abnormality due to the residual material on the gap bottom, the abnormality due to the residual material at the gap edge, and the abnormality of the gradient of the spacer side can be detected by the profile of the SEM image and the differentiation waveform.

Subsequently, a processing flow for automatically discriminating the abnormality will be described. To automatically inspect, there are a method whereby permission ranges of magnitudes of feature amounts such as dimensions, height of spacer, height of gap, gradient of the spacer, shape of the gap bottom, and the like which are permitted before inspection are inputted before inspection and they are discriminated by the detection and a method whereby a difference between permissible values of the core gap portion and the spacer gap portion is registered and used for discrimination.

Figure 36:
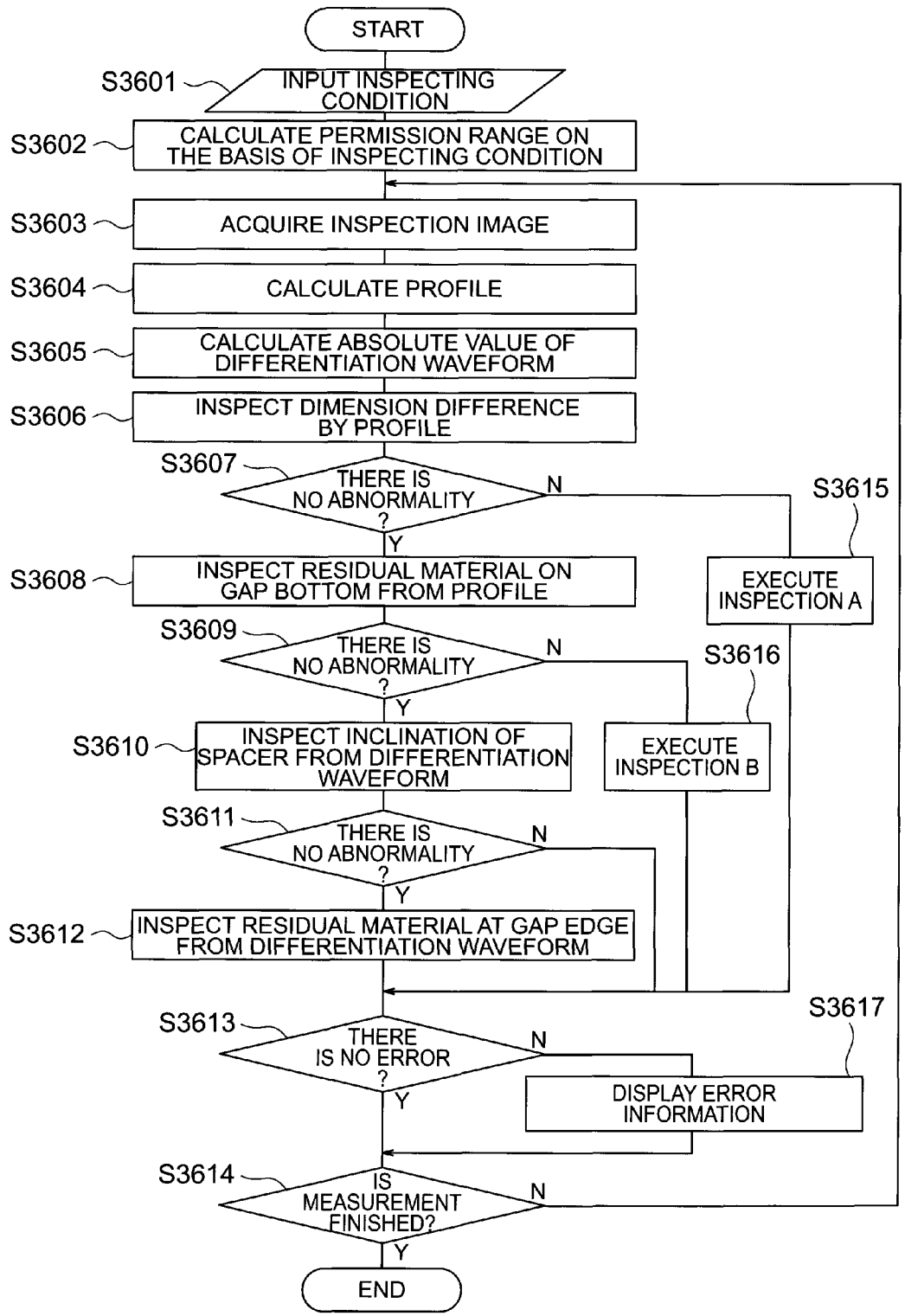
FIG. 36 is a flowchart for representing steps of measuring a stereoscopic structure of a pattern.

The inspecting method will be described by referring to FIG. 36. First, the method of registering the feature amounts before inspection will be described. At the time of registration of the pattern, shape information of the pattern in the normal case is registered (S3601). Dimensions of the core gap portion, spacer gap portion, and spacer portion, height information of the spacer portion, and inclination information of the spacer portion are registered. Subsequently, a ratio at which fluctuations of them can be permitted is registered. With respect to it, a width of dimension difference, a height of spacer portion, an inclination of the line portion, and a size of residual material on the gap edge side which can be permitted are registered. Since an appearance state of the SEM image differs depending on accelerating voltage, probe current, and the like, at the time of registration, in addition to them, it is necessary to also input the accelerating voltage and the probe current information. A profile and a differentiation waveform which are presumed when the image is acquired by the SEM are calculated from these registration information. The permission values are converted into values which can be inspected. A profile is formed on the basis of such information that, generally, when the accelerating voltage or the probe current is large, an energy of the electron which is irradiated to the pattern is large, so that an amount of electrons which are emitted from the pattern also increases, a contrast of an image of the pattern increases, and the like, and permission values are set (S3602). If there is inspection target image data at the time of registration, by using the data, a permission value for the case when by about what % each of the above information has been deviated the abnormality is decided can be also registered.

After the registration, the stage is moved to the inspection target pattern and the inspection target pattern is taken by the SEM (S3603). A profile is extracted from the taken SEM image (S3604) and an absolute value of a differentiation waveform is calculated (S3605).

Although the pattern is subsequently inspected, the inspection is performed by combining a plurality of processes. The inspection is executed in order of the inspection of the dimensions, the inspection of the residual material on the bottom of the gap, the inspection of the gradient of the spacer side portion, and the inspection of the residual material in the gap edge portion. If there is no error in all of them, it is possible to decide that the pattern is a normal pattern. However, if an error occurred in at least one of them, error information is outputted and the error is notified. As error information, the pattern shape is displayed and the error portion is emphasized and displayed thereon.

Figure 37:
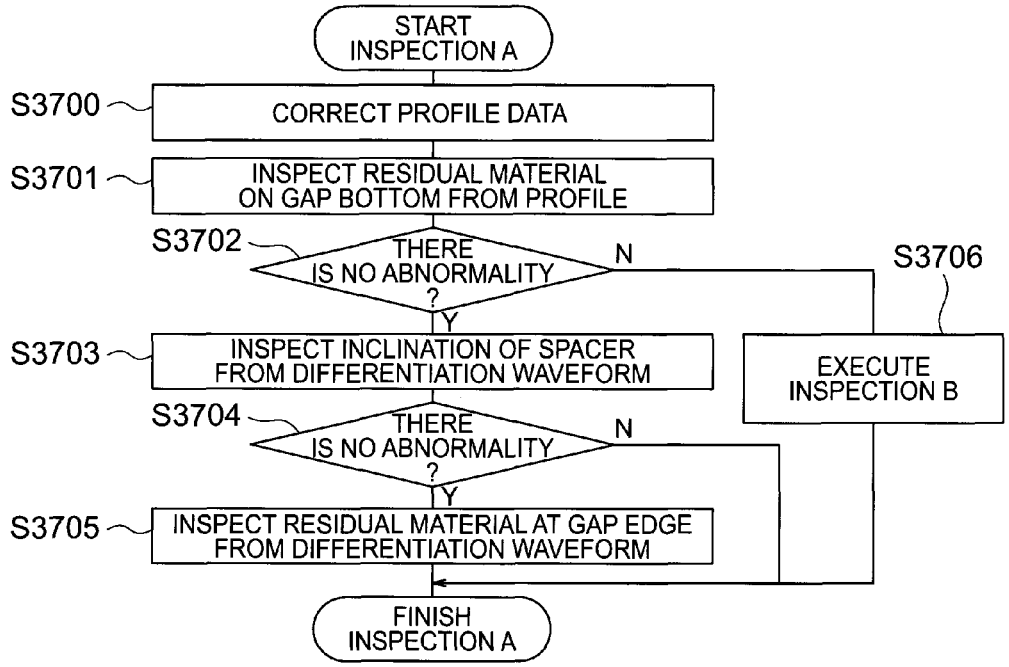
FIG. 37 is a flowchart for representing inspecting steps in the case where there is an abnormality in inspection of dimensions of a pattern.
Figure 38:
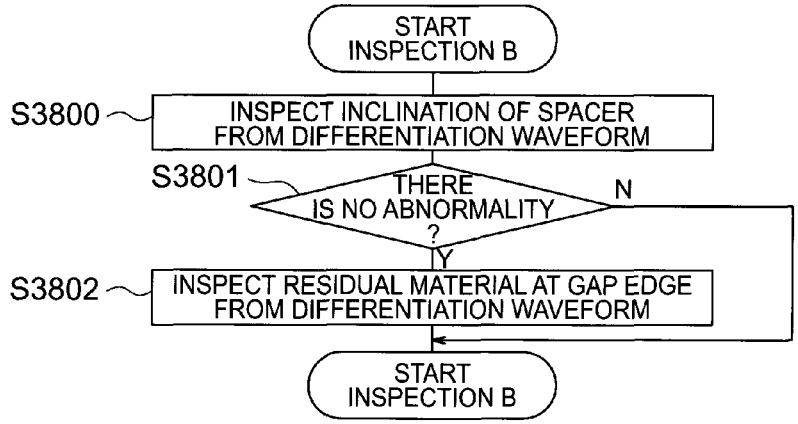
FIG. 38 is a flowchart for representing inspecting steps in the case where there is an abnormality in a bottom of a gap of a pattern.

If an error occurred (S3607) in a dimension inspection (S3606), whether or not an error occurred in an inspection other than the dimensions is inspected by a process of an inspection A (S3615). The inspection A in FIG. 37 will be described hereinbelow. If there is an error only in the dimensions, a difference occurs in a width of the gap portion or the spacer portion of the profile as compared with that in the normal case. However, since the height of gap bottom and the peak value of the differentiation waveform are not so different from those in the normal case, if an error occurred in the gap height or the differentiation peak, it is possible to determine that the error has occurred in the inspection. However, if a difference occurred in the dimensions, since the shape of the gap portion of the differentiation waveform also becomes steeper than that in the normal case, if such waveform is held as it is, an error will occur in the inspection of the residual material at the gap edge. In this case, in order to eliminate an influence by the shape change in the gap portion of the differentiation waveform due to the difference of the dimensions, the profile is corrected by using profile data in the normal case which was calculated at the time of registration (S3700). In the case of the abnormality in the dimension difference, the dimension difference is matched with the dimension difference in the normal case by performing a process such as cutting-out, widening, or the like to the profile portion. After that, an absolute value of the differentiation waveform is calculated by using the profile whose dimension difference was matched. The subsequent inspection of the residual material on the gap bottom (S3701, S3702), inspection of the gradient of the spacer side (S3703, S3704), and inspection of the residual material at the gap edge portion (S3705) are executed. If NO in S3702, an inspection B (S3706) is executed. The inspection B in FIG. 38 will be described hereinbelow. If an error occurred in the inspection of the residual material on the gap bottom, the inspection B is executed. In the inspection B, an inclination of the spacer is inspected from the differentiation waveform (S3800). If it is determined here that the inclination is abnormal (S3801), the inspection B is finished. If it is determined in S3800 that the inclination is normal, the residual material at the gap edge is inspected from the differentiation waveform (S3802) and the inspection B is finished.

Returning to FIG. 36, processes in S3600 and subsequent steps will be described. If the abnormality is decided (S3609) in the inspection of the residual material on the gap bottom (S3608), when it is abnormality only with respect to the residual material on the gap bottom, a large difference does not occur between the differentiation waveform and that in the normal case. However, if there is also an abnormality in an item other than the residual material on the gap bottom, since a difference also occurs between the differentiation waveform and that in the normal case, the subsequent inspection B (S3616) can be executed.

If the abnormality is decided (S3610) in the inspection of the inclination of the spacer side (S3611), the inspection of the residual material at the gap edge is omitted (S3612). In the case of an error of the gradient of the spacer side portion, since a shape difference of the gap portion of the differentiation waveform other than the difference of the differentiation peak is liable to occur, even if such a shape difference occurred, the residual material does not always exist in the bottom edge portion. In this case, the inspection of the residual material at the gap edge is omitted.

If the abnormality is decided in any one of the dimension inspection, the inspection of the residual material on the gap bottom, the inclination inspection of the spacer side, and the inspection of the residual material at the gap edge mentioned above (S3613), error information is outputted (S3617). The above processes are executed for the number of measuring points and the processing routine is finished (S3614).

Subsequently, a method whereby a difference between the feature amounts of the core gap and the spacer gap is registered prior to the inspection will be described. Since the SADP pattern is formed so that the core gap and the spacer gap are finally formed in the same shape, if there is a difference between the shapes of the core gap and the spacer gap, it is possible to decide that an error occurred.

First, at the time of registration, permission ranges of the dimension difference between the core gap and the spacer gap, the gap height difference, the inclination difference of the spacers adjacent to the gap, and the shape change in the gap bottom are registered, respectively. If the permission range does not lie within the range of each value of the core gap portion and the spacer gap portion, the abnormality is determined. However, in this state, it is unknown about in which one of the core gap and the spacer gap the error occurred. However, according to the SADP, if the shape of each pattern is managed every step, in which portion the error occurred can be recognized. For example, when the step (FIG. 2, (h)) in which the spacer was formed and the mask of the core portion was eliminated is inspected, if it has been known that there is no problem in the spacer gap portion in the one-preceding step, it will be understood that a problem has occurred in the core gap. As for the actual inspection processing order, the inspection is executed in the order mentioned in FIG. 36.

Embodiment 9

Subsequently, a pattern inspecting method in the case where the discrimination by the profile cannot be made even in the final step because the process is matured will be described. By using this method, in which step the abnormality occurred can be determined only by the inspection of the final step.

Figure 39:
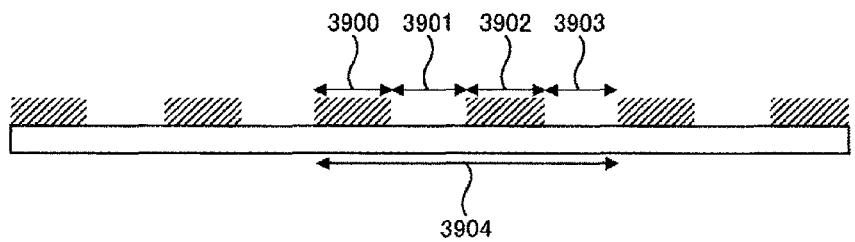
FIG. 39 is a cross sectional view of a pattern in a final step of a pattern formed by the SADP.

FIG. 39 illustrates a cross sectional view of a pattern in the final step of the SADP. Since it is the pattern in the final step, whether Gap1 (3901) and Gap2 (3903) are the core gap and the spacer gap cannot be discriminated. Also with respect to the spacer, which one of 3900 and 3902 is the spacer on the core gap side or the spacer on the spacer gap side cannot be discriminated. However, since the pattern formed by the SADP has the following features, by executing the pattern inspection by using those features, in which step an error occurred can be specified and whether the spacer is abnormal or the gap is abnormal can be specified. The first feature is that the dimensions of the spacer (3900, 3902) and those of the gap (3901, 3903) are identical. The second feature is that a pitch of the pattern has an equal interval (3904). The third feature is that a dimension difference of the spacer portion (3900, 3902) is not so large in terms of the process. Those features can be expressed by the following equations.

$$\text{Spacer1}=\text{Gap1}=\text{Spacer2}=\text{Gap2} \qquad (1)$$

$$\text{Spacer1}+\text{Gap1}+\text{Spacer2}+\text{Gap2}=2P \qquad (2)$$

$$\text{Spacer1}=\text{Spacer2} \qquad (3)$$

In the above equations, Spacer1 and Spacer2 denote dimensions of the spacer portions, Gap1 and Gap2 indicate dimensions of the gap portions, and 2P denotes a sum (3904) of the distances of the spacer portion and the gap portion.

From those relations, it is possible to determine that if the following two conditions are satisfied, the pattern has normally been formed.

$$\text{Spacer1}+\text{Spacer2}=P \qquad (4)$$

$$\text{Gap1}=\text{Gap2} \qquad (5)$$

Figure 40:
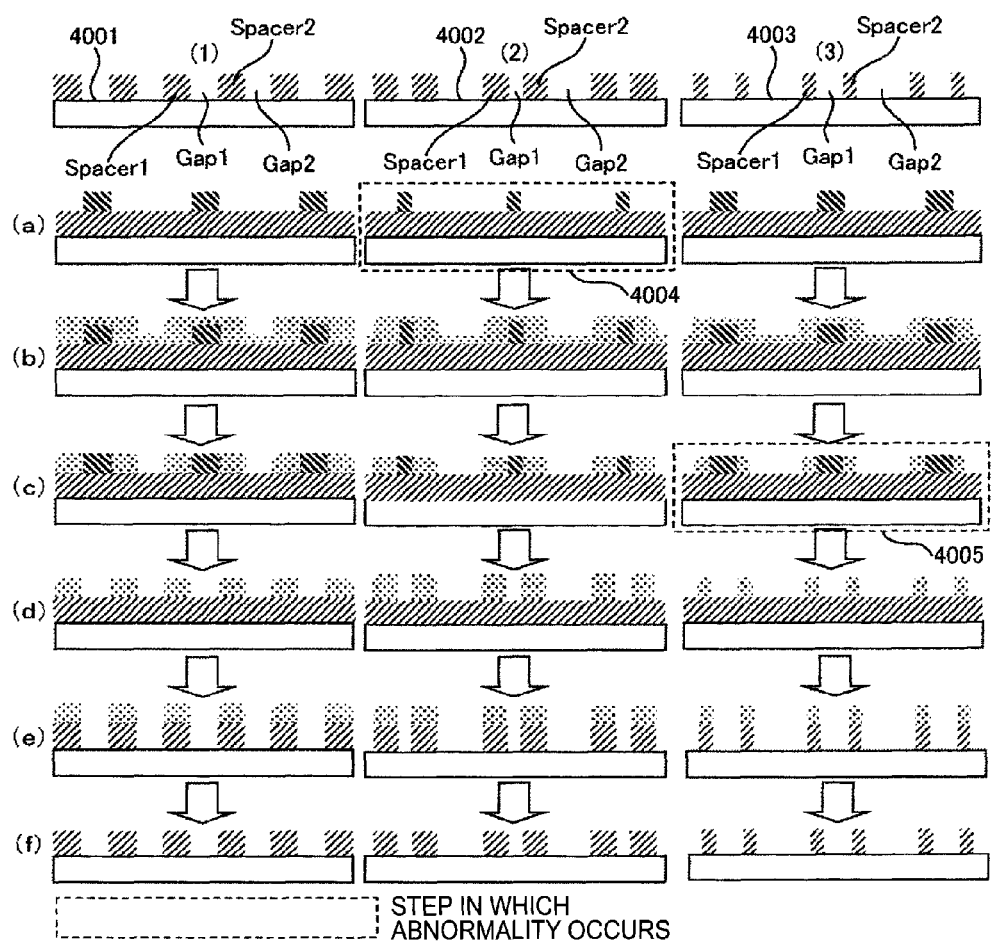
FIG. 40 is a cross sectional view of patterns in each step in the case where the pattern was normally formed by the SADP and in the case where an abnormality occurred.

Processes in the normal case and the abnormal case and a pattern cross sectional view of every step are illustrated in FIG. 40 and subsequent diagram. If a pattern could normally be formed as shown at 4001 in FIG. 40, (1), the above equations (4) and (5) are satisfied. However, in the abnormal case, in the case of 4002 in FIG. 40, (2), since the dimension differences of the spacer and the gap differ, although the equation (4) is satisfied, the equation (5) is not satisfied. Since the equation (4) is satisfied, it is possible to determine that Spacer 1 and Spacer 2 were normally formed. It is difficult to consider that the abnormality occurred in the steps after (c). If it is assumed that Spacer 1 and Spacer 2 were normally formed, the spacer gap also ought to have normally been formed. Therefore, it is possible to determine that the error occurred at a stage (4004) in which the core portion is formed. Although FIG. 40, (2) illustrates an example in which the core is thinned, the same discrimination can be made even in the case where the core is thickened. However, since whether each of Gap 1 and Gap 2 is the core gap or the spacer gap cannot be distinguished, whether the core portion was thickened or thinned cannot be discriminated.

Subsequently, a case where the equation (4) is not satisfied will be described by using 4003 in FIG. 40, (c). In this case, the spacer is thinned, the equation (4) is not satisfied, and it is possible to determine that there is a spacer abnormality. If Spacer 1+Spacer 2<P as shown in FIG. 40, (c), when the spacer is formed by etching the mask layer, the residual material has excessively been eliminated. The step of forming the spacer is the step of FIG. 40, (c) and it will be understood that an abnormality occurred in 4005. On the other hand, if Spacer 1+Spacer 2>P, this means that when the mask layer is etched, the elimination of the residual material is insufficient, so that this also means that the abnormality occurred in 4005.

Figure 41:
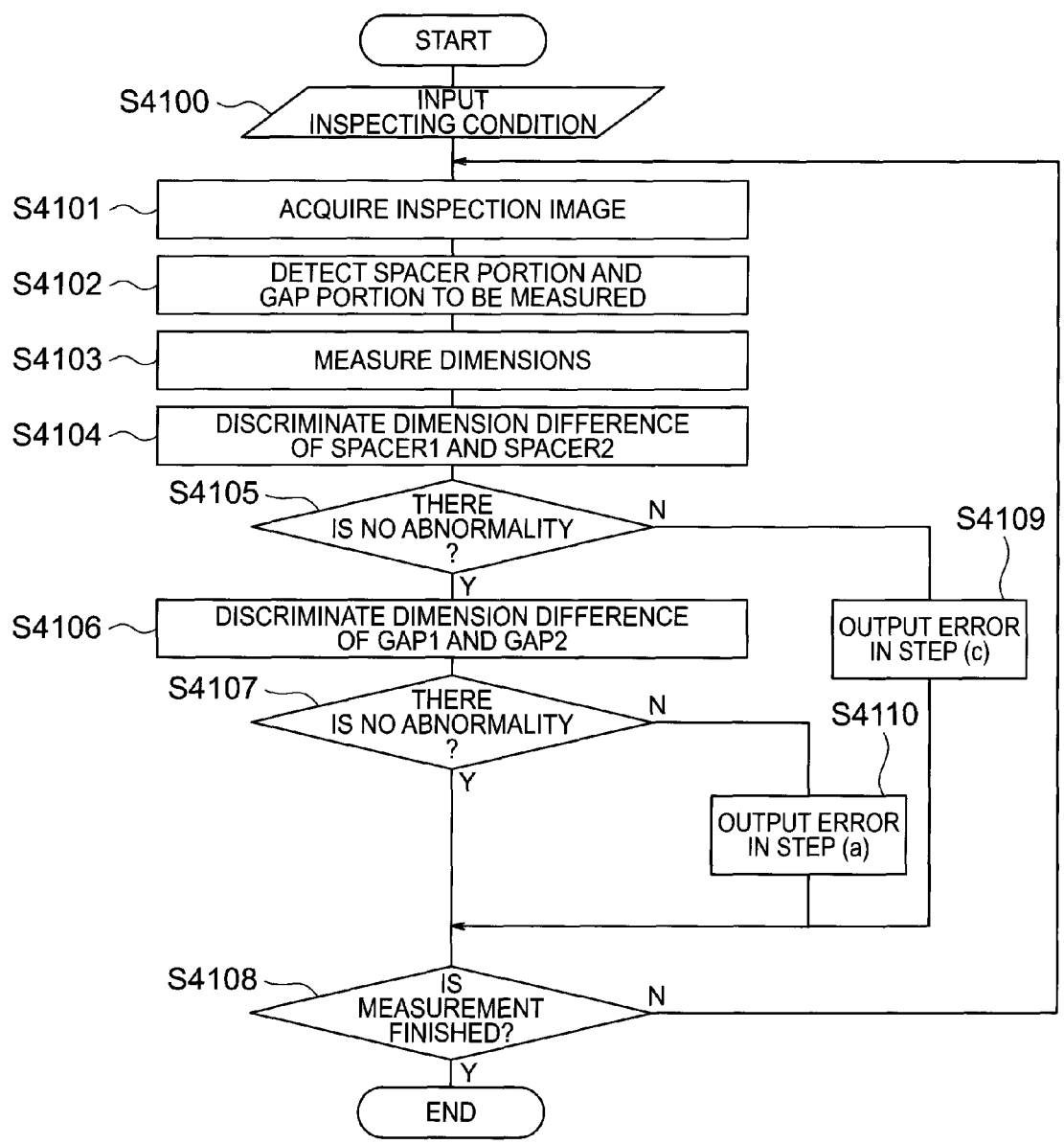
FIG. 41 is a flowchart for a pattern inspection in a final step of the SADP.

FIG. 41 represents a processing flow for inspecting in which step the abnormality occurred as mentioned above. It will be described hereinbelow in accordance with the processing flow of FIG. 41. First, inspecting conditions are inputted (S4100). As inspecting conditions, there are inspection coordinates, a design value of a spacer width, permissible maximum value and minimum value of dimension difference of each of the spacer, core gap, and spacer gap, and the number of patterns which are inspected by one image pickup. Subsequently, an inspection image is acquired at an inspecting position (S4101). A range of a region of the image which is acquired can be calculated on the basis of a design value of a line width and the number of patterns which are inspected by one image pickup. Subsequently, a spacer and a core to be measured are detected by the acquired inspection image (S4102). In this detection, since the core gap and the spacer gap cannot be distinguished in the final step, the spacer position and the gap position are detected. Subsequently, a dimension measurement is executed to the spacer and core as an inspection pattern at the detected positions (S4103). After the dimension measurement, abnormality of the dimension difference of the spacer is inspected (S4104). The spacer dimensions can be discriminated on the basis of the equation (1). If the sum of the dimensions of Spacer 1 and Spacer 2 lies within a range of the minimum value and the maximum value in which the dimension difference of the spacer width which was set at the time of registration can be permitted (S4105), the processing routine advances to the next inspection of the dimension difference of Gap 1 and Gap 2 (S4106). If the spacer width is out of the range, an error is outputted as a spacer abnormality (S4109). The error is outputted so that it will be understood that the error occurred in the step (c). After the error was outputted, the processing routine advances to the next measuring point (S4108). On the other hand, if there is no abnormality in the spacer dimensions, the inspection of the gap dimension difference is performed (S4106). In the inspecting process, a difference between Gap 1 and Gap 2 is obtained and compared with the maximum value and the minimum value which can permit the dimension difference of the core gap and the spacer gap designated at the time of registration. If the values are out of the range as a result of the comparison (S4107), a gap dimension error is outputted (S4110). In this instance, the error is outputted so that it will be understood that the error occurred in the step (a). A series of inspecting processes are executed as mentioned above. The above processes are executed for the number of measuring points and the processing routine is finished.

REFERENCE SIGNS LIST

101 Electron source
102 Lead-out electrode
103 Primary electron beam
104 First condenser lens
105 Diaphragm
106 Second condenser lens
107 Secondary electron detector
108 Alignment coil
109 Deflecting coil
110 Objective lens
111 Sample
112 Stage
113 Sample chamber
114 Secondary electron
115 High voltage control apparatus
116 First condenser lens control unit
117 Second condenser lens control unit
118 Secondary electron signal amplifier
119 Alignment control unit
120, 122 Deflection signal control unit
121 Objective lens control unit
123 Image processor
124 Secondary electron image display apparatus
125 Whole control unit
126 Electron optical system control apparatus
127 Stage control apparatus
128 User interface

The invention claimed is:

1. A pattern measuring apparatus for measuring a pattern in which a plurality of patterns are arranged by using a signal which is acquired on the basis of scanning of a charged particle beam to a sample, comprising a discriminating apparatus which
    extracts a plurality of kinds of feature amounts regarding one end side of the pattern in which a plurality of patterns are arranged and feature amounts regarding other end side of the pattern from the signal which are acquired on the basis of the scanning of said charged particle beam,
    selects the feature amount which satisfies a predetermined condition among said plurality of kinds of feature amounts,
    compares one end side and the other end side of the pattern with respect to the selected kind of feature amount,
    discriminates a kind of gaps among said plurality of patterns on the basis of said comparison,
    wherein said discriminating apparatus selects the feature amount in which a difference between the feature amounts of said one end side and the other end side satisfies a predetermined condition among said plurality of kinds of feature amounts, and
    wherein said discriminating apparatus selects the feature amount in which a difference between average values of said feature amounts is largest or the feature amount in which the difference between the average values of said feature amounts is larger than a predetermined value.

2. A pattern measuring apparatus for measuring a pattern in which a plurality of patterns are arranged by using a signal which is acquired on the basis of scanning of a charged particle beam to a sample, comprising a discriminating apparatus which
    extracts a plurality of kinds of feature amounts regarding one end side of the pattern in which a plurality of patterns are arranged and feature amounts regarding other end side of the pattern from the signal which are acquired on the basis of the scanning of said charged particle beam,
    selects the feature amount which satisfies a predetermined condition among said plurality of kinds of feature amounts,
    compares one end side and the other end side of the pattern with respect to the selected kind of feature amount, discriminates a kind of gaps among said plurality of patterns on the basis of said comparison, and wherein said discriminating apparatus selects the feature amount in which a separation degree of the feature amounts on said one end side and the other end side satisfies a predetermined condition among said plurality of kinds of feature amounts.

3. A pattern measuring apparatus for measuring a pattern in which a plurality of patterns are arranged by using a signal which is acquired on the basis of scanning of a charged particle beam to a sample, comprising a discriminating apparatus which extracts a plurality of kinds of feature amounts regarding one end side of the pattern in which a plurality of patterns are arranged and feature amounts regarding other end side of the pattern from the signal which are acquired on the basis of the scanning of said charged particle beam, selects the feature amount which satisfies a predetermined condition among said plurality of kinds of feature amounts, compares one end side and the other end side of the pattern with respect to the selected kind of feature amount, discriminates a kind of gaps among said plurality of patterns on the basis of said comparison, and wherein at least one of said feature amounts relates to a differentiation waveform of a waveform which is formed on the basis of said signal, and said discriminating apparatus determines that a gap locating on a side in which a distance between a peak of said differentiation waveform of said one end or the other end and a rising edge of said peak is short is a core gap.

4. A pattern measuring apparatus for measuring a pattern in which a plurality of patterns are arranged by using a signal which is acquired on the basis of scanning of a charged particle beam to a sample, comprising a discriminating apparatus which extracts a plurality of kinds of feature amounts regarding one end side of the pattern in which a plurality of patterns are arranged and feature amounts regarding other end side of the pattern from the signal which are acquired on the basis of the scanning of said charged particle beam, selects the feature amount which satisfies a predetermined condition among said plurality of kinds of feature amounts, compares one end side and the other end side of the pattern with respect to the selected kind of feature amount, discriminates a kind of gaps among said plurality of patterns on the basis of said comparison, and wherein at least one of said feature amounts relates to a differentiation waveform of a waveform which is formed on the basis of said signal, and said discriminating apparatus determines that a gap locating on a side in which a distance between a peak of said differentiation waveform of said one end or the other end and a rising edge of said peak is long is a spacer gap.

* * * * *